(12) United States Patent
Turner et al.

(10) Patent No.: US 11,600,554 B2
(45) Date of Patent: Mar. 7, 2023

(54) INTERCONNECTION STRUCTURES TO IMPROVE SIGNAL INTEGRITY WITHIN STACKED DIES

(71) Applicant: Nvidia Corporation, Santa Clara, CA (US)

(72) Inventors: Walker J. Turner, Santa Clara, CA (US); Yaping Zhou, Santa Clara, CA (US); John M. Wilson, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 102 days.

(21) Appl. No.: 17/391,290

(22) Filed: Aug. 2, 2021

(65) Prior Publication Data

US 2023/0034619 A1    Feb. 2, 2023

(51) Int. Cl.
| | |
|---|---|
| *H01L 23/528* | (2006.01) |
| *H01L 23/48* | (2006.01) |
| *H01L 25/065* | (2023.01) |
| *H01L 25/00* | (2006.01) |
| *H01L 23/00* | (2006.01) |

(52) U.S. Cl.
CPC ........ *H01L 23/481* (2013.01); *H01L 25/0657* (2013.01); *H01L 25/50* (2013.01); *H01L 24/48* (2013.01); *H01L 2224/48145* (2013.01); *H01L 2225/06513* (2013.01); *H01L 2225/06544* (2013.01)

(58) Field of Classification Search
CPC .... H01L 23/481; H01L 25/0657; H01L 25/50
See application file for complete search history.

(56) References Cited

U.S. PATENT DOCUMENTS

| | | | |
|---|---|---|---|
| 2005/0067694 A1* | 3/2005 | Pon ..................... | H01L 25/0657 257/723 |
| 2015/0137361 A1* | 5/2015 | Yu ....................... | H01L 21/0217 257/737 |
| 2018/0204821 A1* | 7/2018 | Guo ....................... | H01L 24/92 |
| 2019/0103409 A1* | 4/2019 | Xu ....................... | H01L 25/0657 |
| 2019/0341372 A1* | 11/2019 | She ........................ | H01L 24/73 |
| 2019/0348406 A1* | 11/2019 | Nakano .................. | H01L 25/50 |
| 2021/0118852 A1* | 4/2021 | Fay ......................... | H01L 24/08 |
| 2022/0293483 A1* | 9/2022 | Tsai ........................ | H01L 21/56 |
| 2022/0399308 A1* | 12/2022 | Simsek-Ege ........ | H01L 25/0657 |
| 2022/0399358 A1* | 12/2022 | Mizutani .............. | H01L 23/528 |

* cited by examiner

*Primary Examiner* — Thao P Le

(57) ABSTRACT

A device including a stack of dies. Each of the dies can have unit stair-step conductive paths of connection features which include through-die via structures and routing structures. The unit stair-step conductive paths of one of the dies can be interconnected to another one of the unit stair-step conductive paths of another one of the dies to form one of a plurality conductive stair-case structures through two or more of the dies. The unit stair-step conductive paths can be connected to reduce signal cross talk between the conductive stair-case structures whereby at least some of the conductive stair-case structures are connected to transmit a same polarity of electrical signals are spatially separated in a dimension that is perpendicular to a major surface of the dies. A method of manufacturing the device is also disclosed.

20 Claims, 53 Drawing Sheets

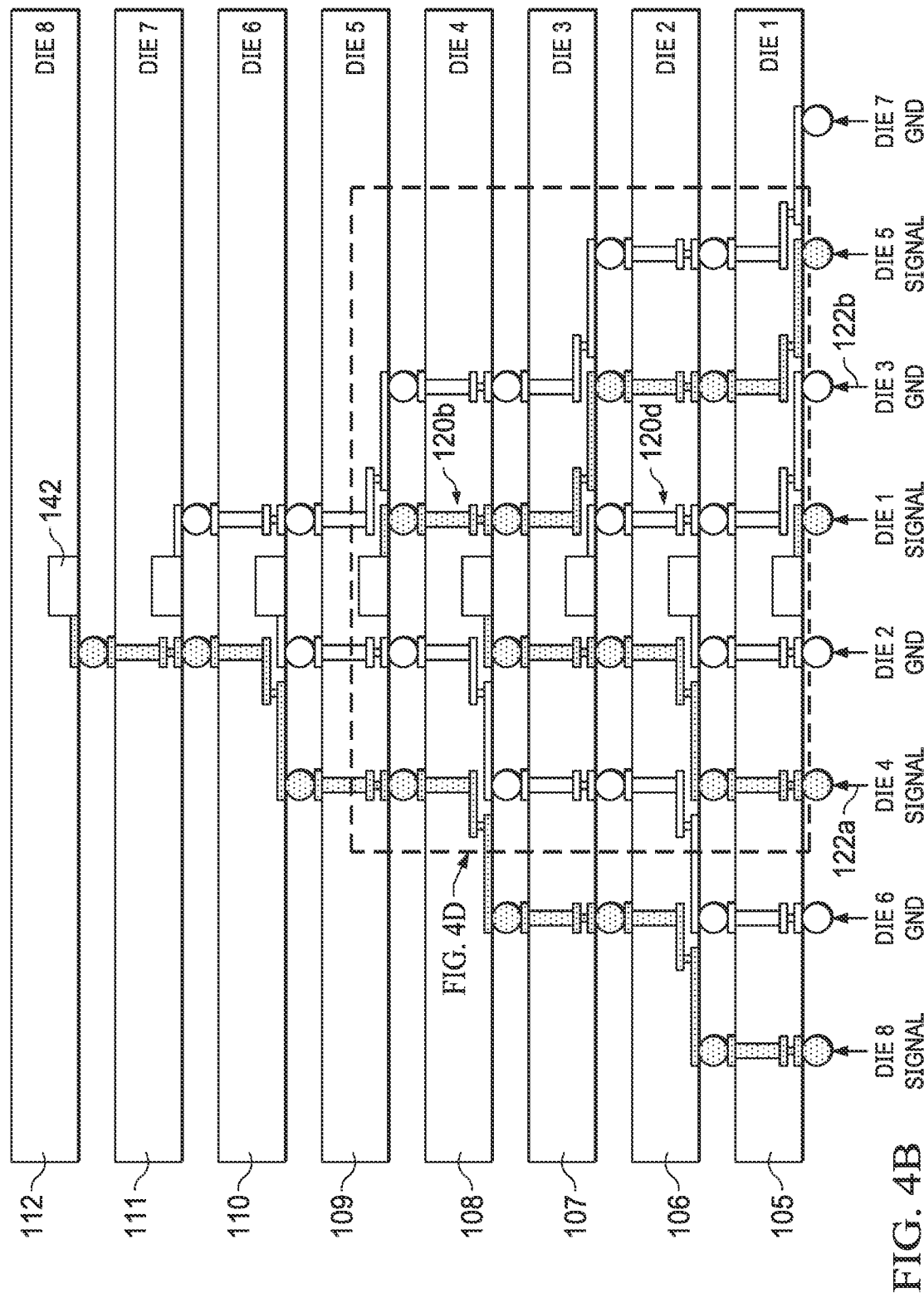

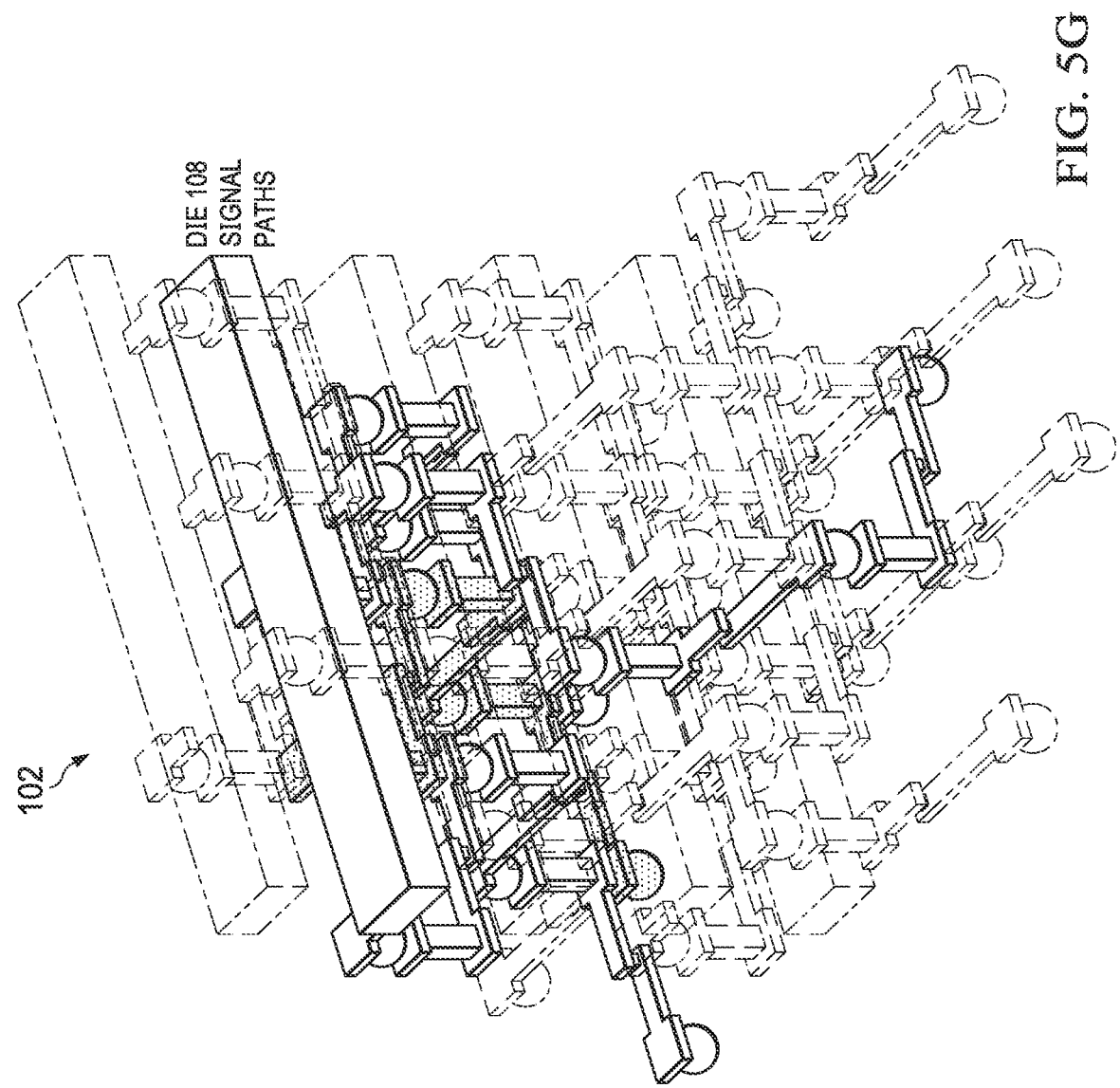

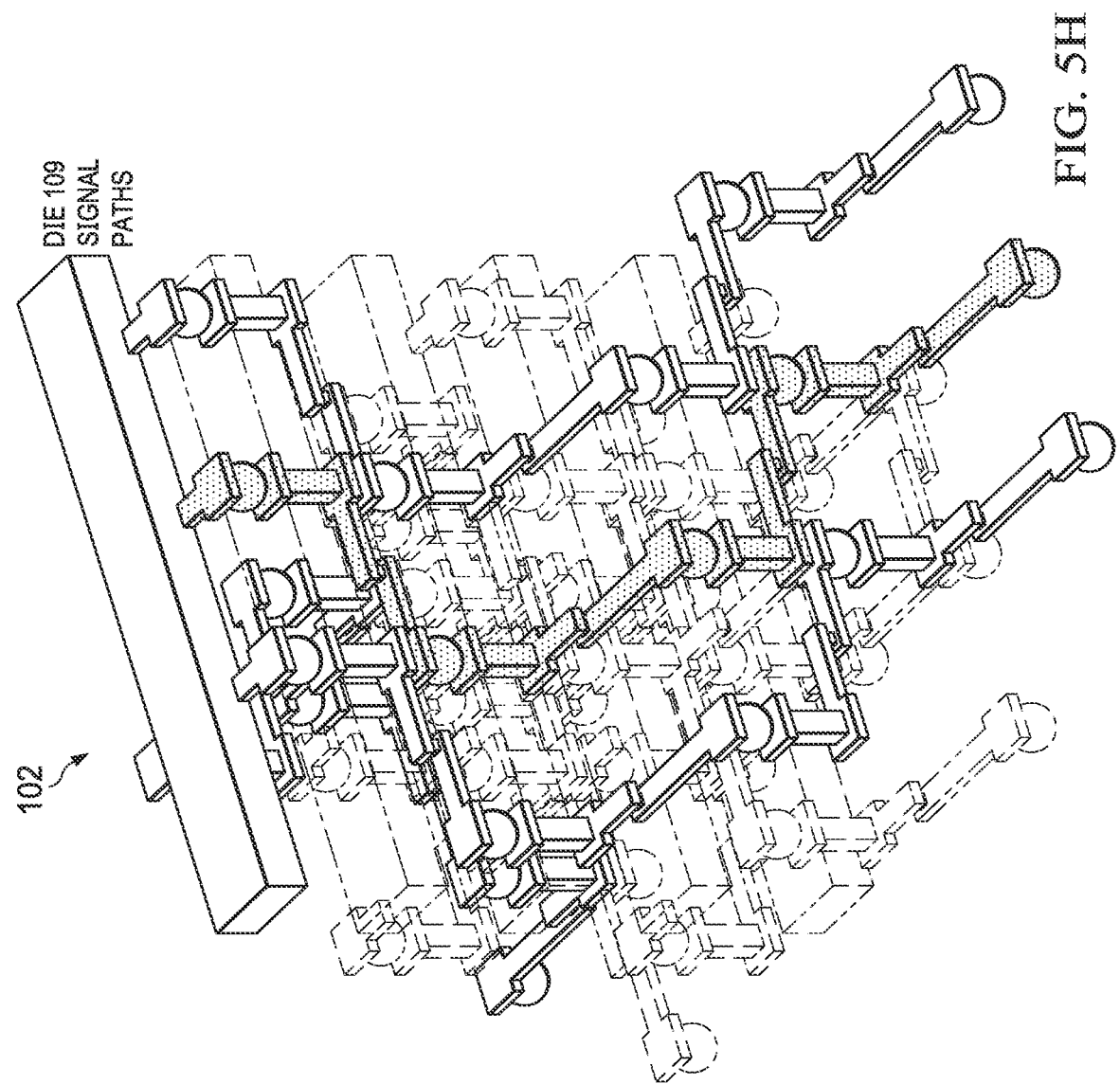

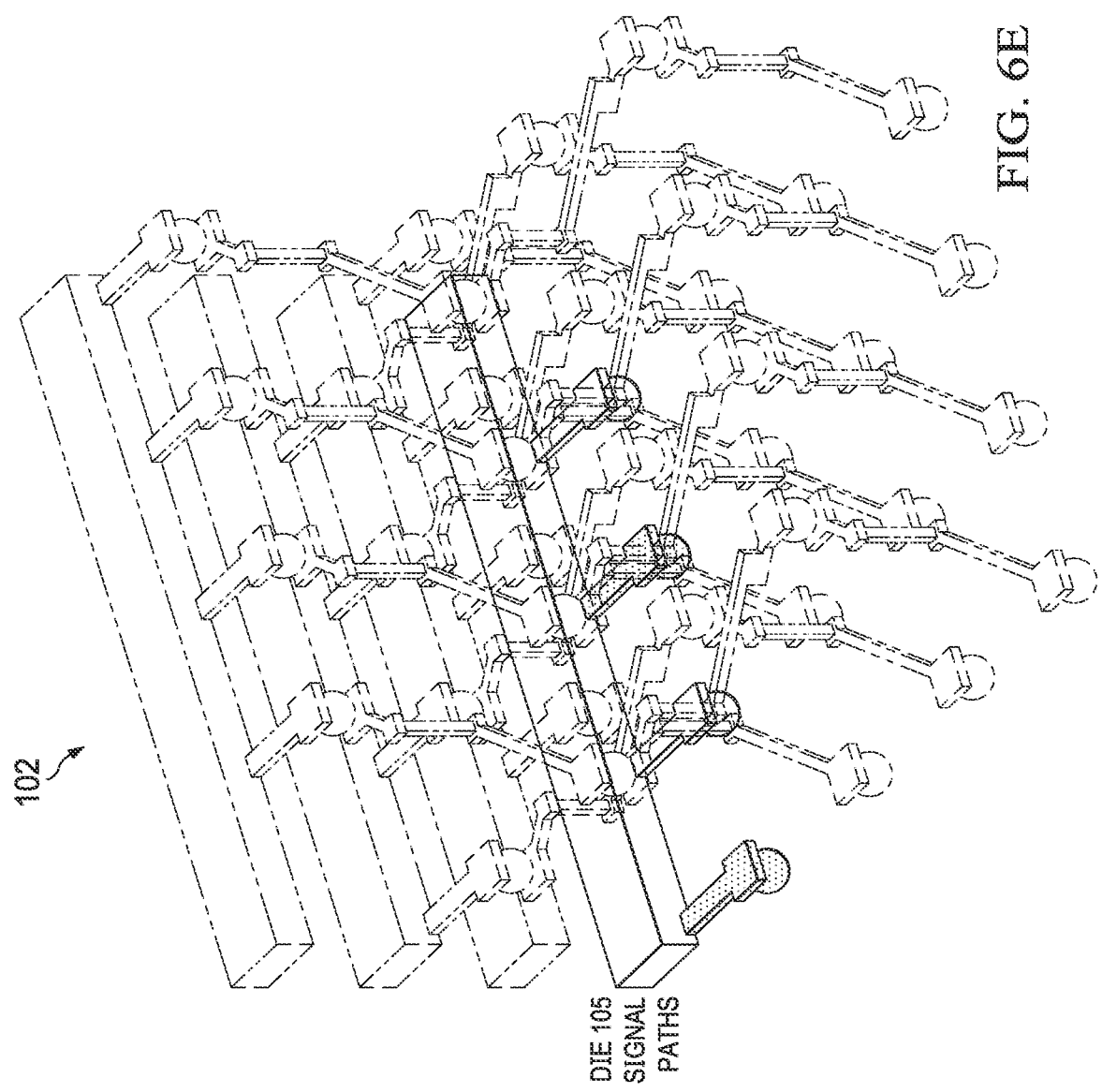

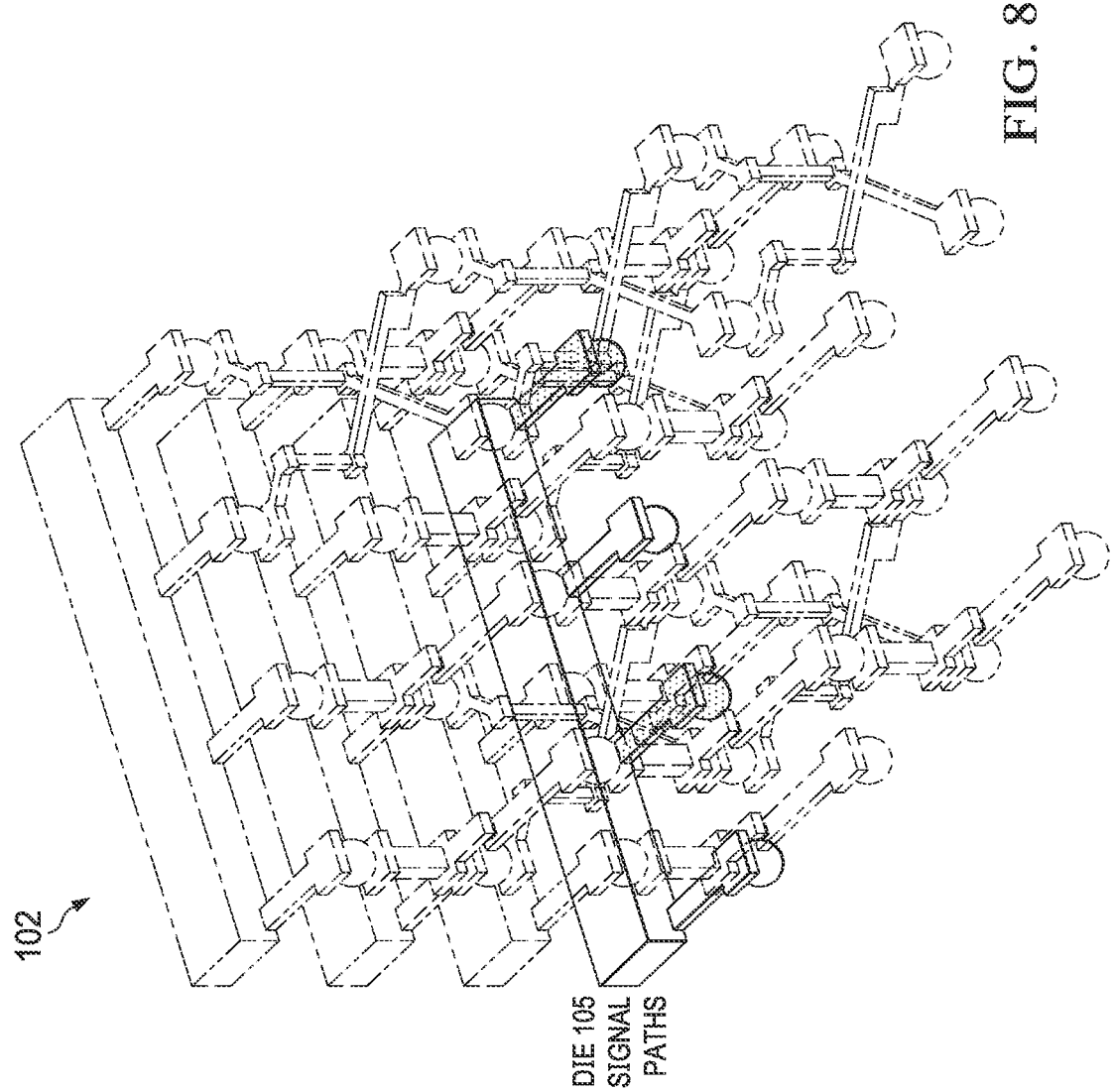

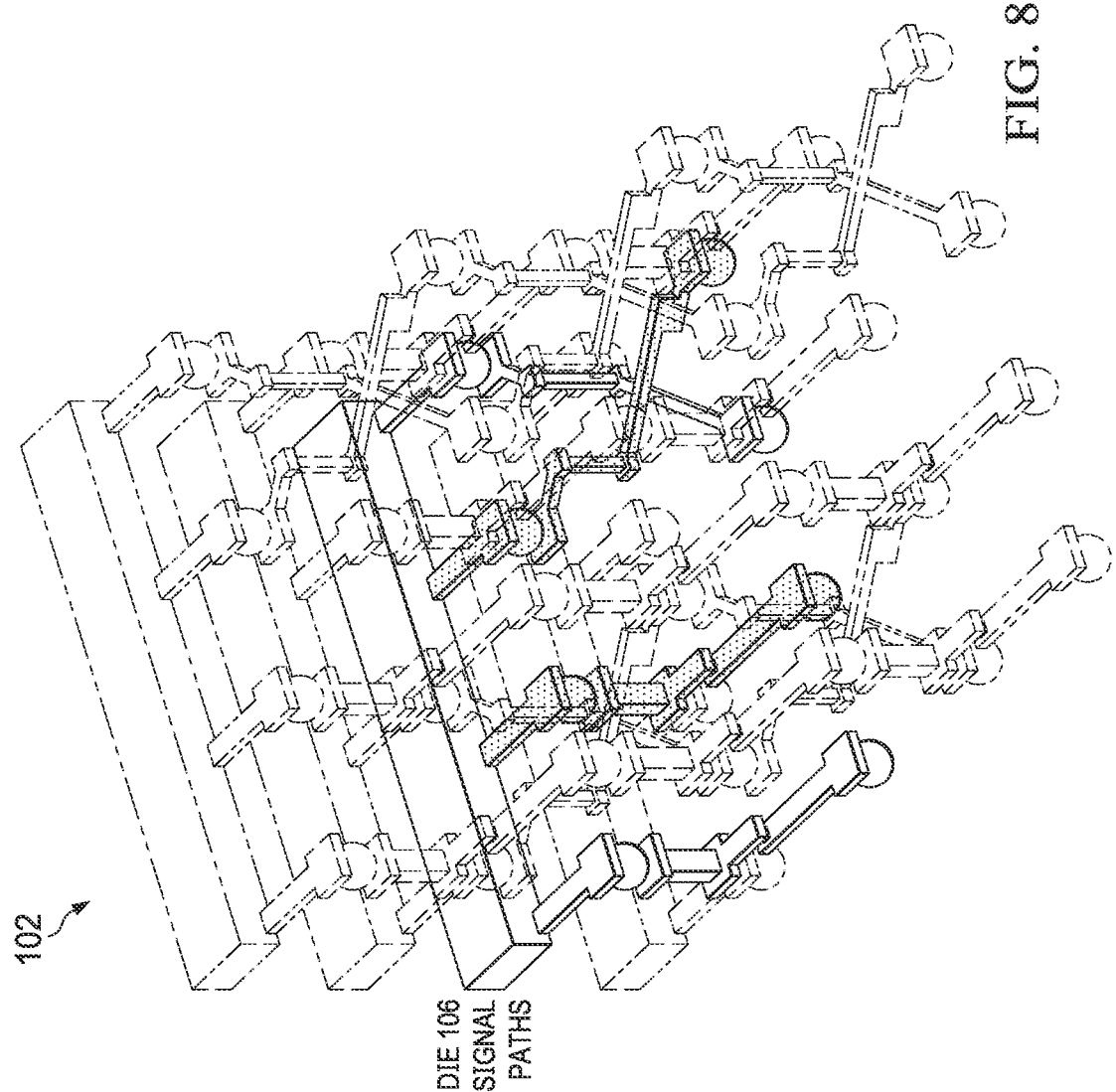

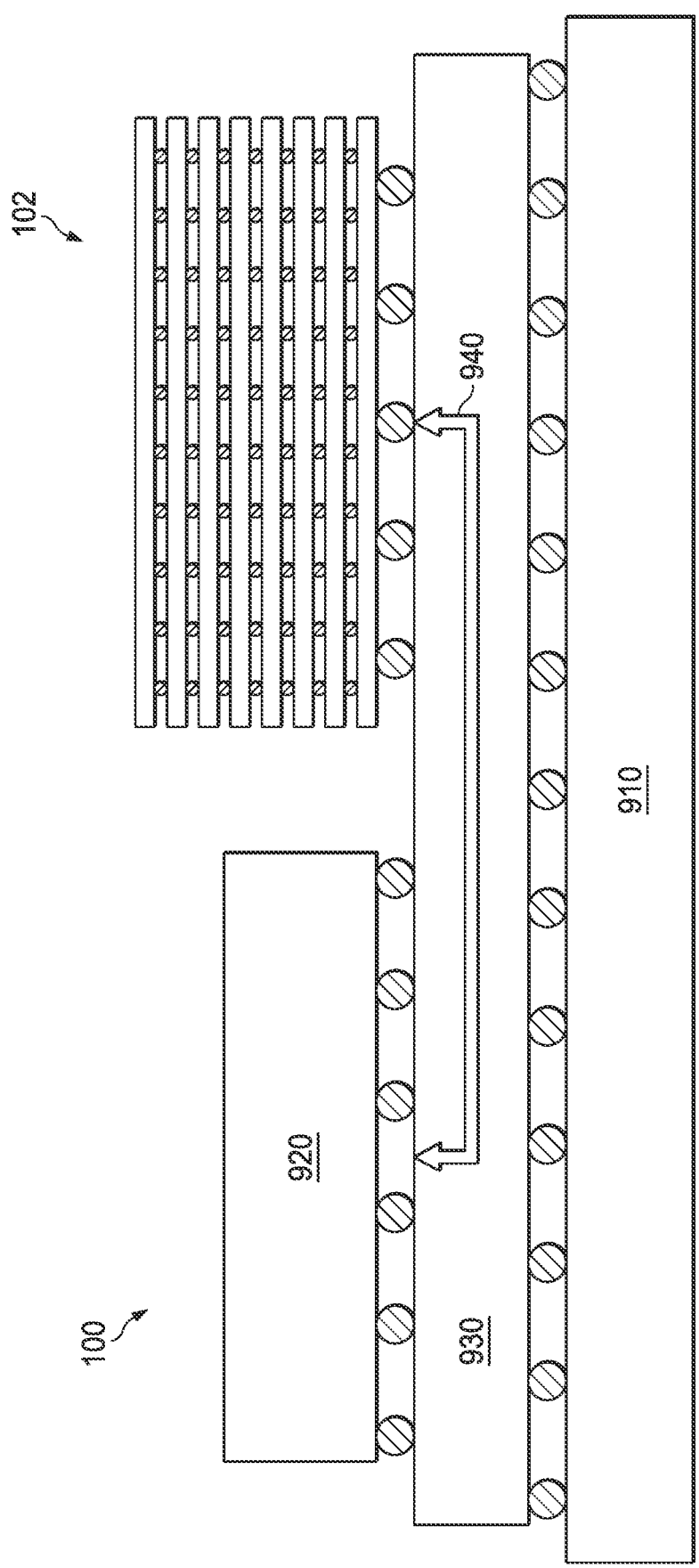

INTERCONNECTION STRUCTURES TO IMPROVE SIGNAL INTEGRITY WITHIN STACKED DIES

TECHNICAL FIELD

Figure 1A:
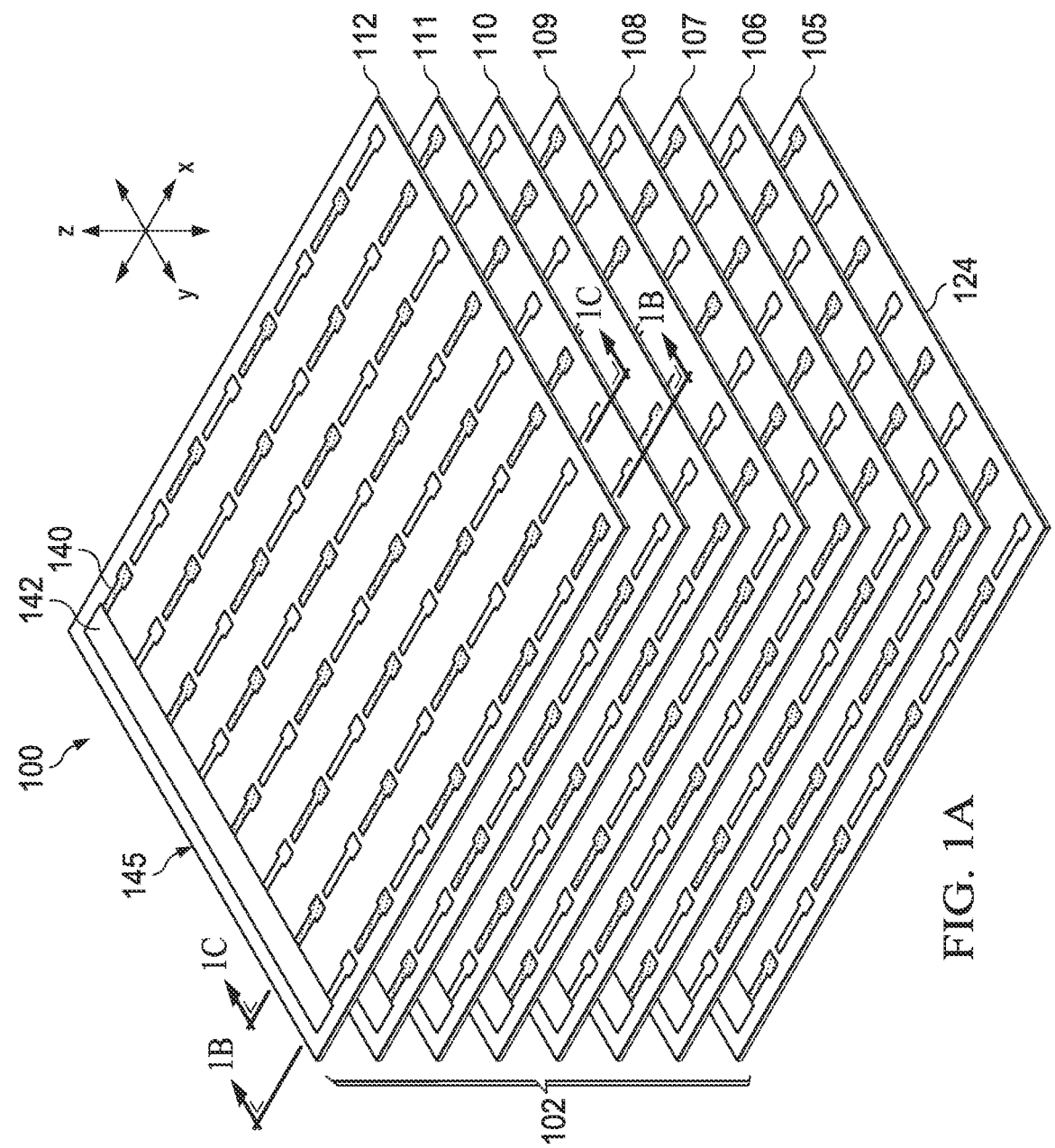

This application is directed, in general, to integrated circuit packages and methods of manufacturing thereof and in particular integrated circuit package that include stacked dies.

BACKGROUND

Stacks of die are often used for off-chip memory applications, such as High Bandwidth Memory (HBM), to increase memory capacity and bandwidth. Such off-chip memory applications can include graphics, networking and supercomputing applications. Stacked dynamic random-access memory (DRAM) dies (e.g., 3-dimensional, 3D, DRAM stacks) arranged to provide HBM can also help reduce or maintain a small form factor and can reduce power consumption for integrated circuit packages directed to such high-performance applications. Typically signal paths through the stack use 3D interconnections, including through-die via structures (TDV) and other electrical connection features, such as metal bumps and routing lines to form interconnected unit-stair step structures. However, crosstalk between the signal paths formed from the TDV and other electrical connection features can limit the maximum signaling rates through the stack. Some efforts to increase total bandwidth through the stack include doubling the number of TDV signal paths, and therefore area, while maintaining signaling rate.

SUMMARY

One aspect of the present disclosure provides device, the device including a stack of dies. Each of the dies can have unit stair-step conductive paths of connection features which include through-die via structures and routing structures. The unit stair-step conductive paths of one of the dies can be interconnected to another one of the unit stair-step conductive paths of another one of the dies to form one of a plurality of conductive stair-case structures through two or more of the dies. The unit stair-step conductive paths can be connected to reduce signal cross talk between the conductive stair-case structures whereby at least some of the conductive stair-case structures are connected to transmit a same polarity of electrical signals are spatially separated in a dimension that is perpendicular to a major surface of the dies.

In another aspect, a method of manufacturing a device is disclosed. The method includes providing dies, each of the dies arranged to have unit stair-step conductive paths which include through-die via structures and routing structures. The method includes stacking the dies to form a die stack, wherein the unit stair-step conductive paths of one of the dies are interconnected to another one of the unit stair-step conductive paths of another one of the dies to form one of a plurality conductive stair-case structures through two or more of the dies. The method includes arranging the unit stair-step conductive paths to reduce signal cross talk between the conductive stair-case structures whereby at least some of the conductive stair-cases that carry a same polarity of signals are spatially separated in a dimension that is perpendicular to a major surface of the dies.

BRIEF DESCRIPTION

Figure 1B:
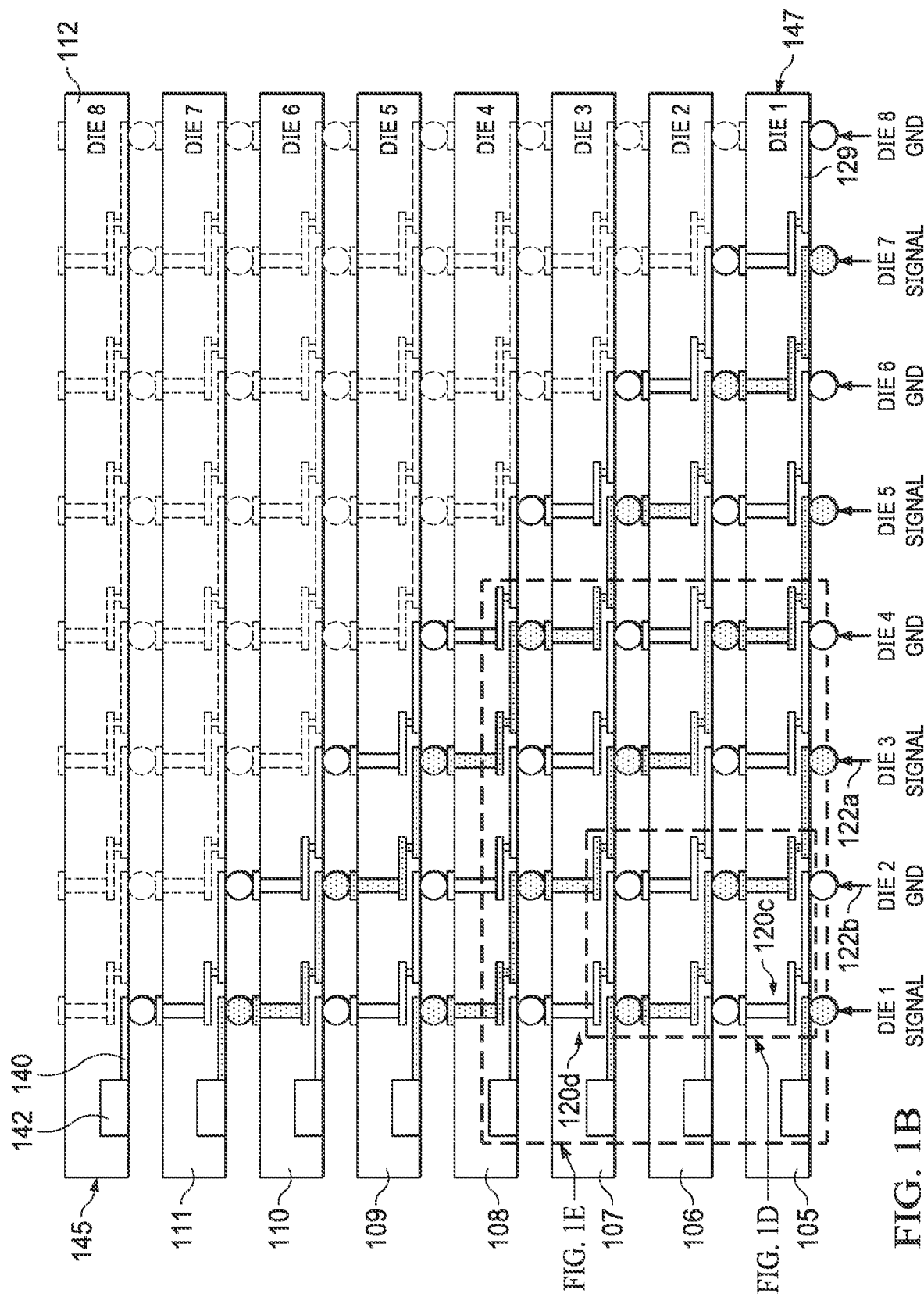
Figure 1C:
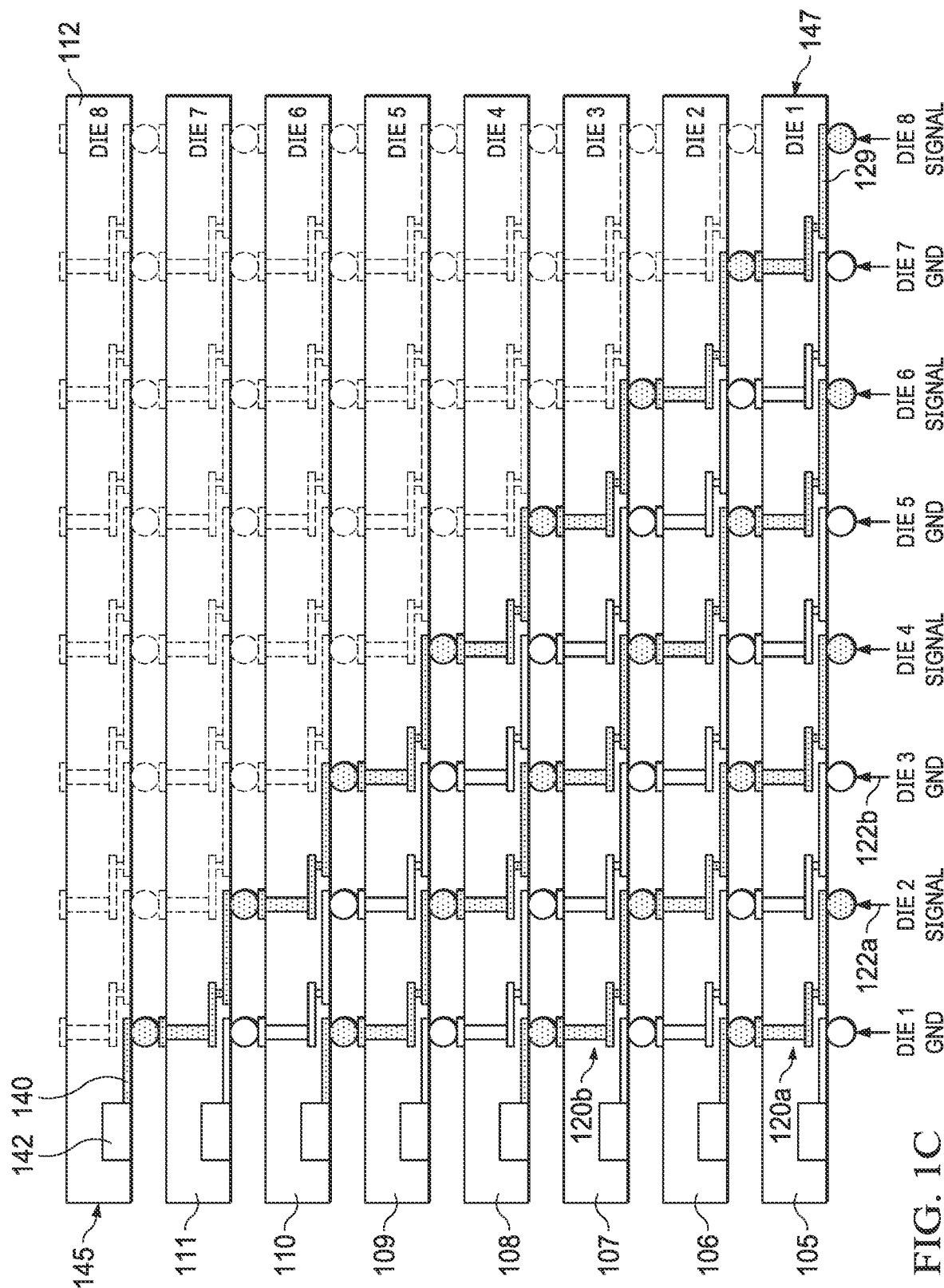
Figure 1E:
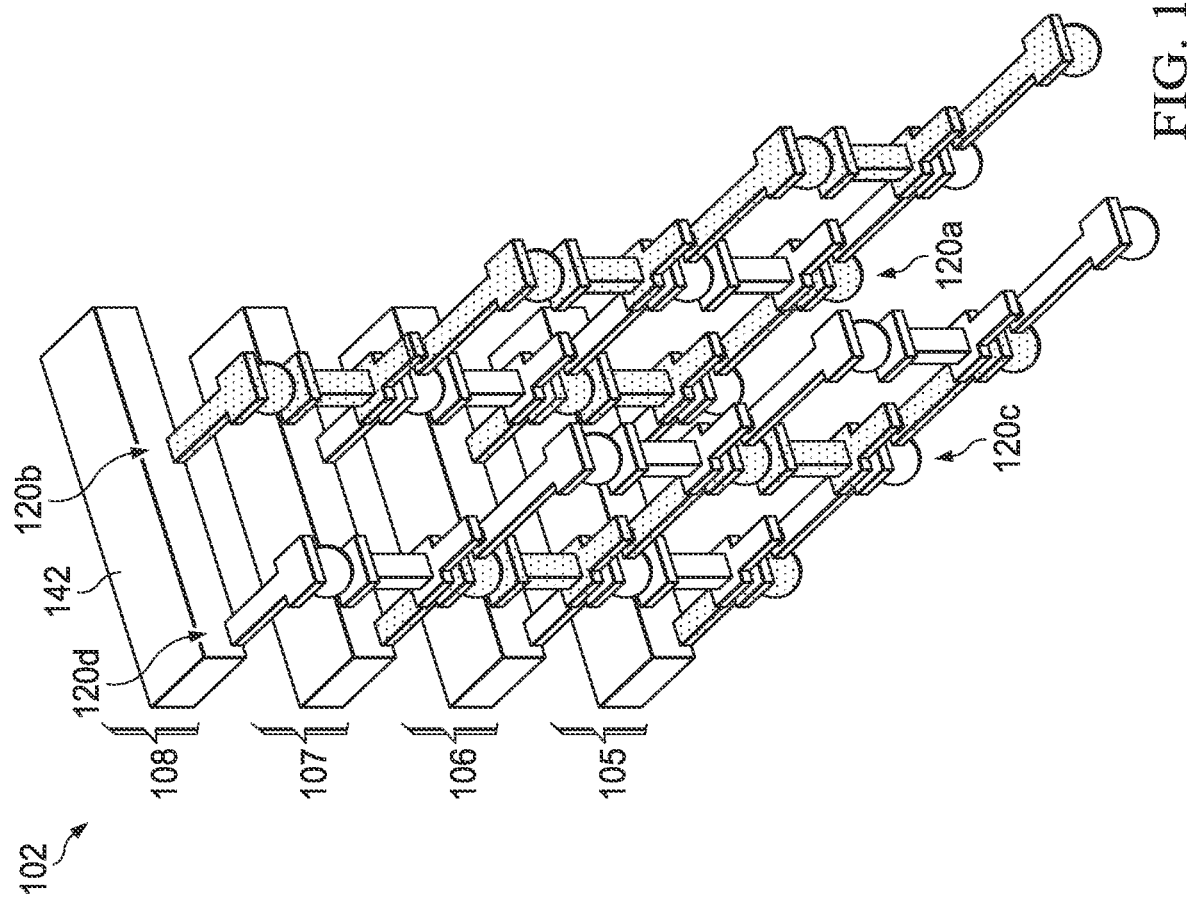
Figure 1D:
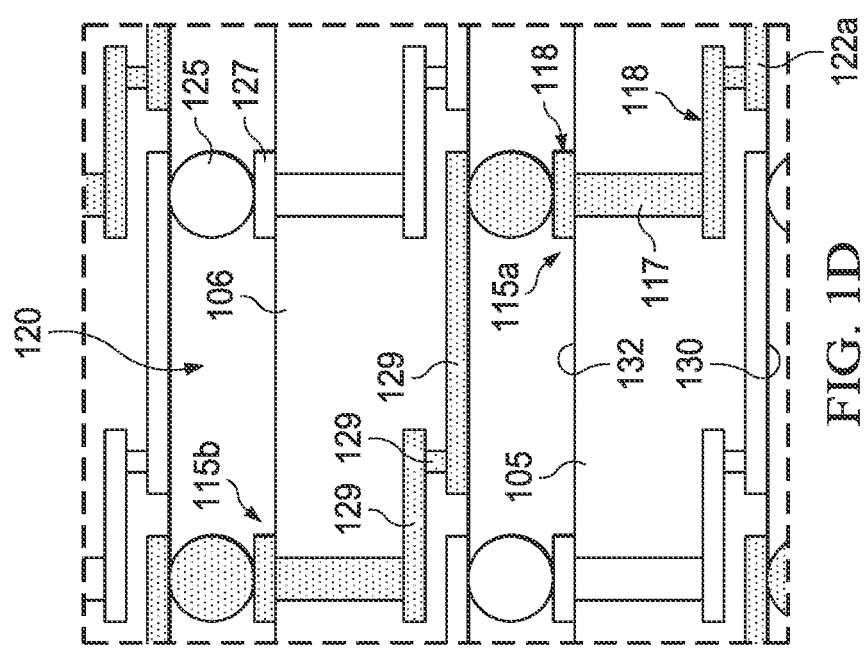
Figure 1G:
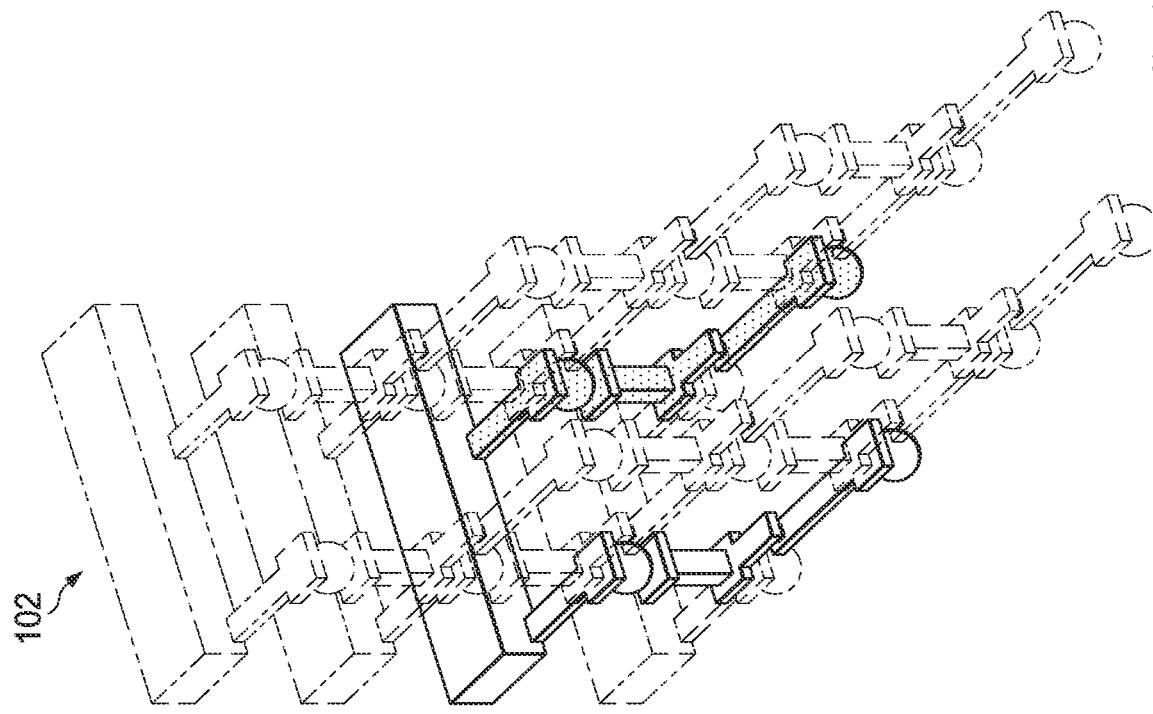
Figure 1F:
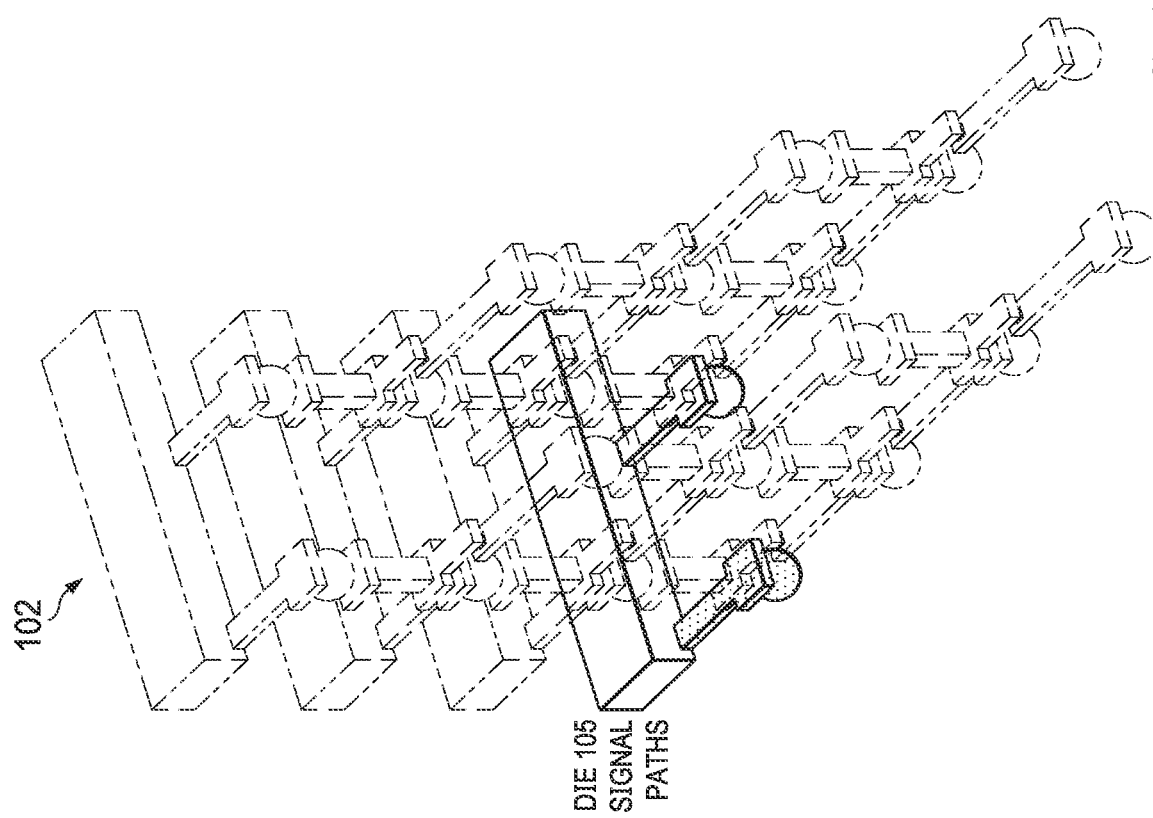
Figure 1I:
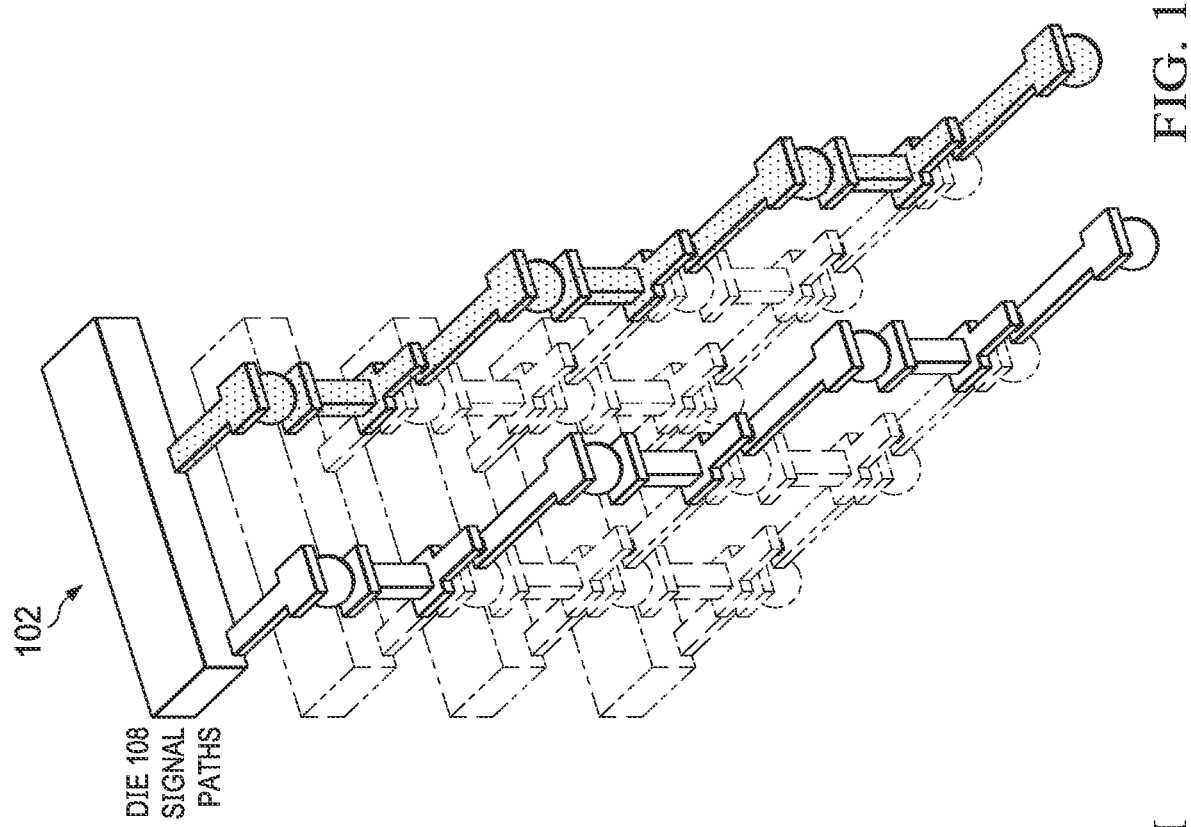
Figure 1H:
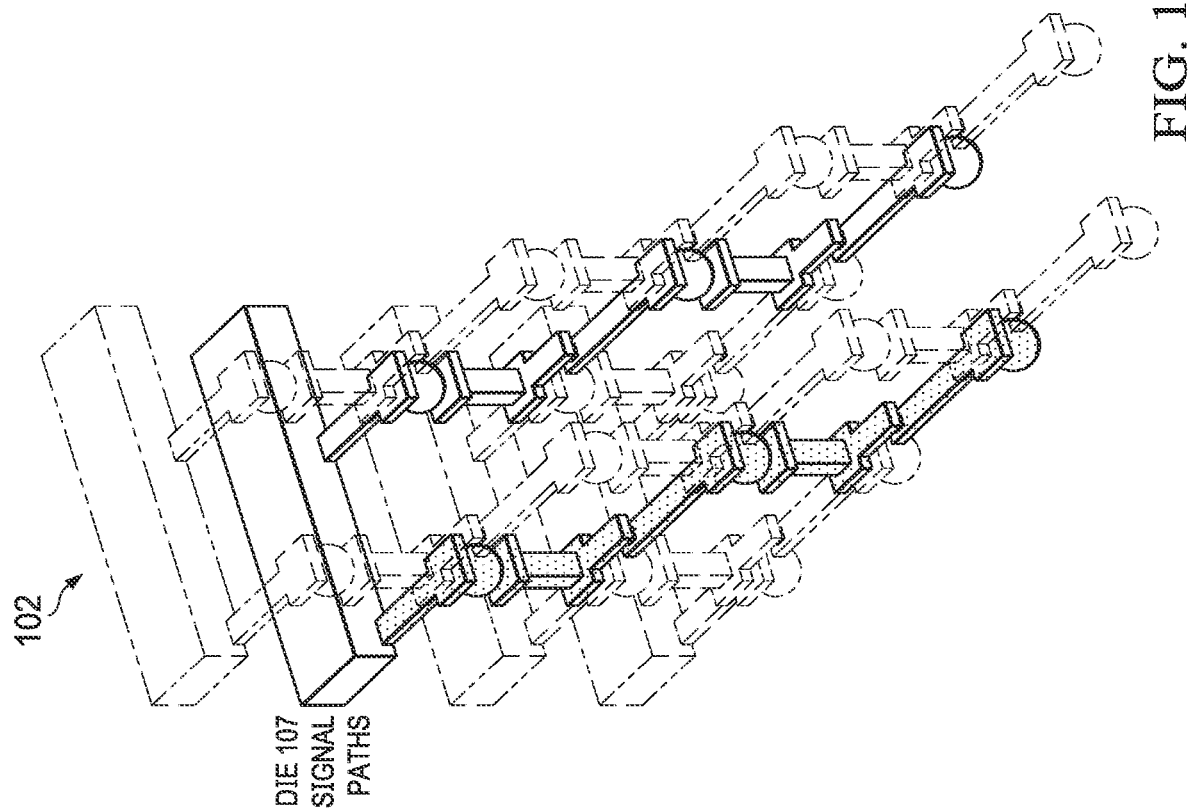
Figure 2A:
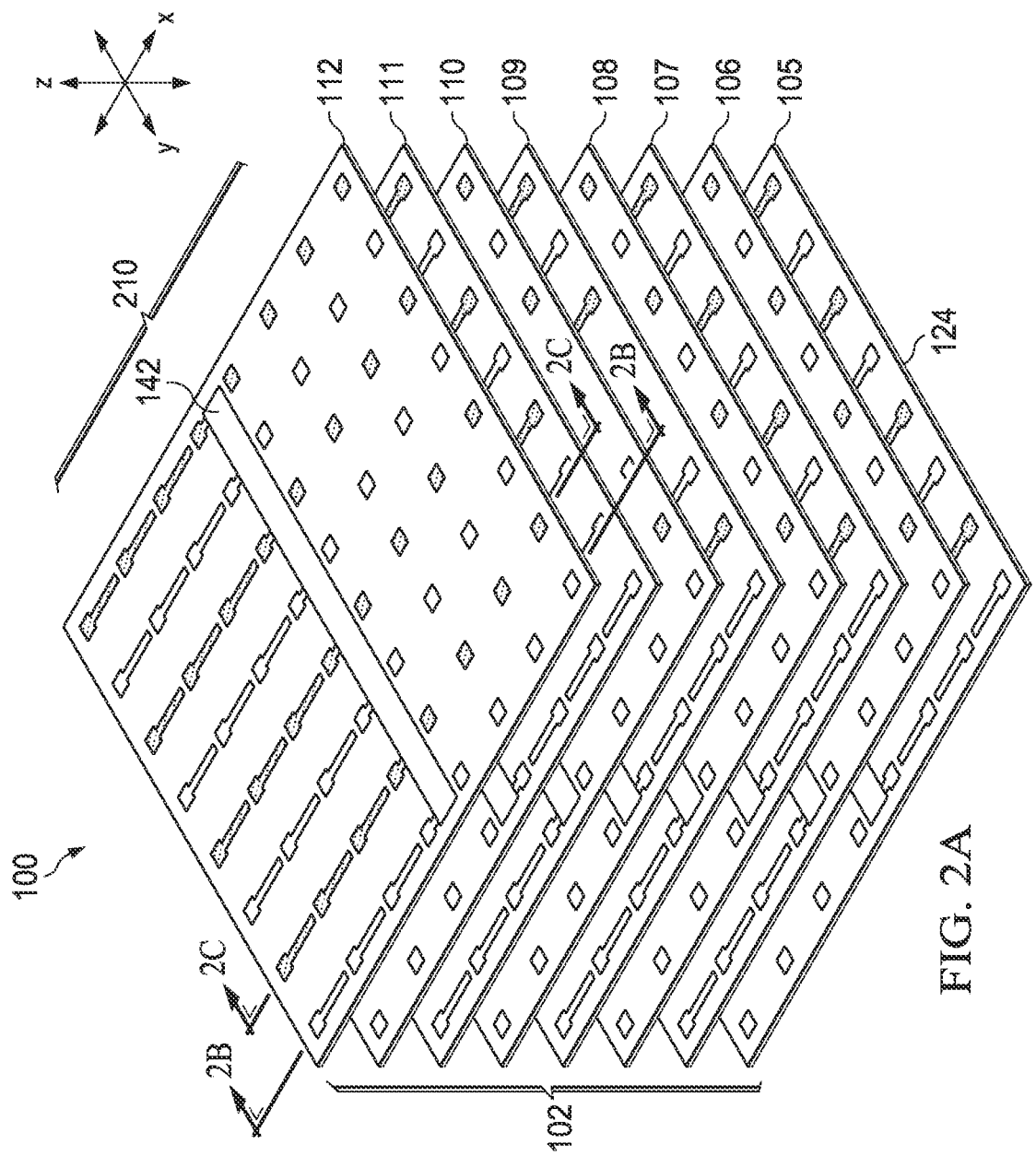
Figure 2B:
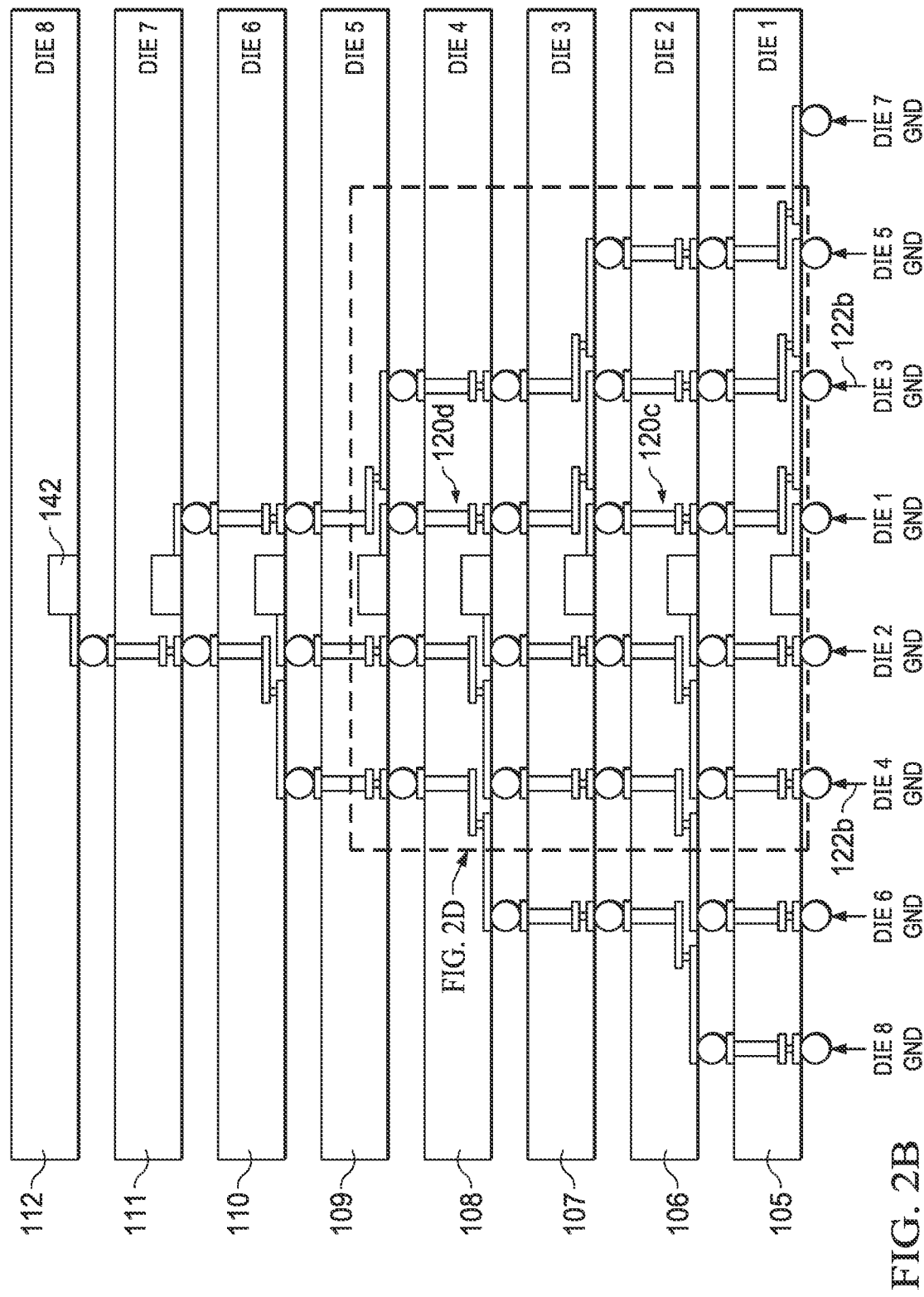
Figure 2C:
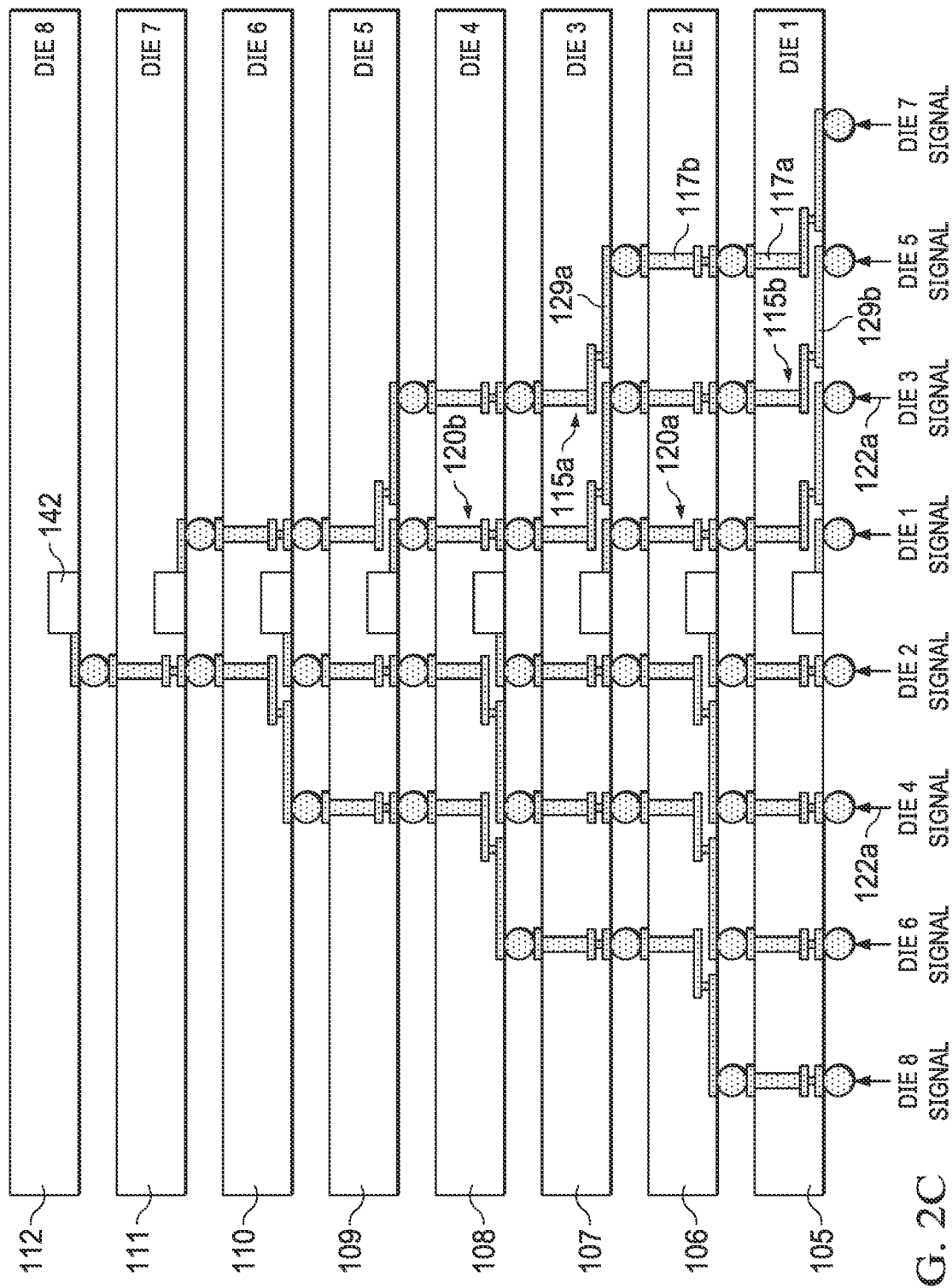
Figure 2D:
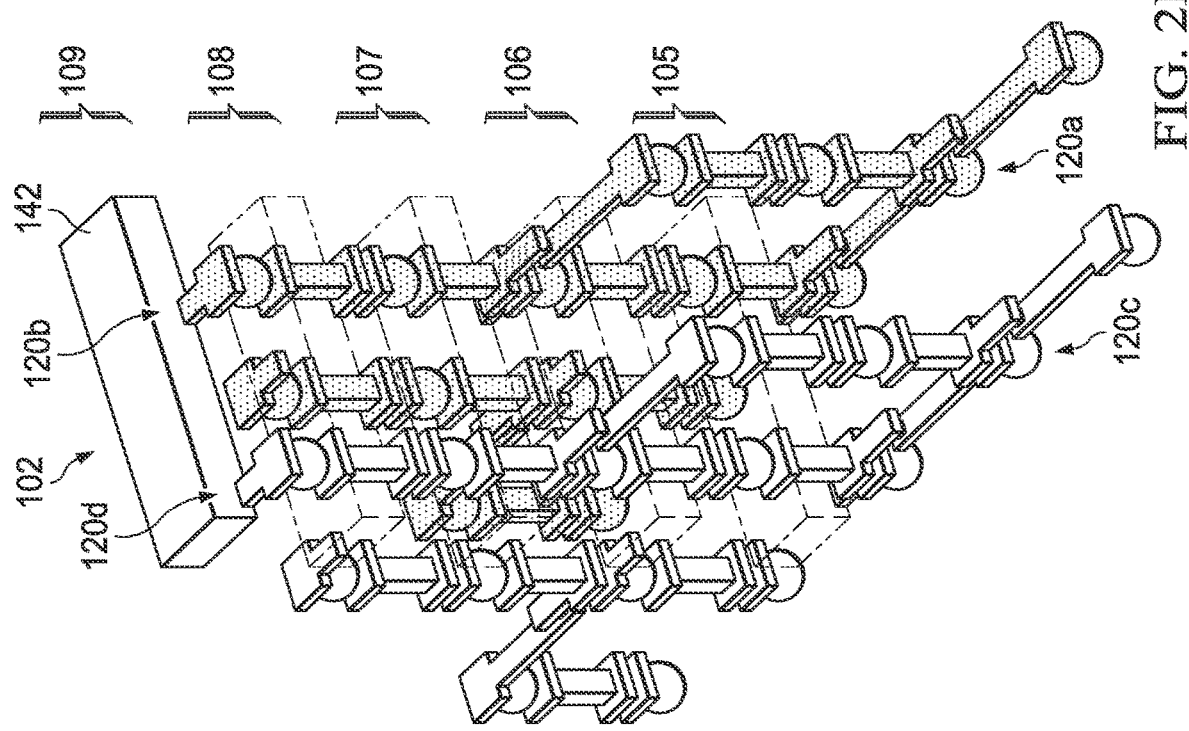
Figure 2F:
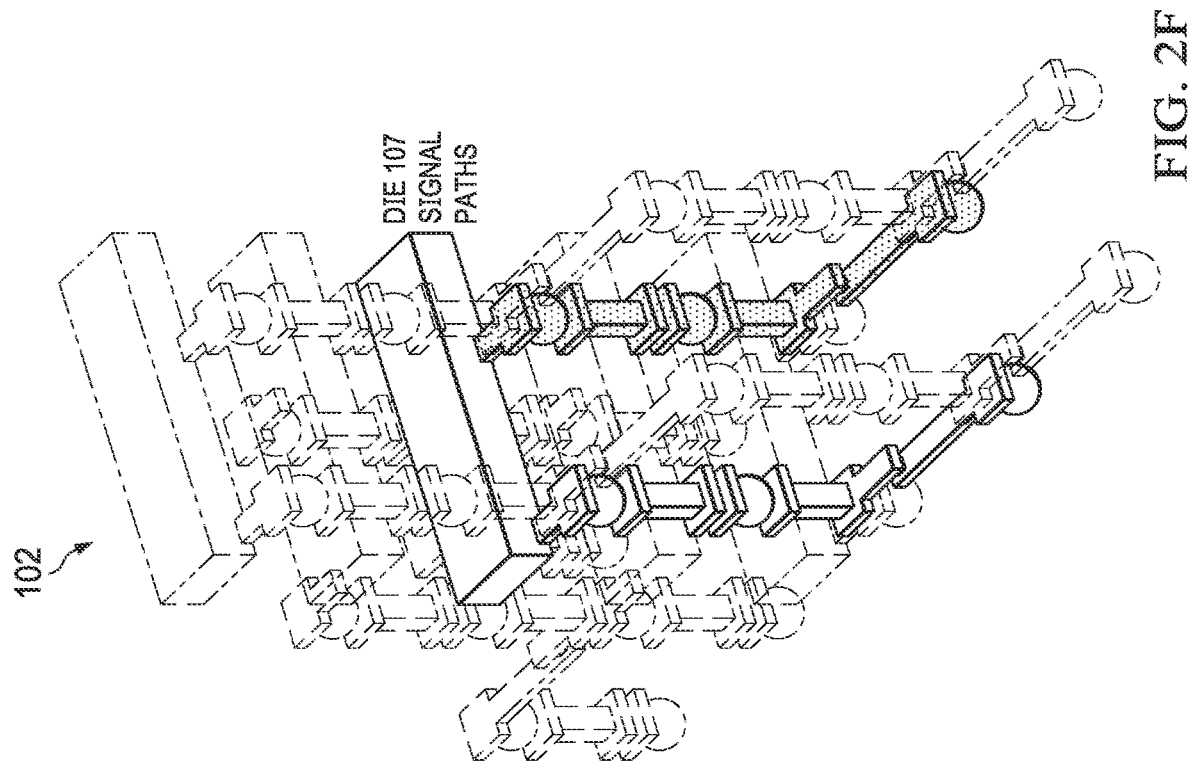
Figure 2E:
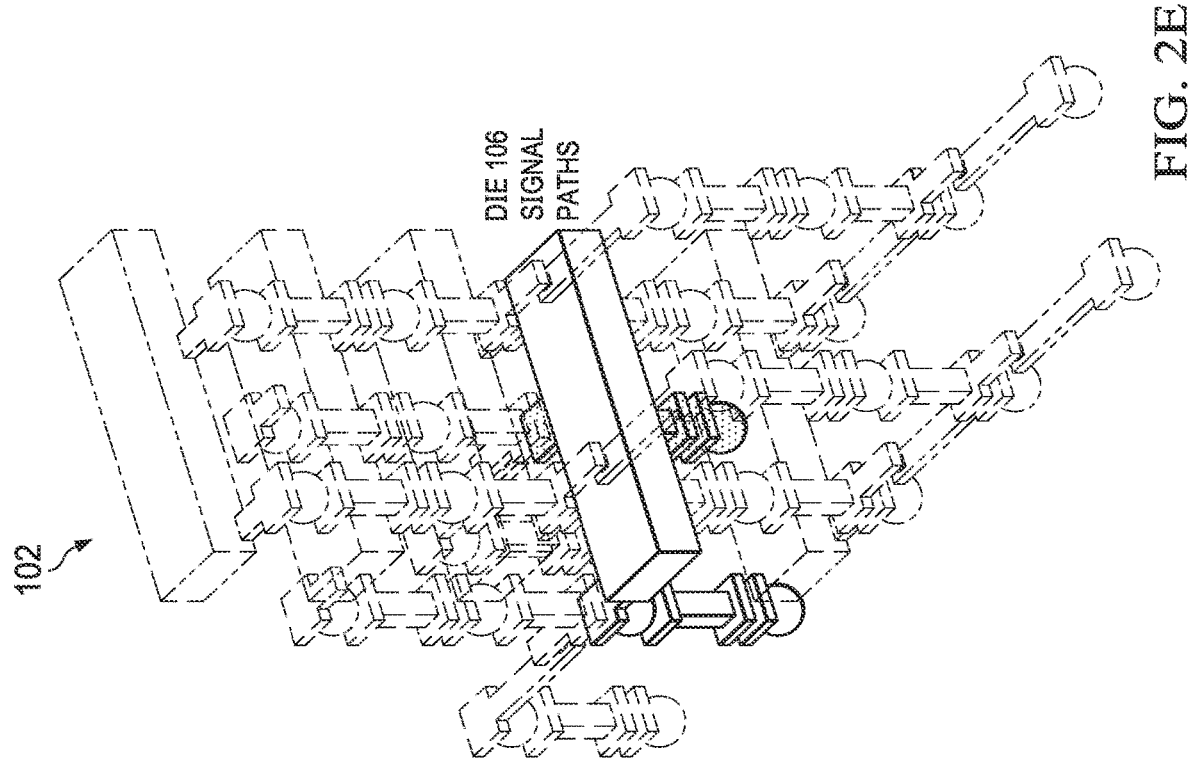
Figure 2G:
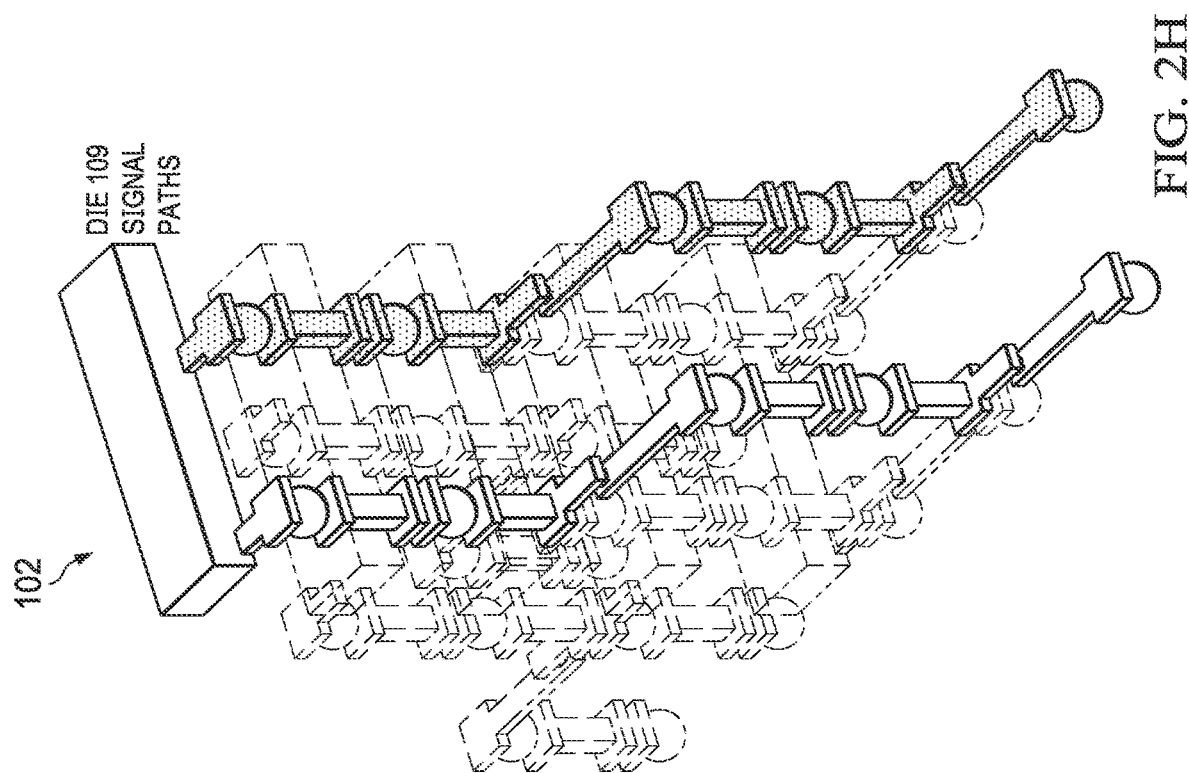
Figure 2H:
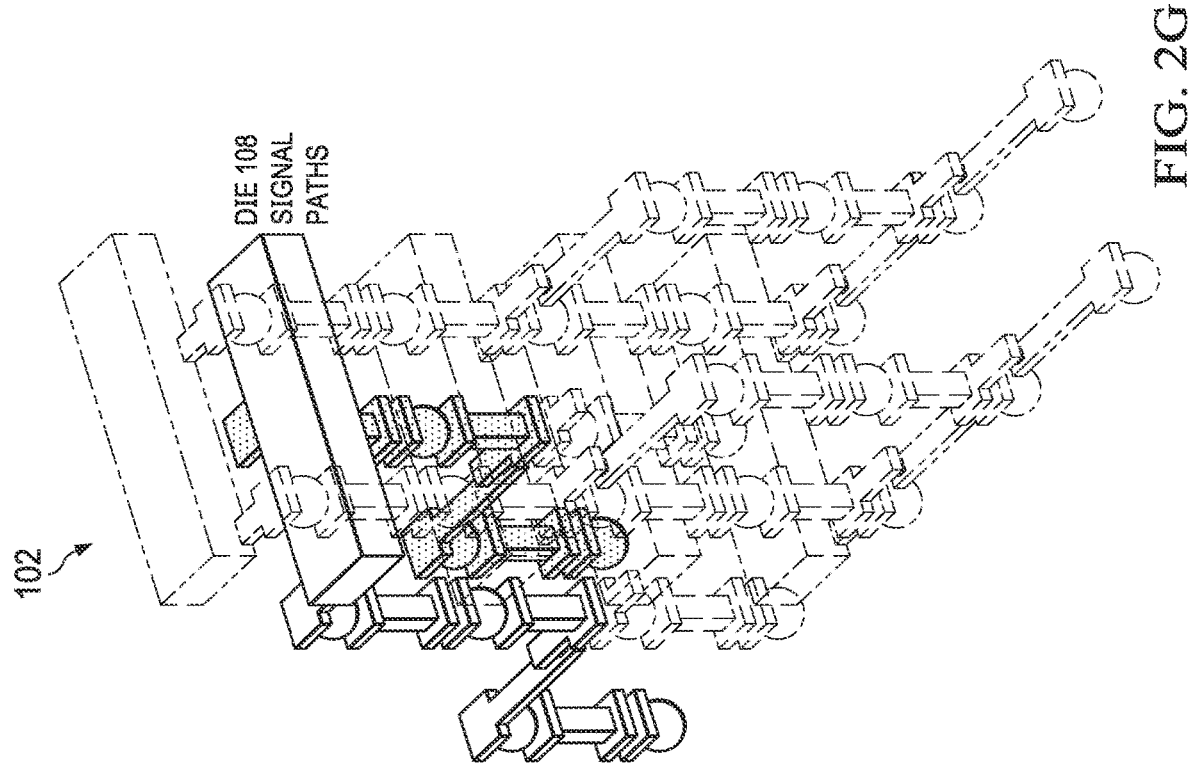
Figure 3A:
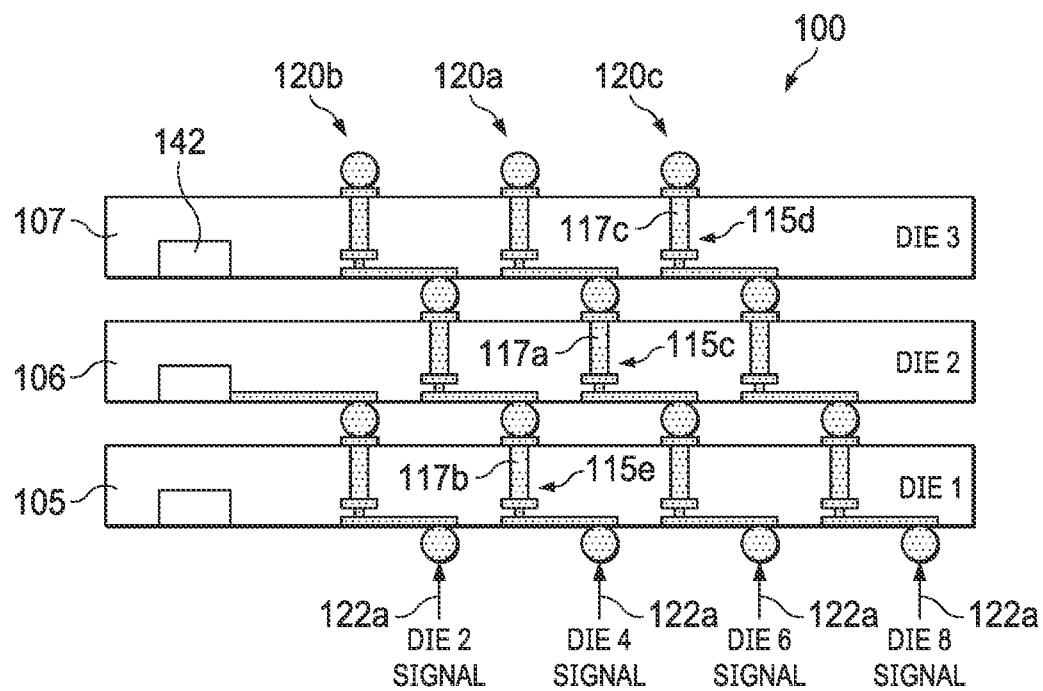
Figure 3B:
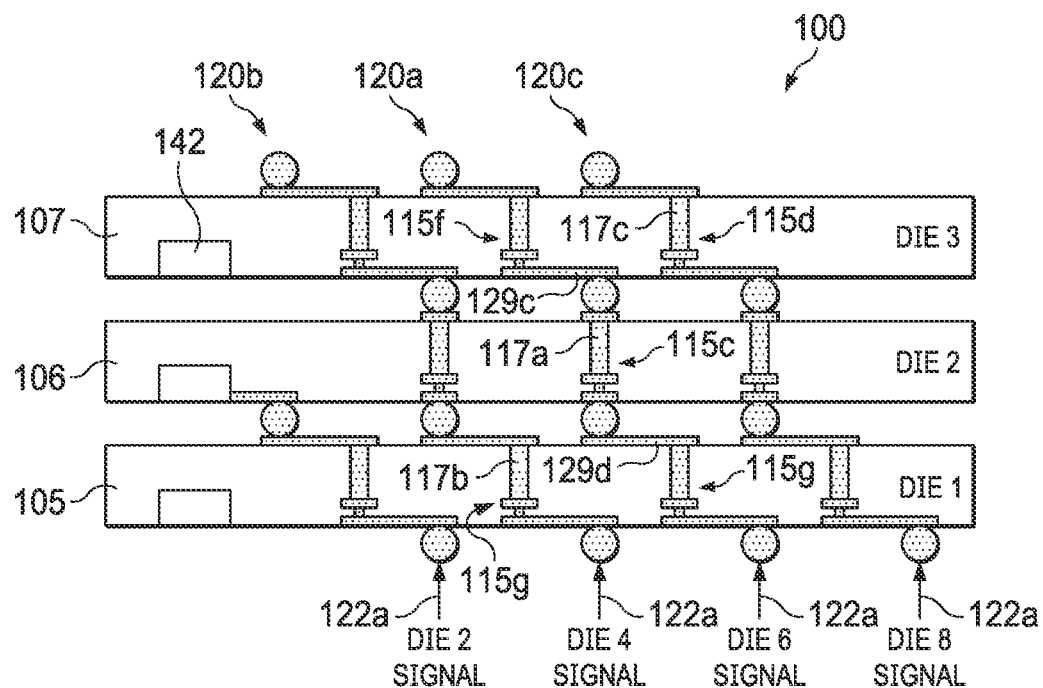
Figure 4A:
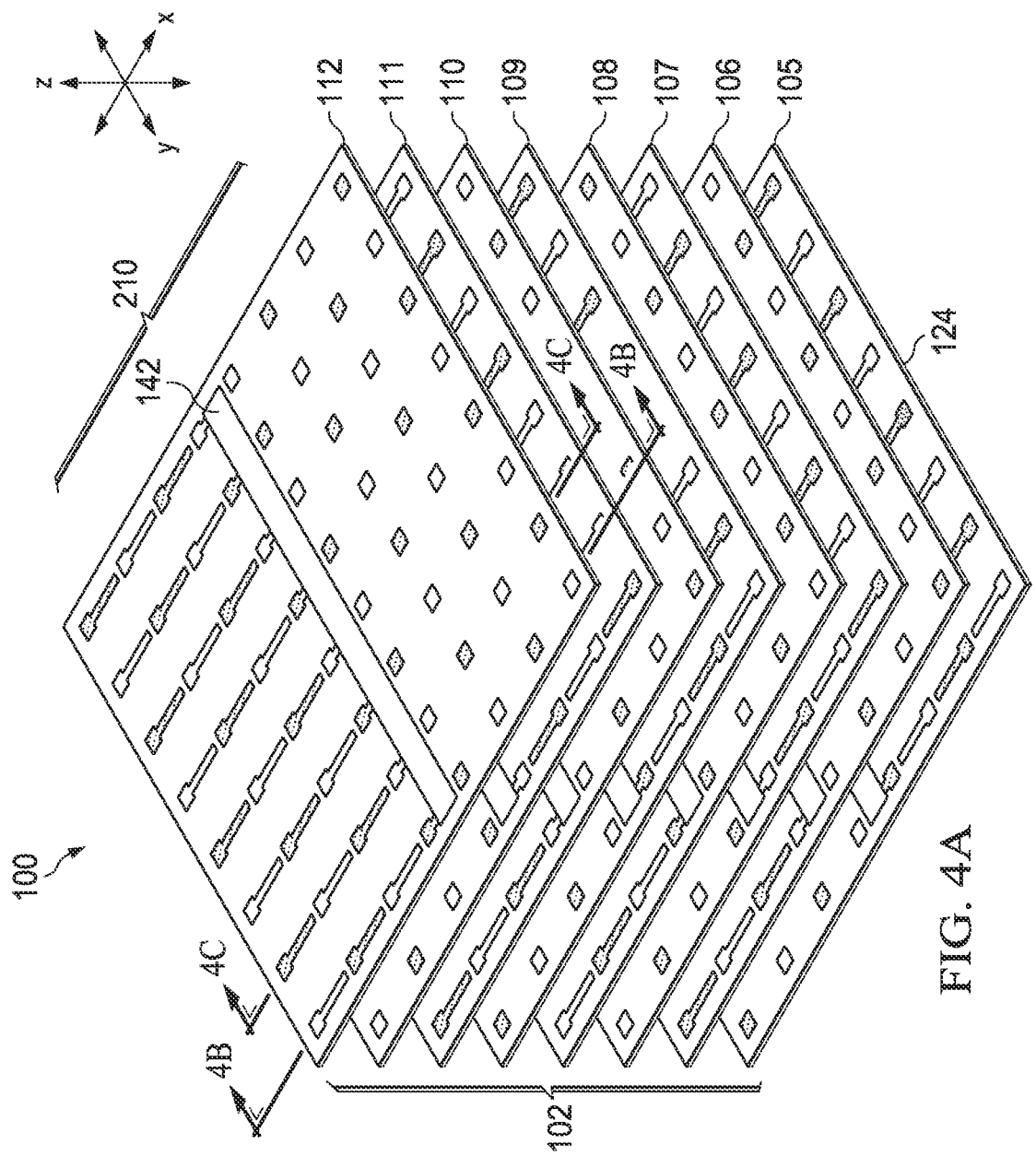
Figure 4C:
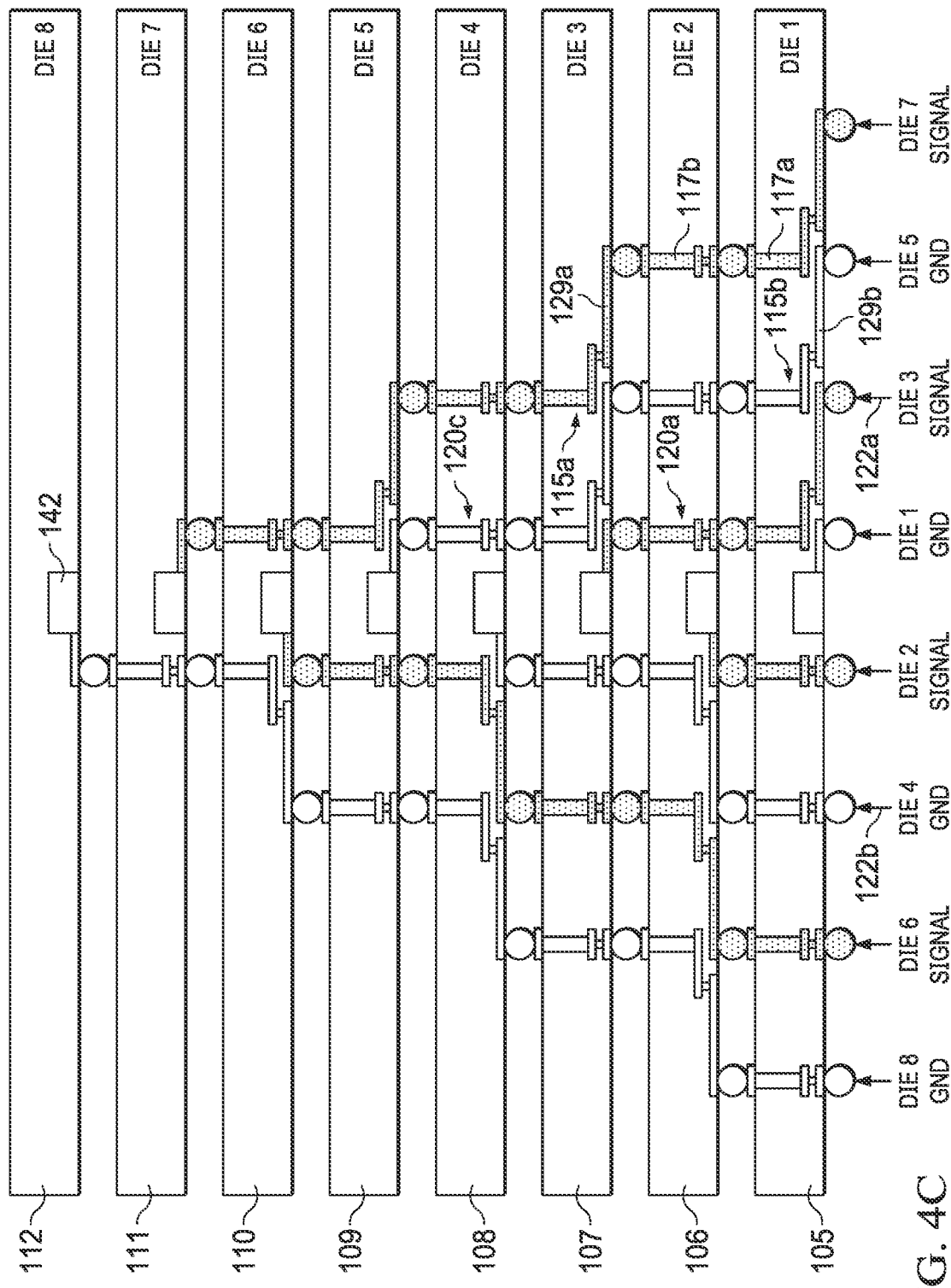
Figure 4D:
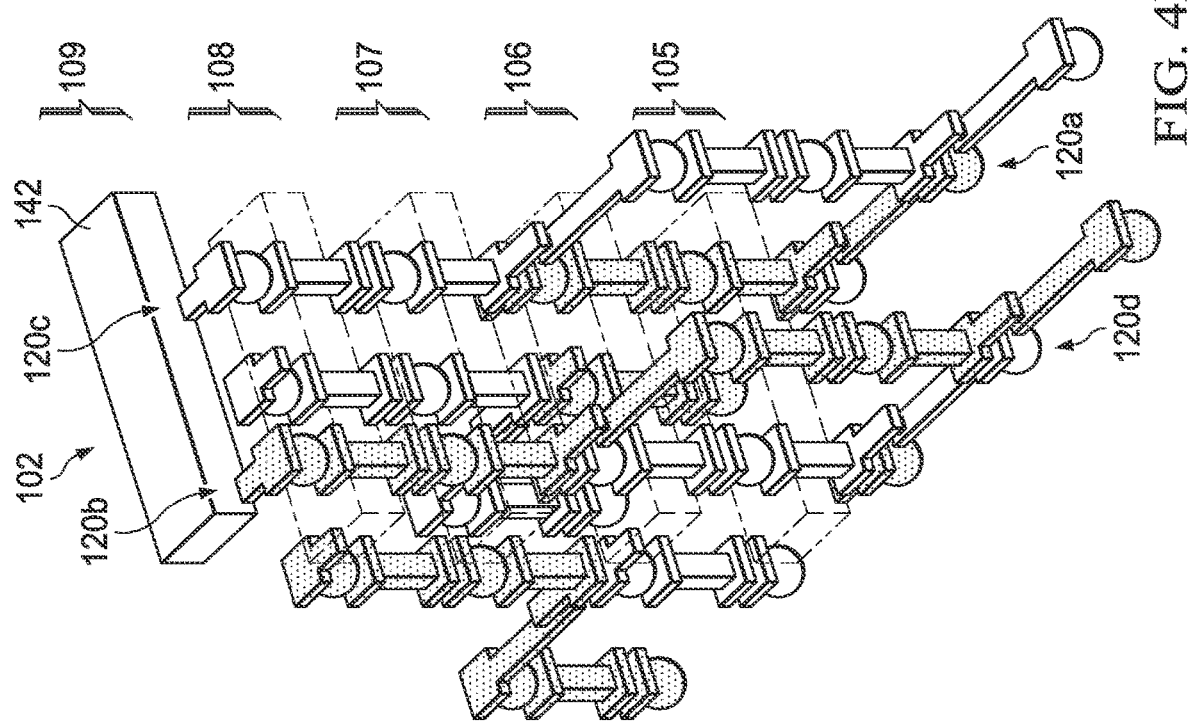
Figure 4F:
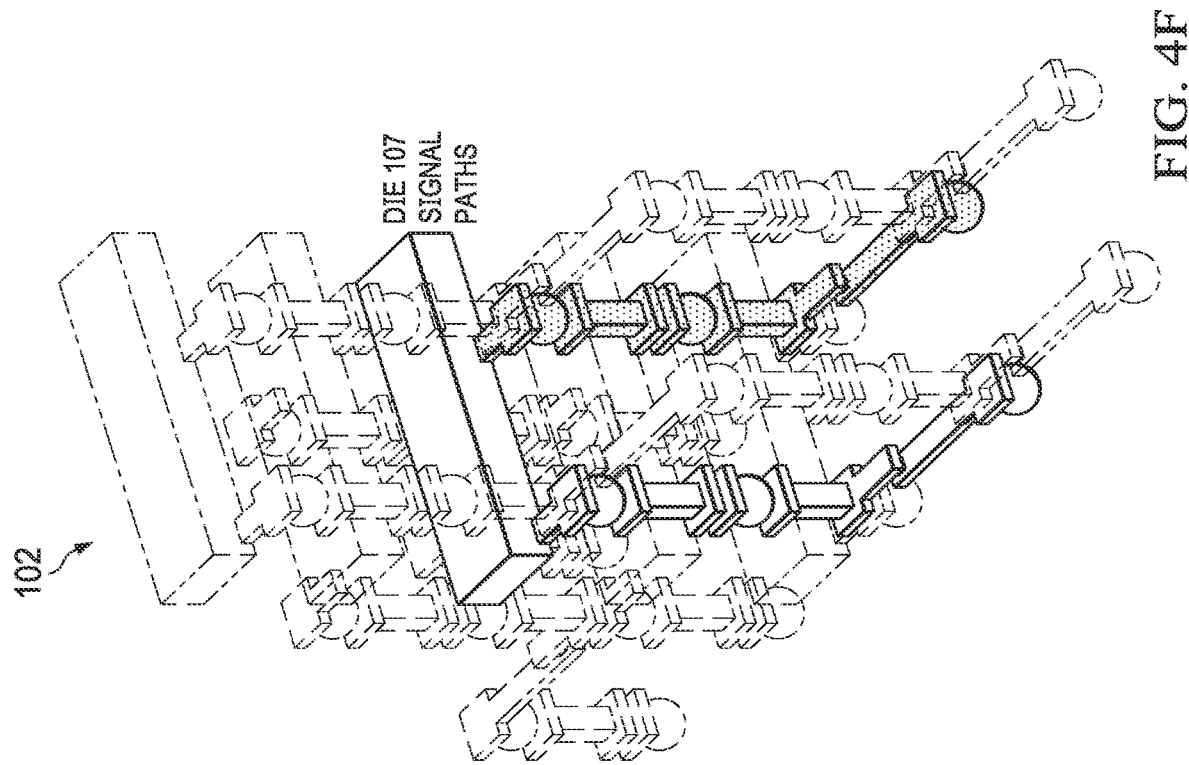
Figure 4E:
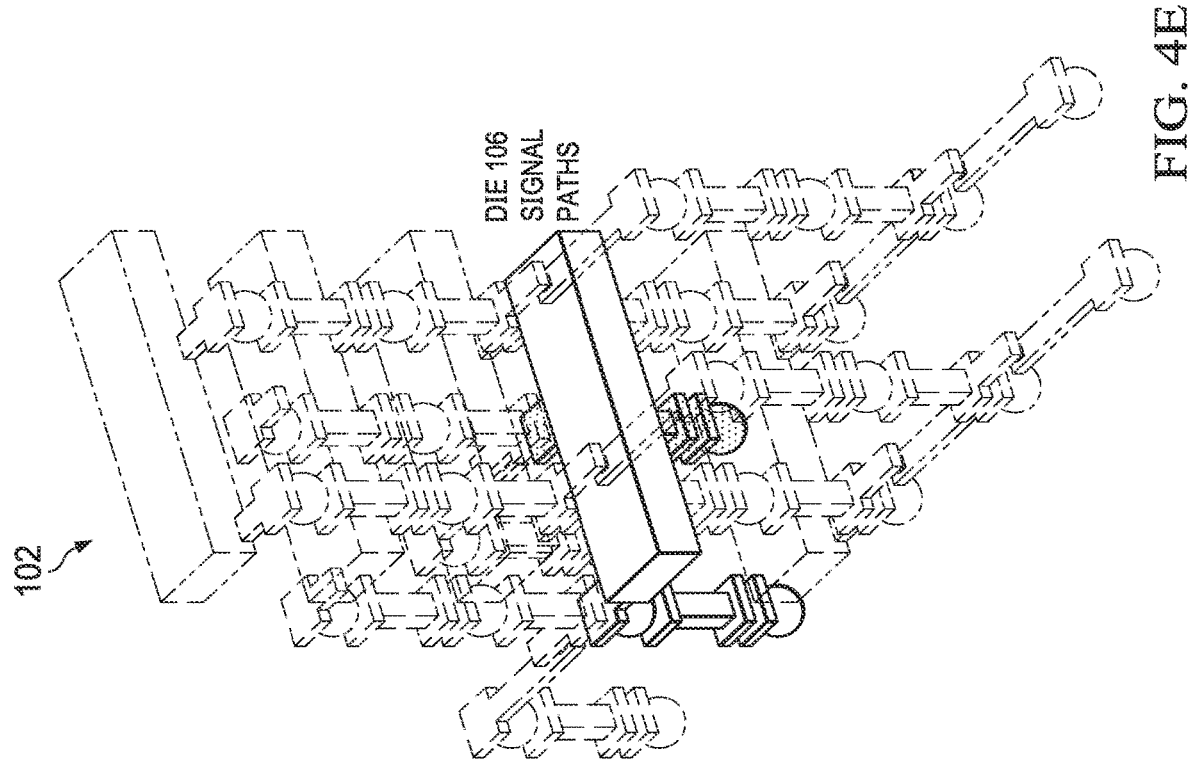
Figure 4H:
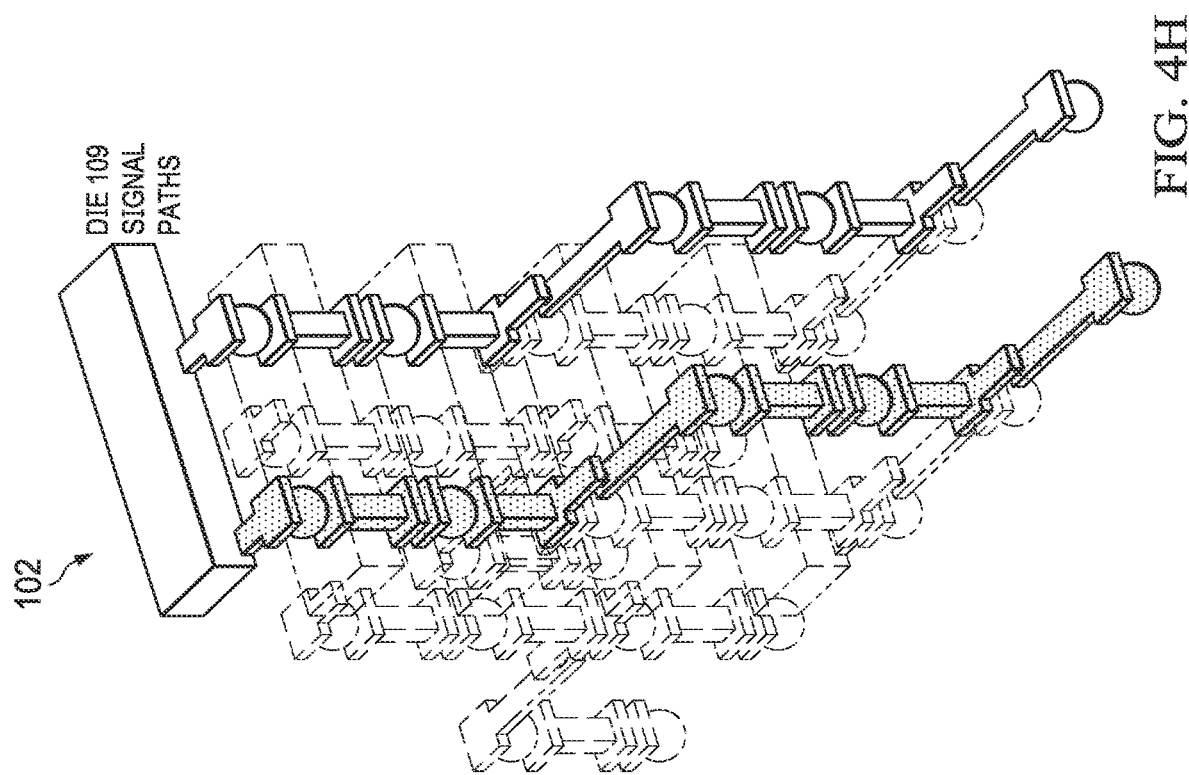
Figure 4G:
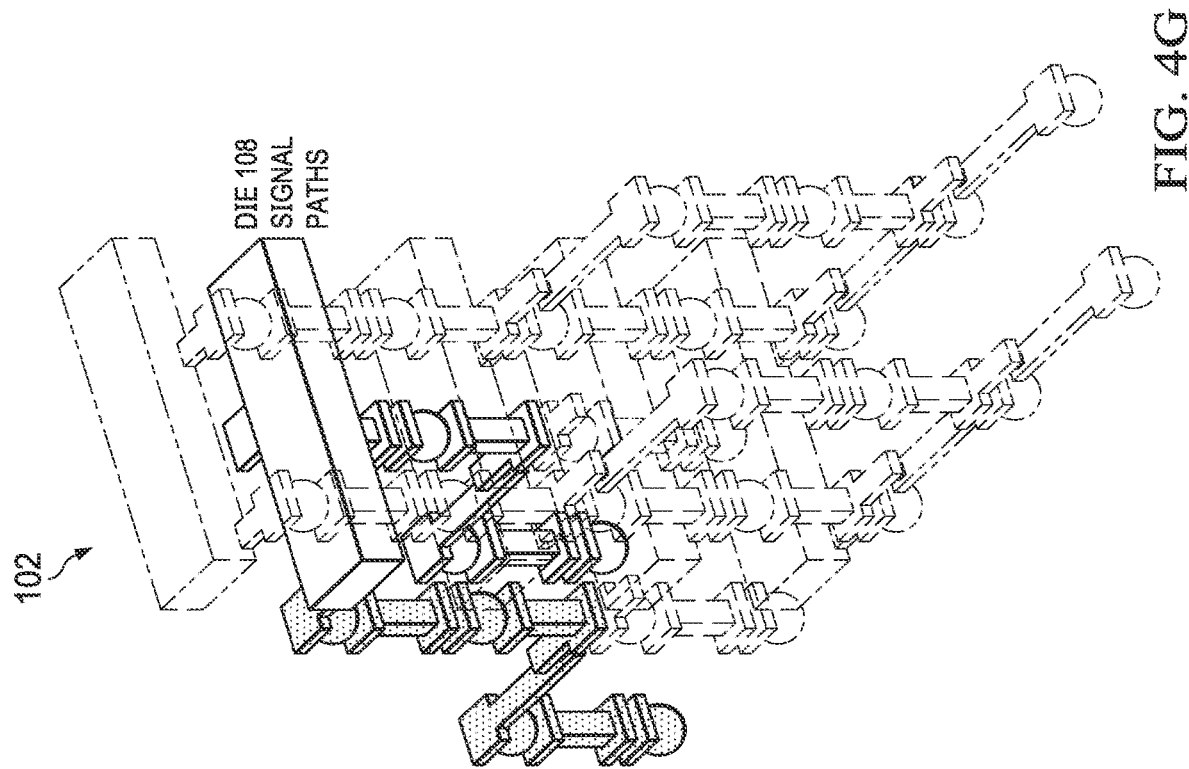
Figure 5A:
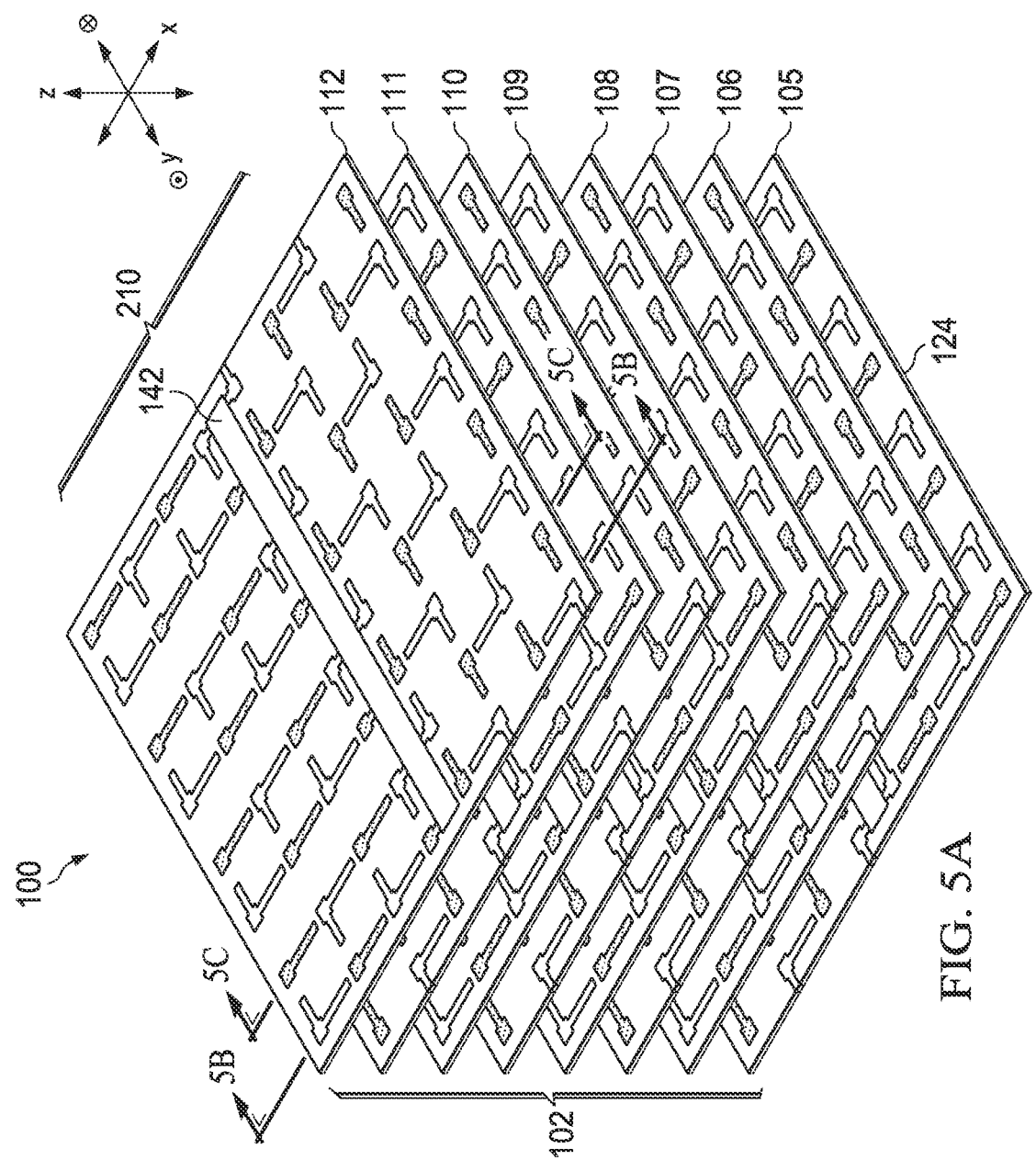
Figure 5B:
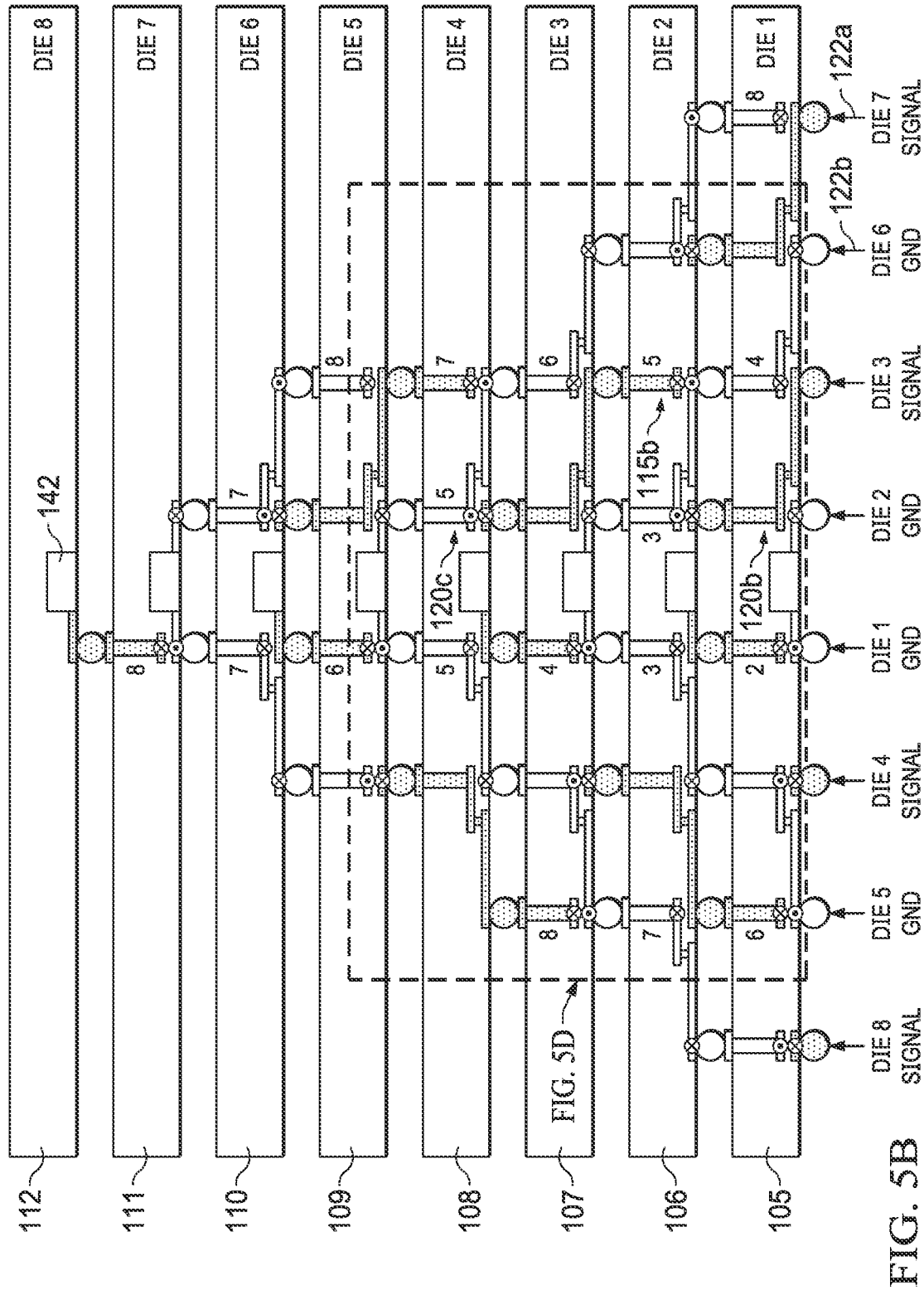
Figure 5C:
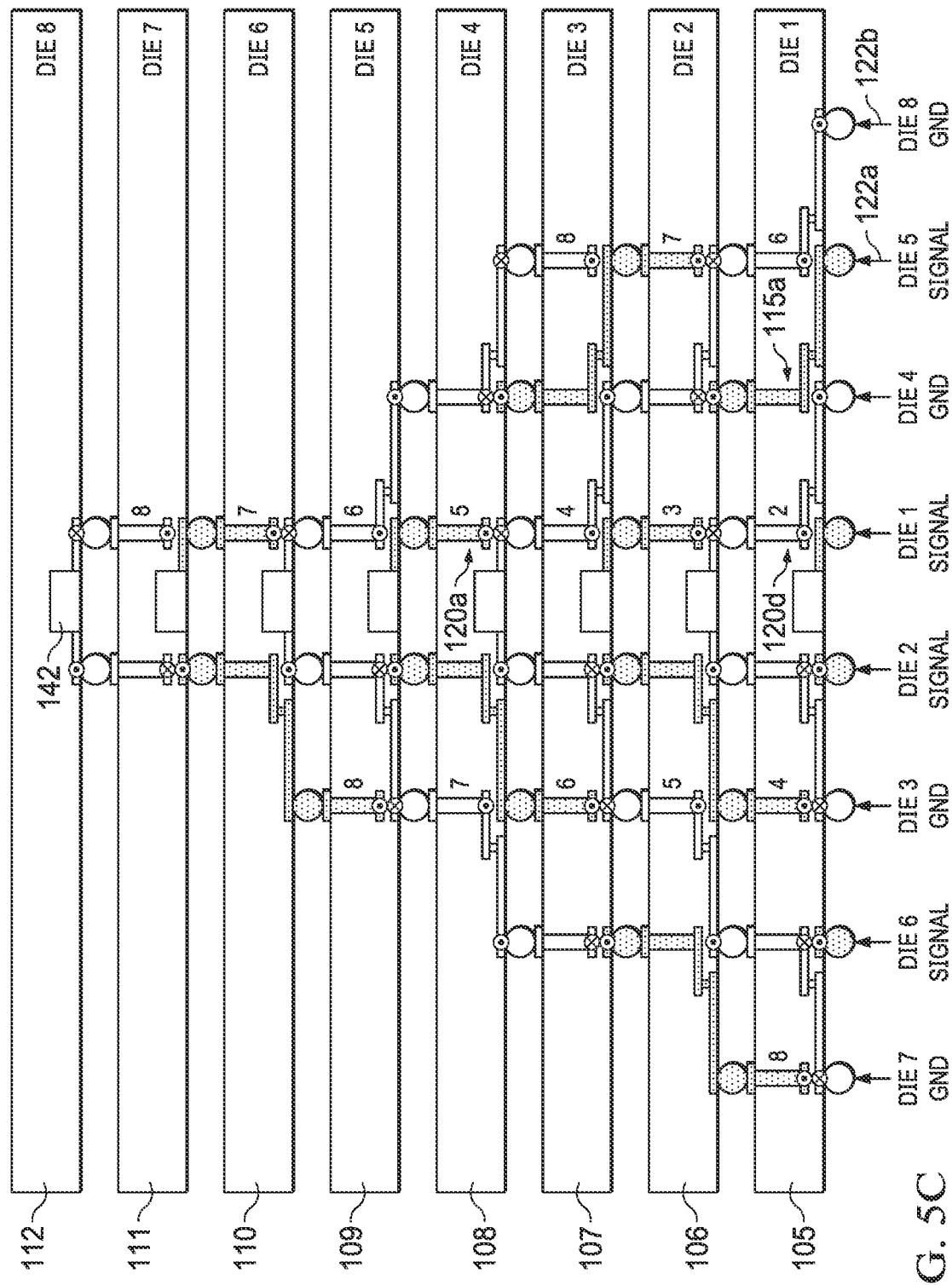
Figure 5D:
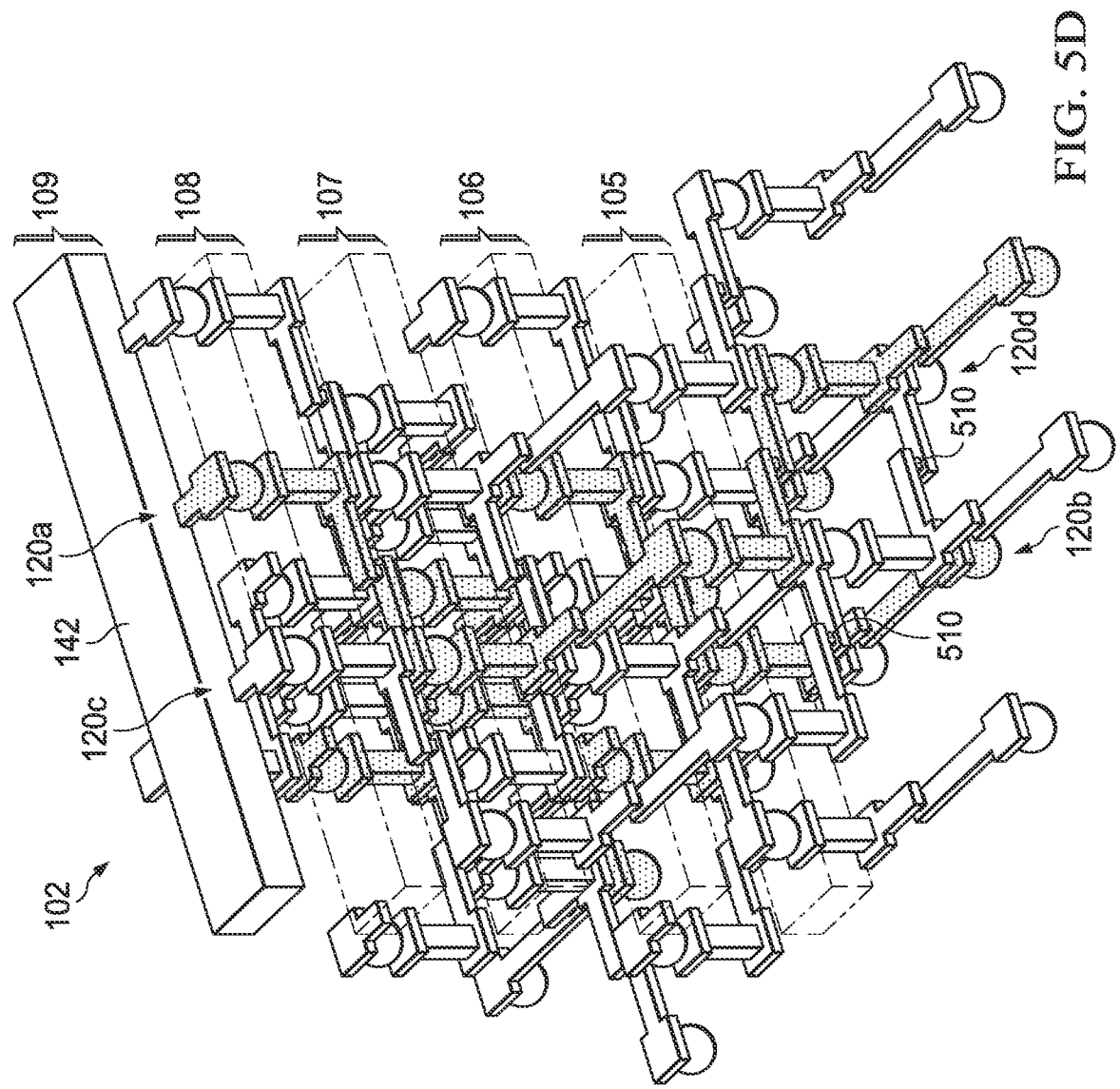
Figure 5E:
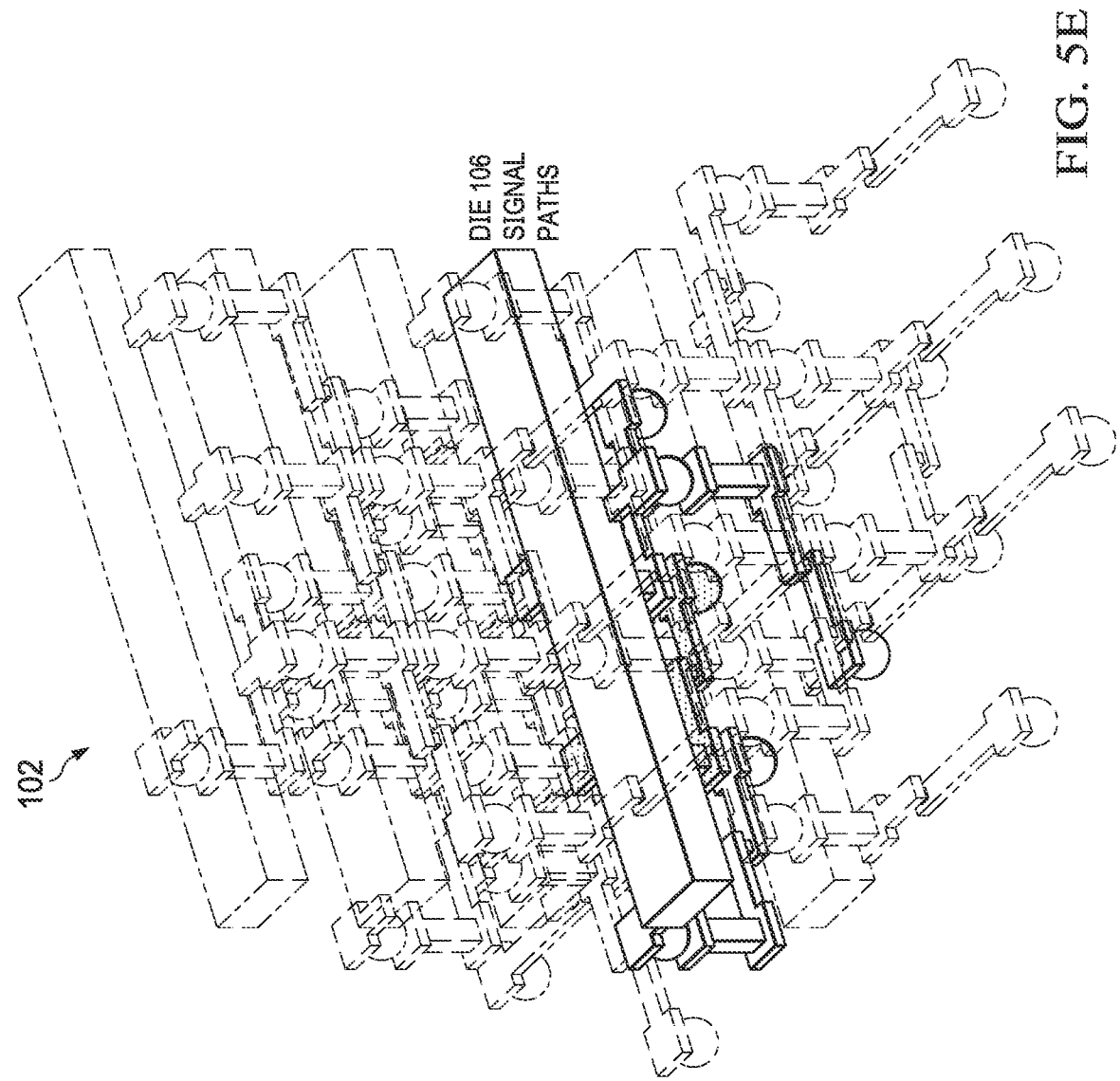
Figure 5F:
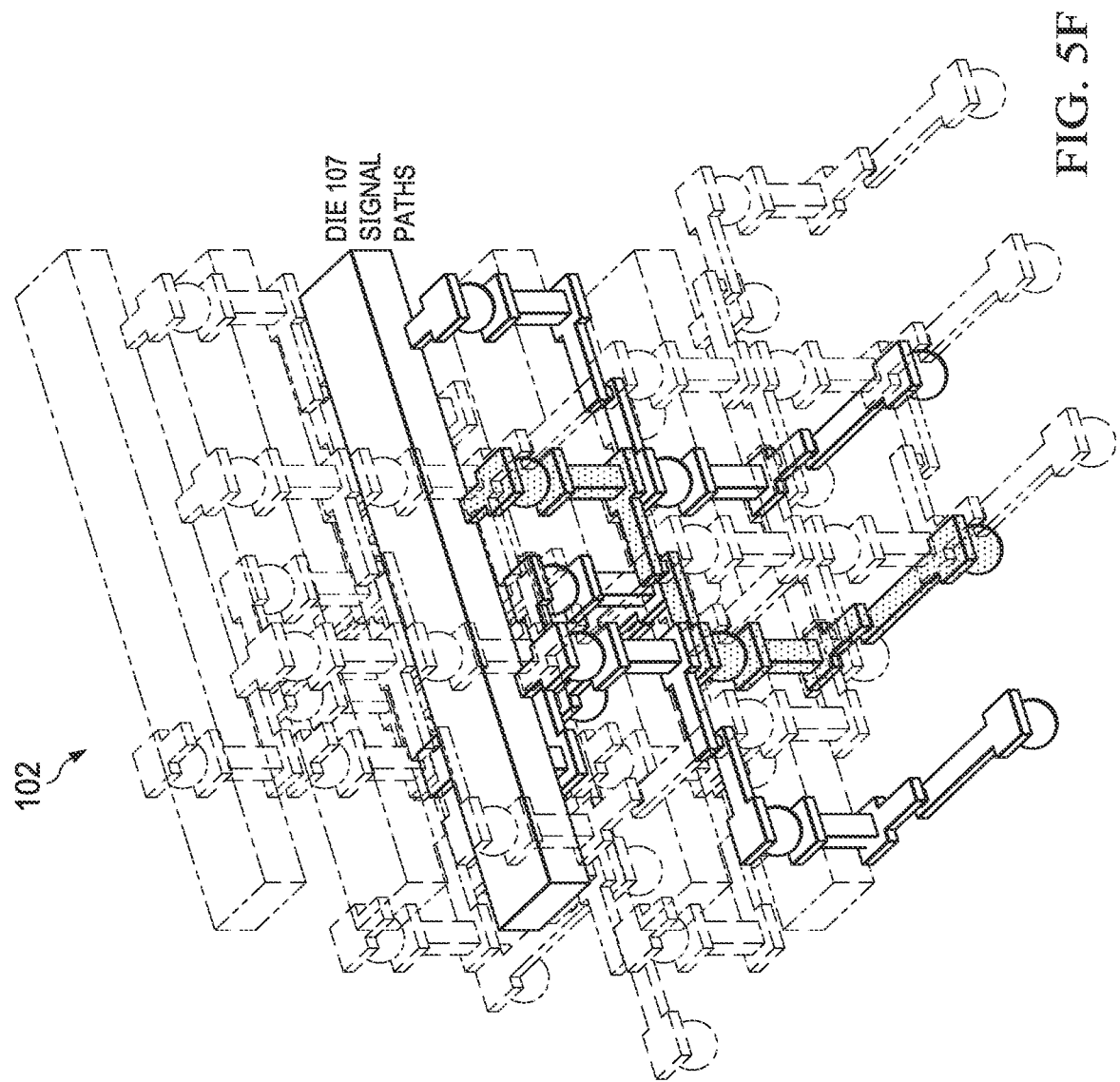
Figure 6A:
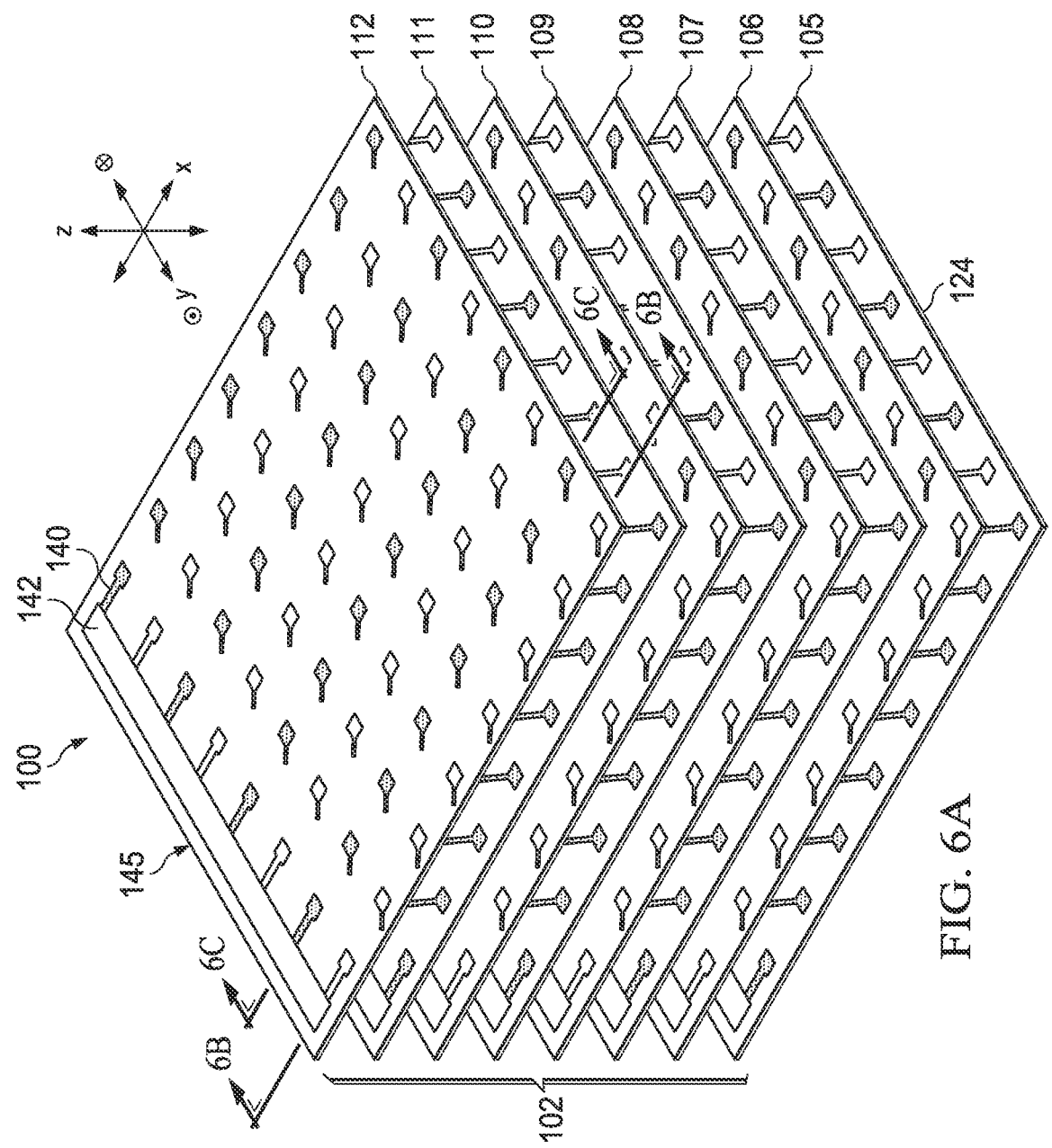
Figure 6B:
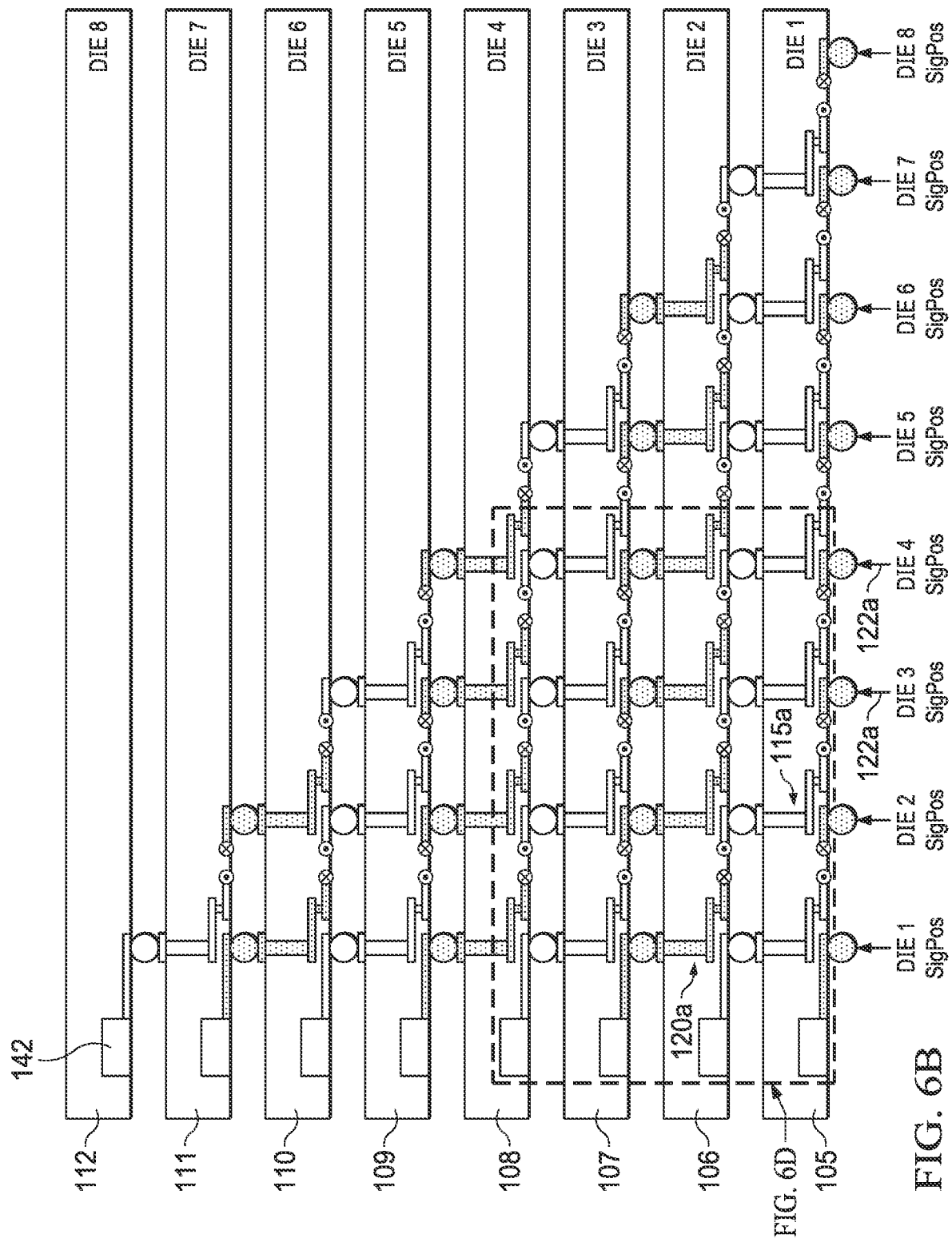
Figure 6C:
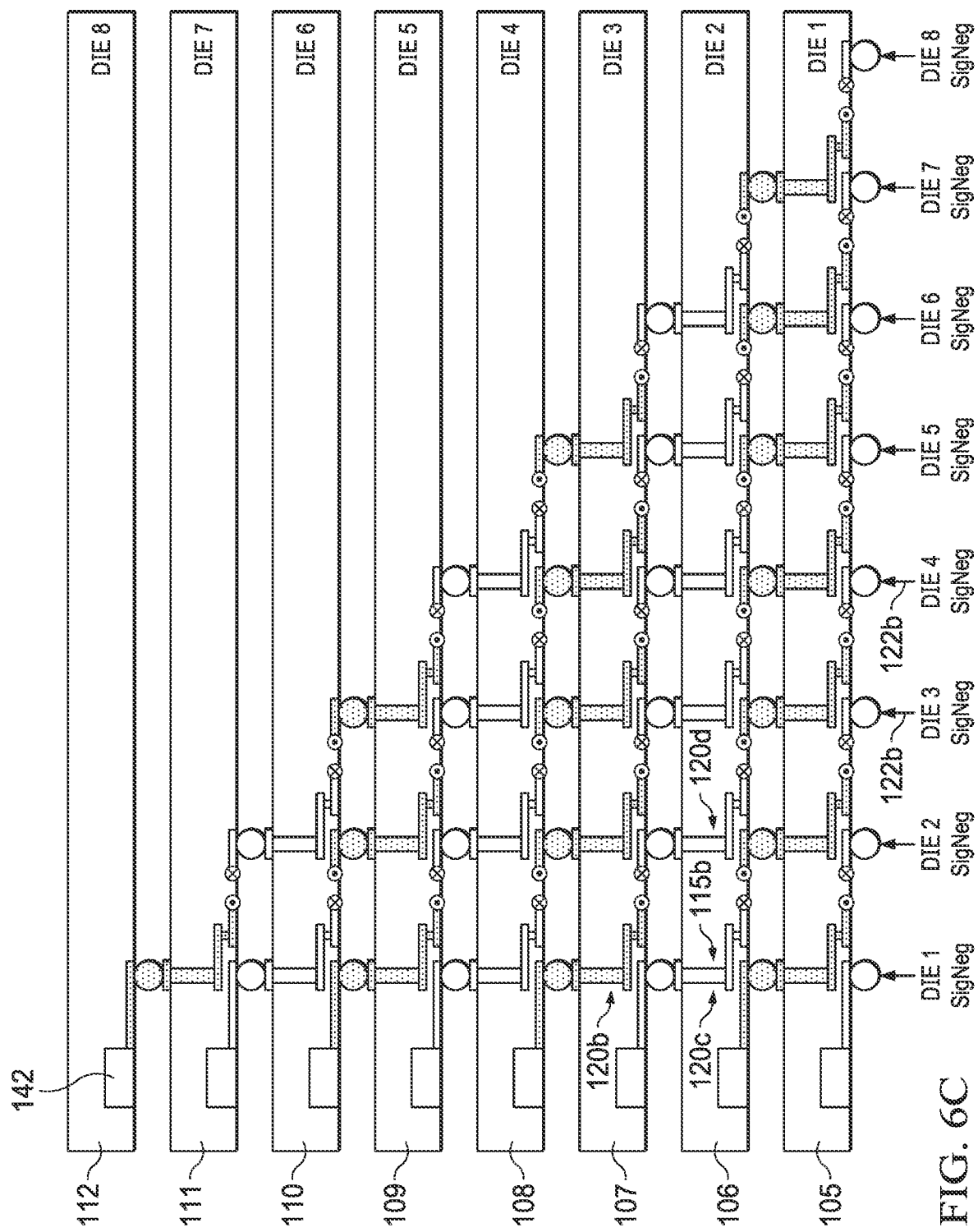
Figure 6D:
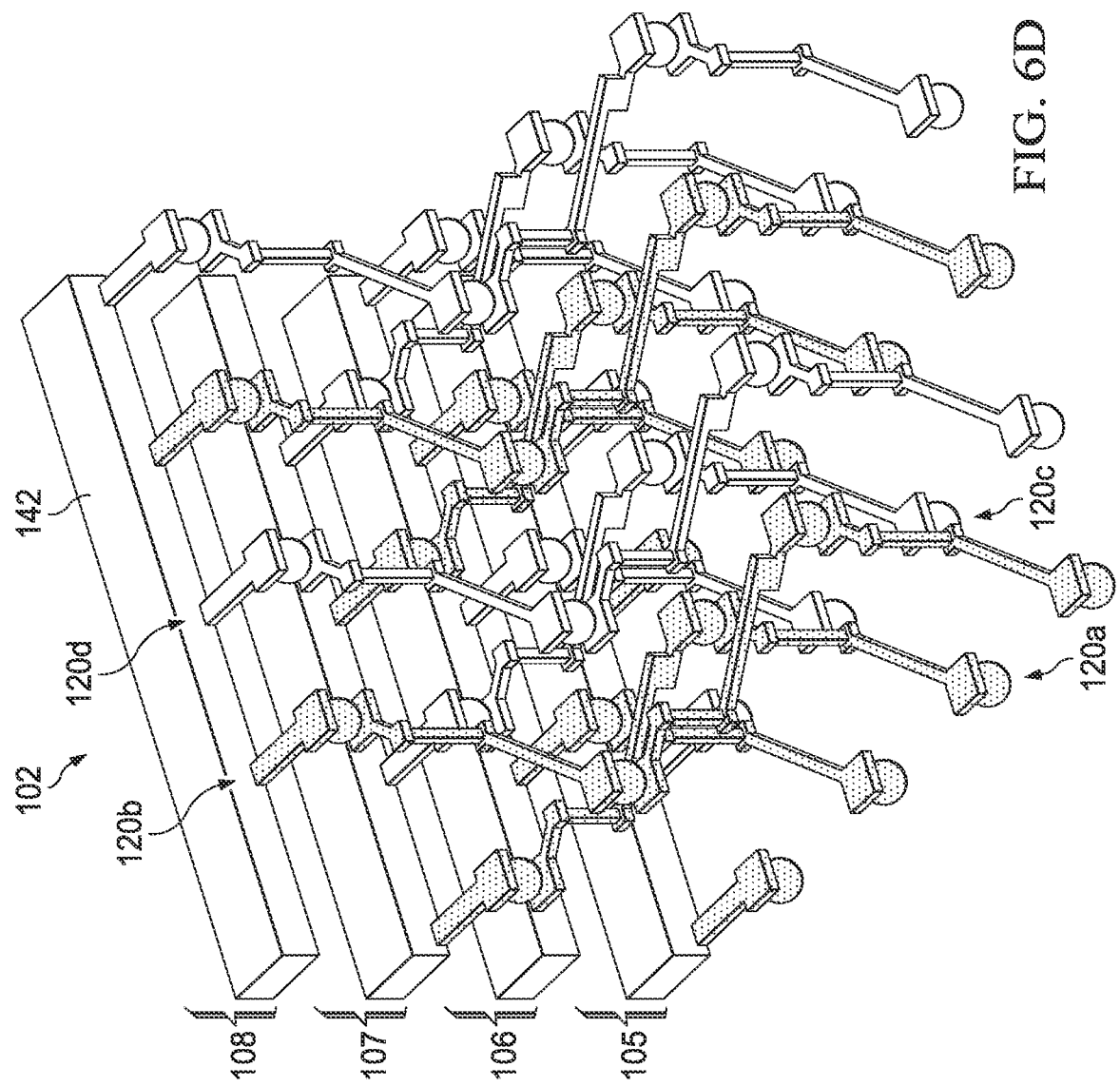
Figure 6F:
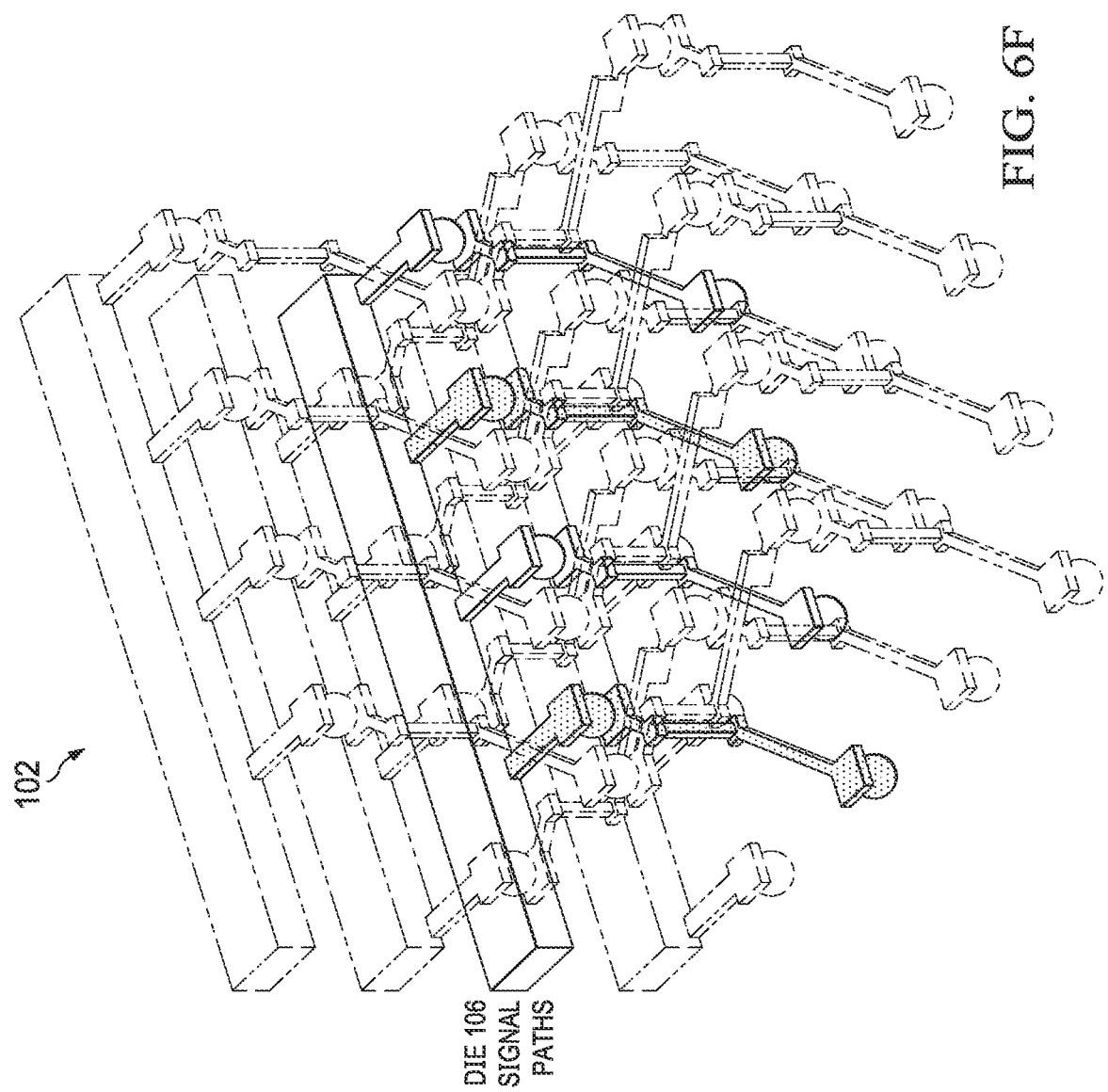
Figure 6G:
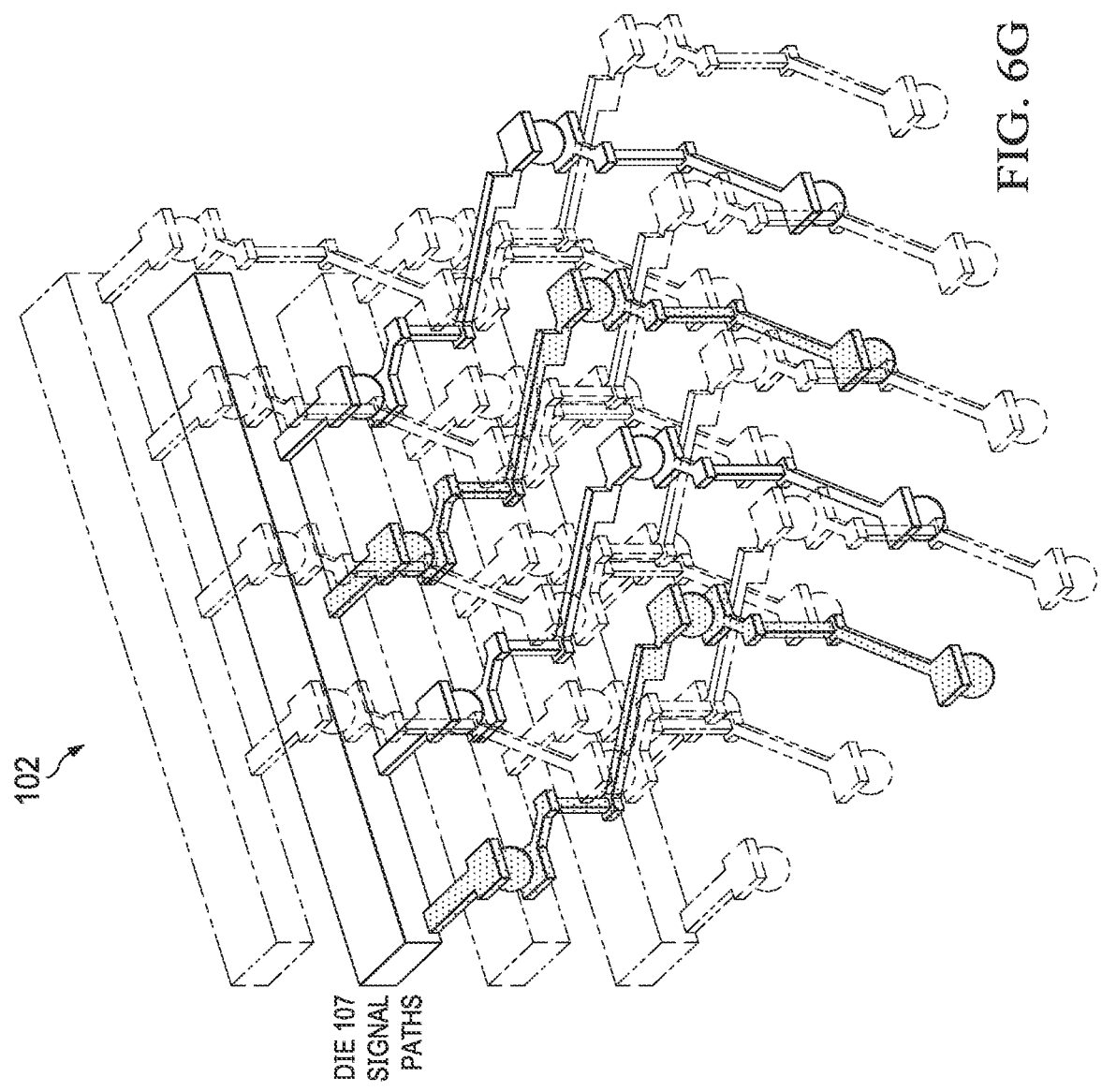
Figure 6H:
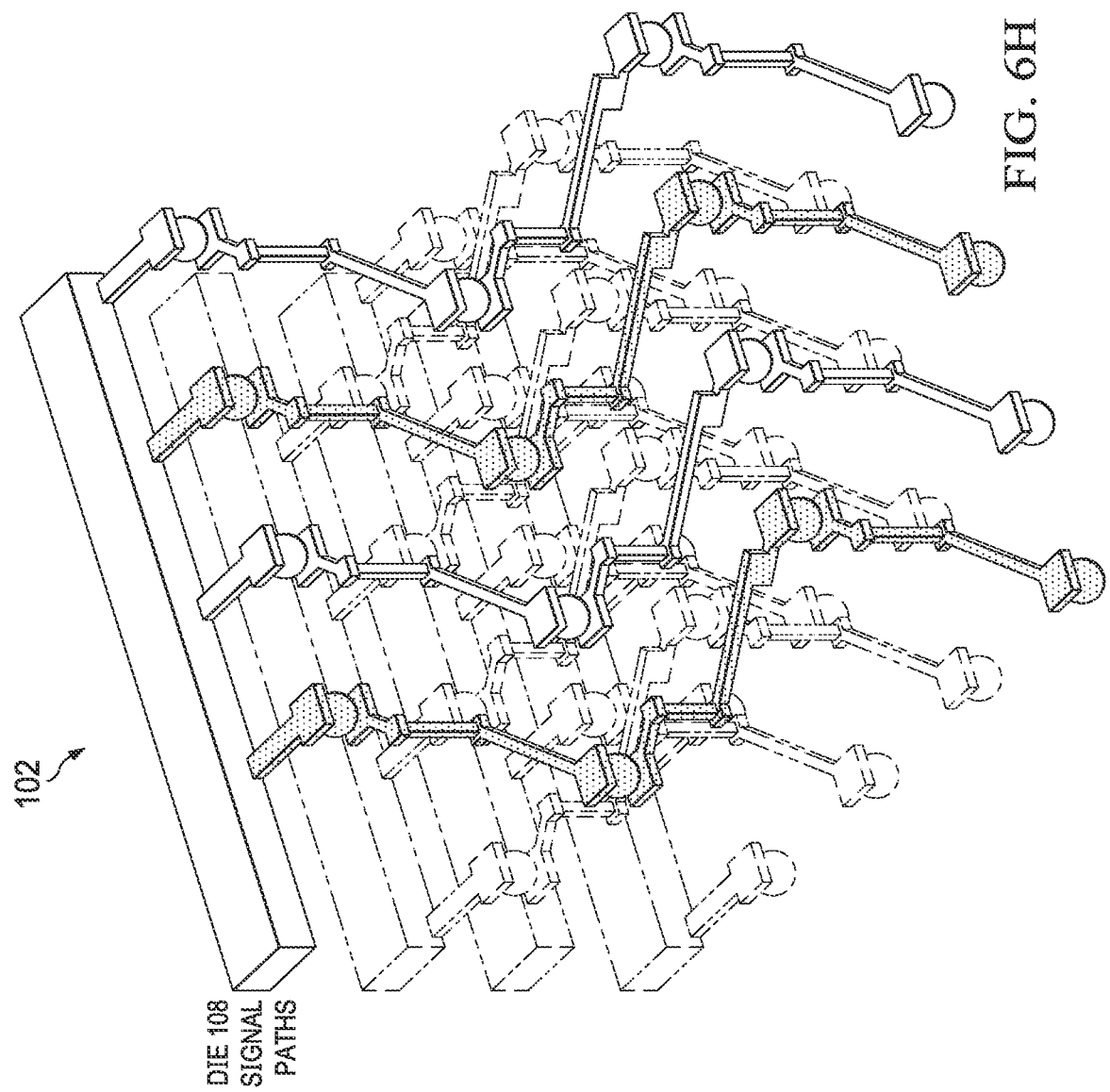
Figure 7A:
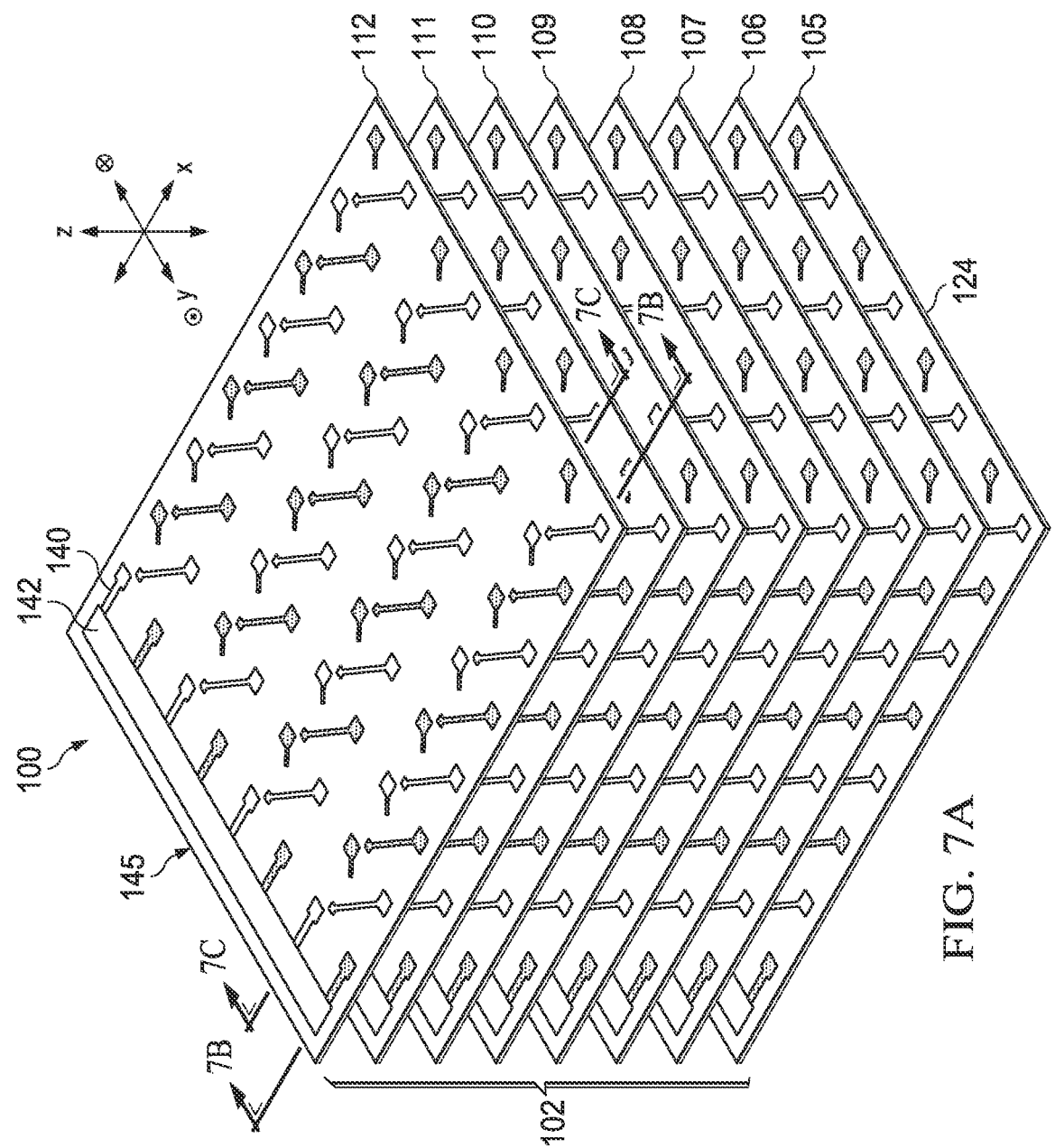
Figure 7B:
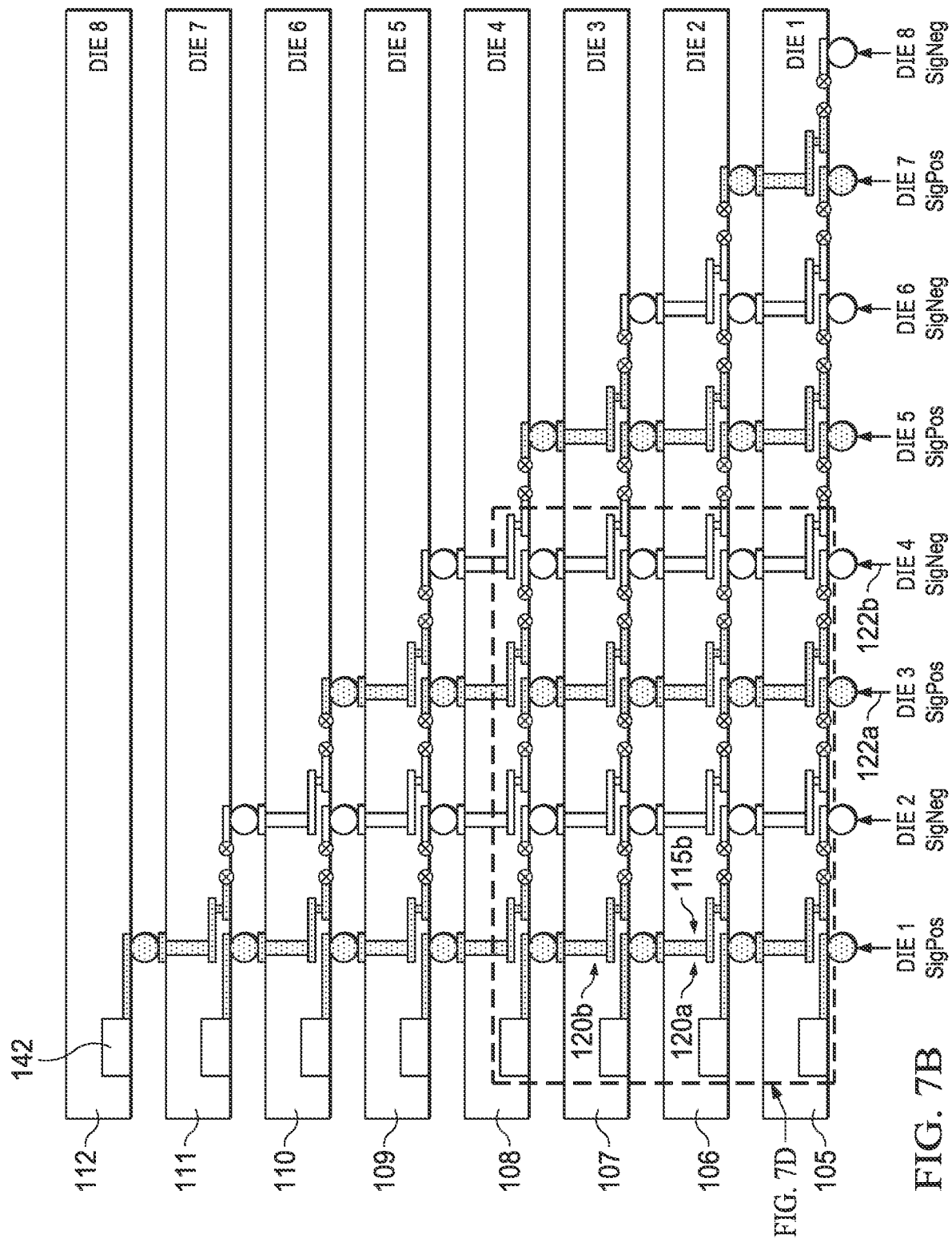
Figure 7C:
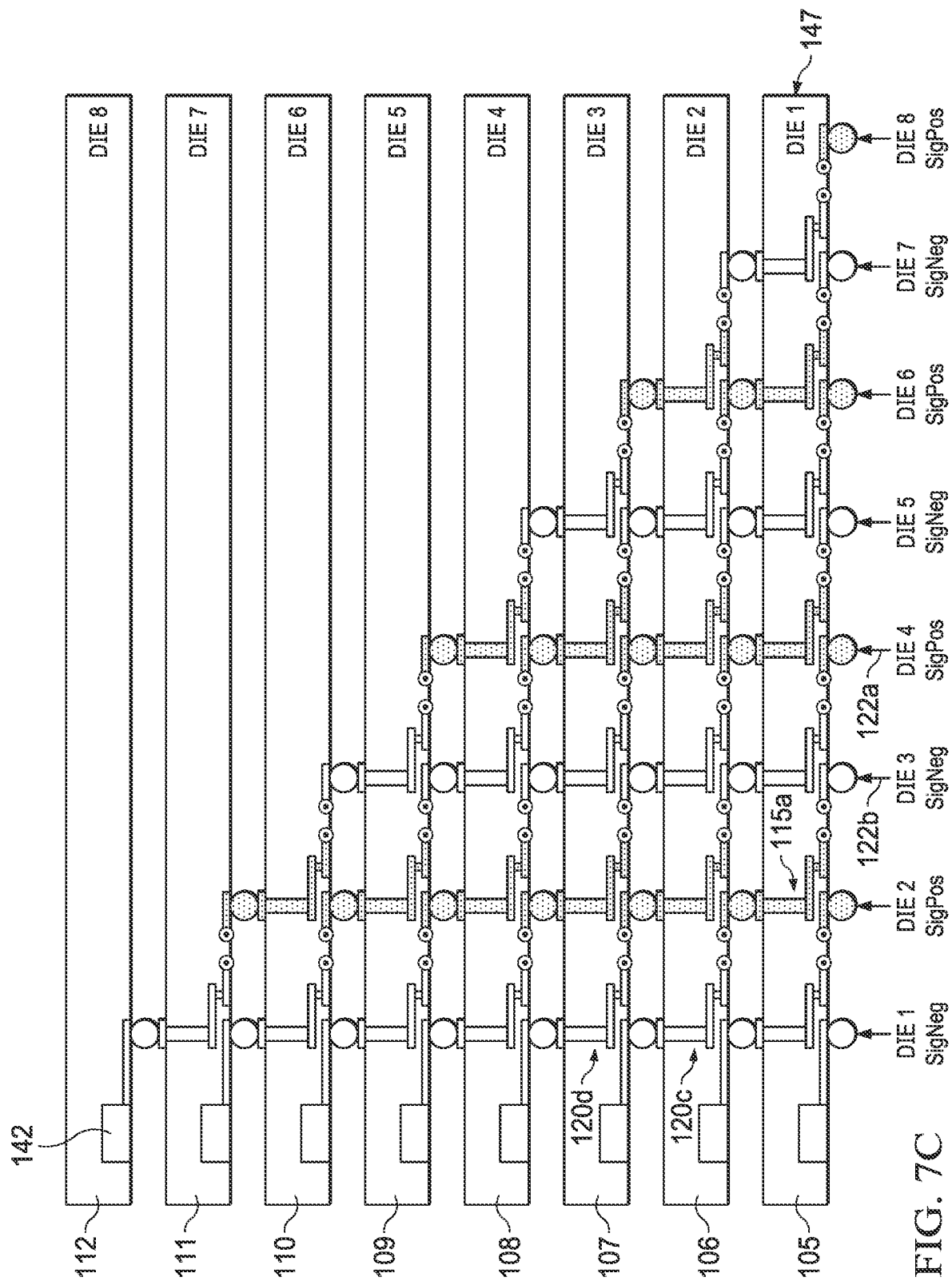
Figure 7D:
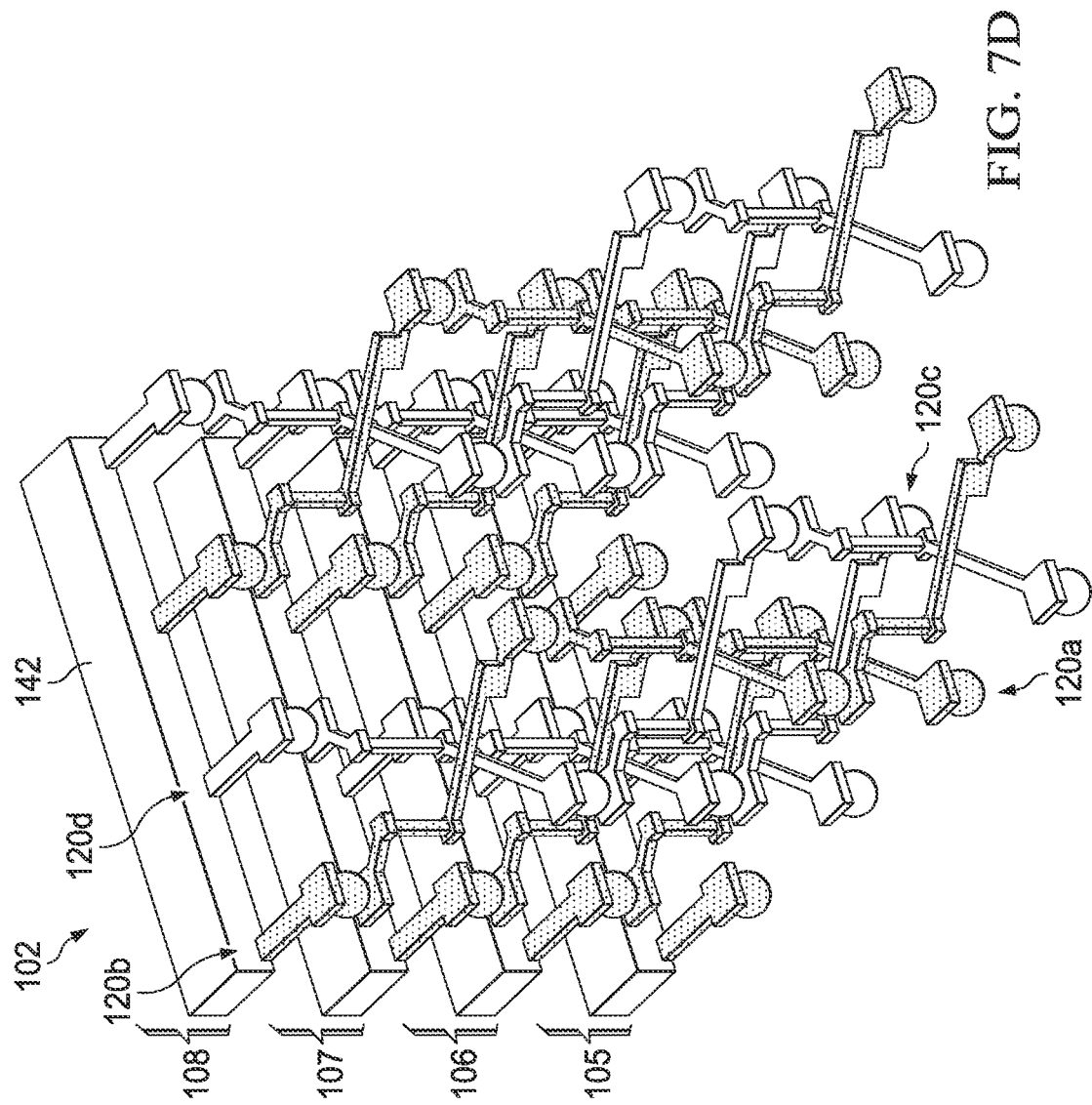
Figure 7E:
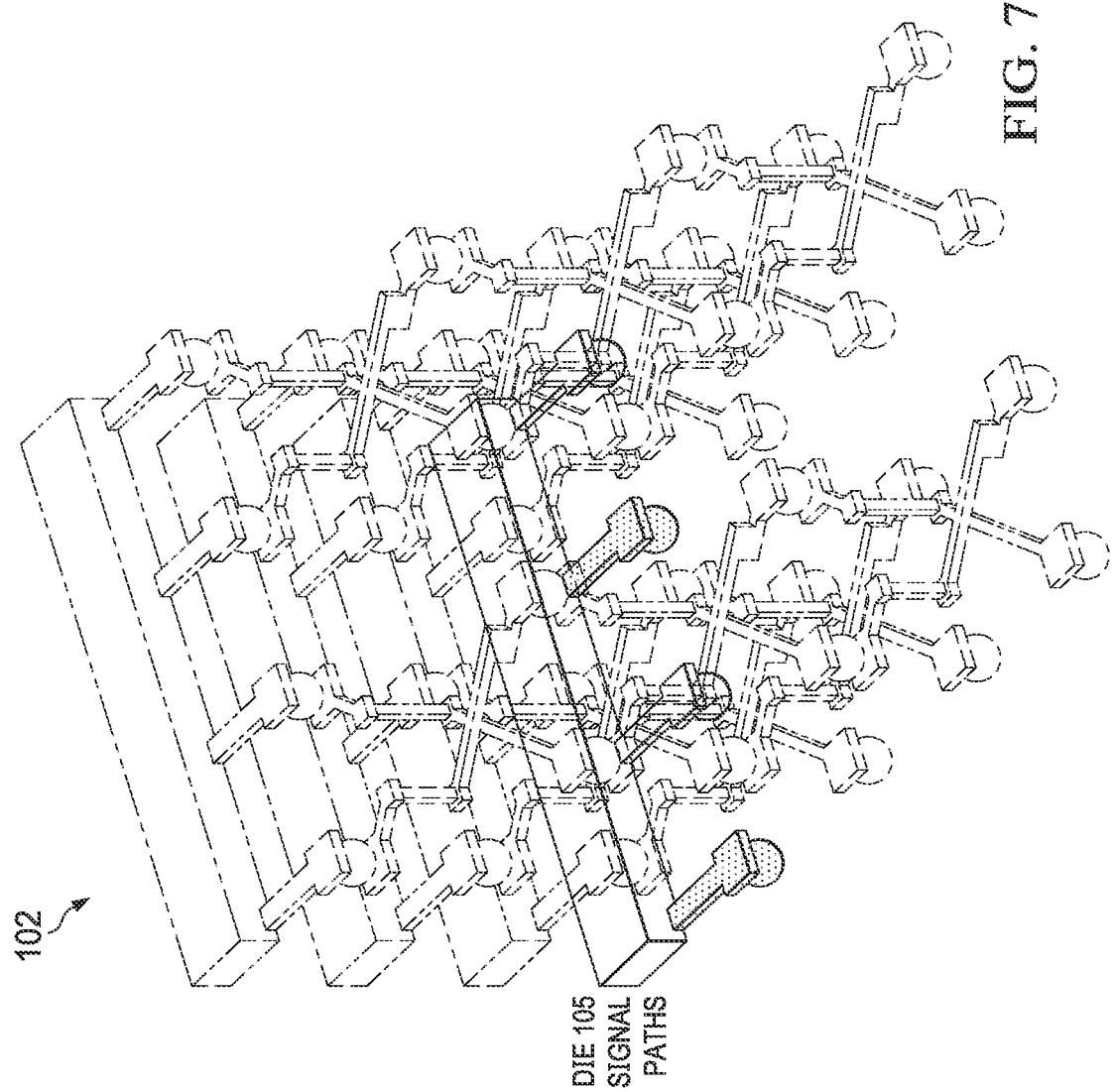
Figure 7F:
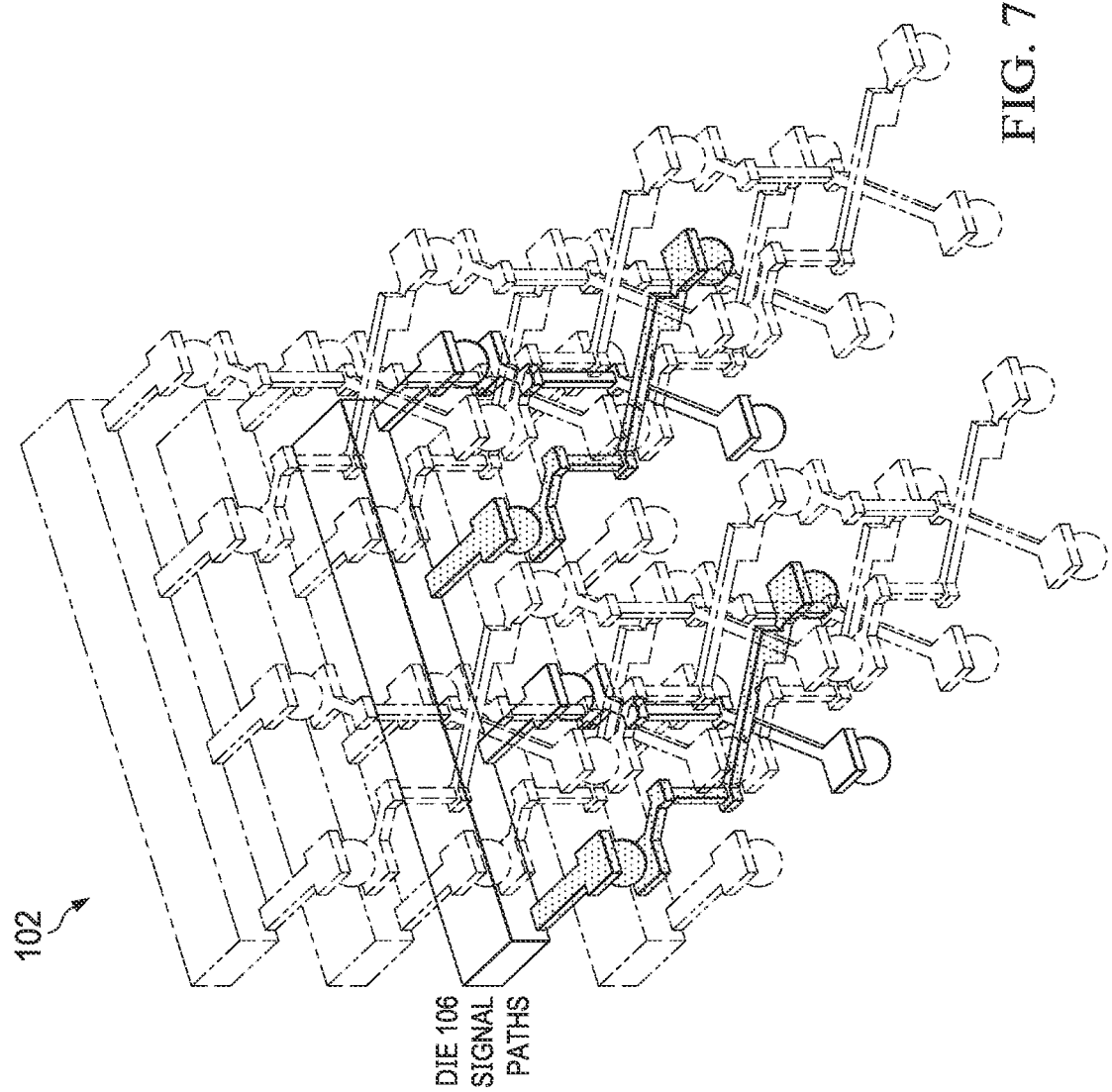
Figure 7G:
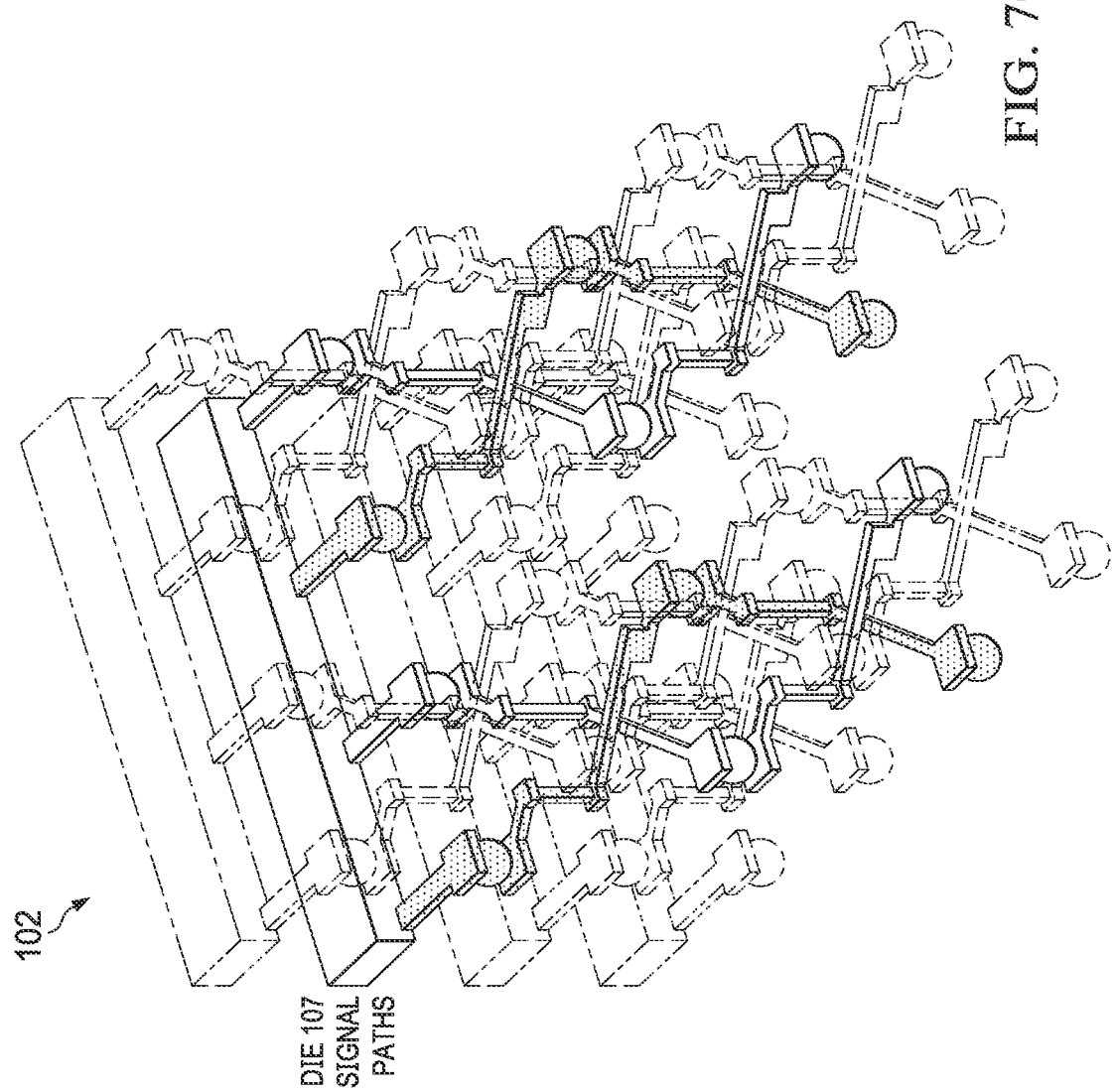
Figure 7H:
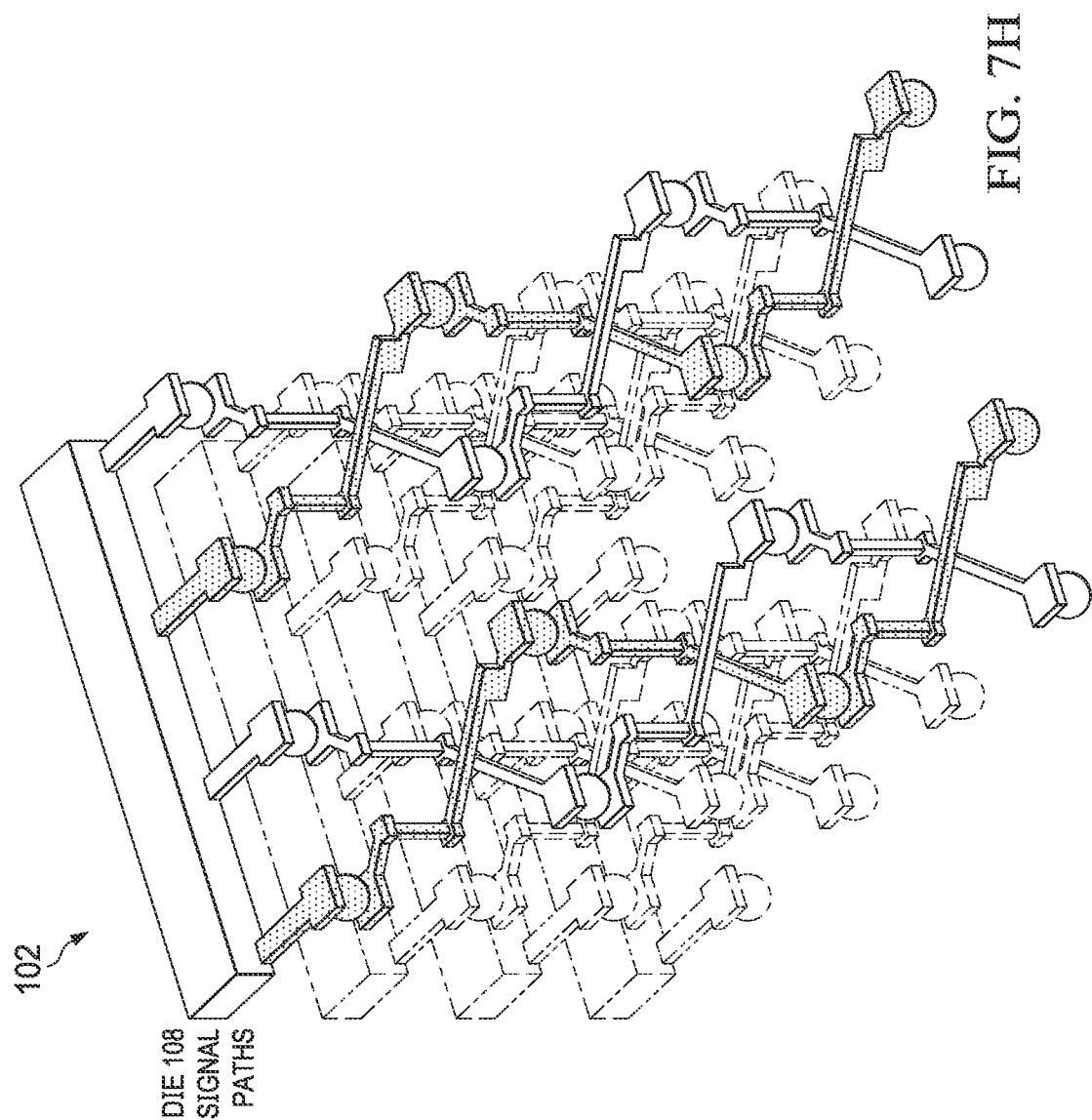
Figure 8A:
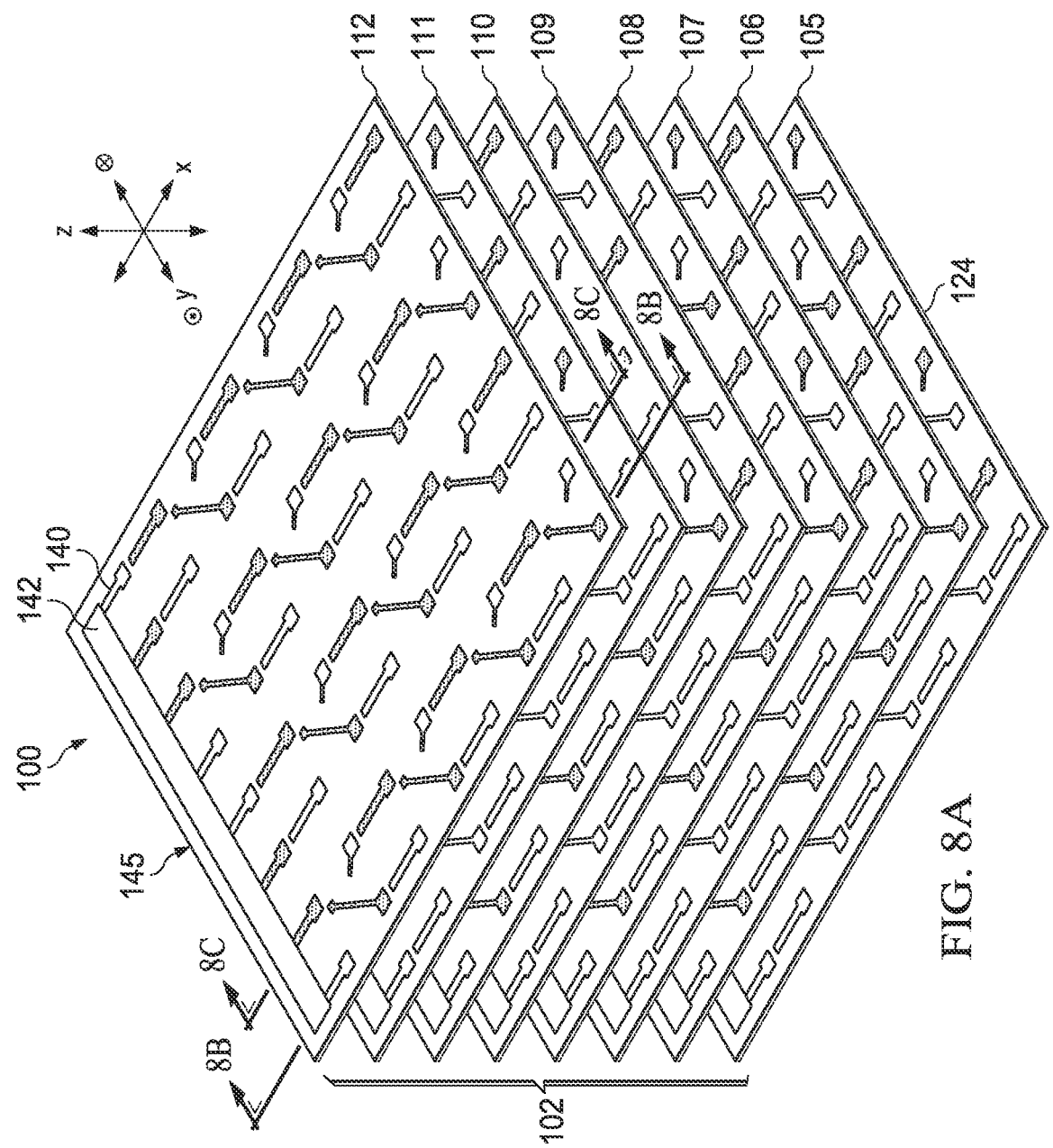
Figure 8B:
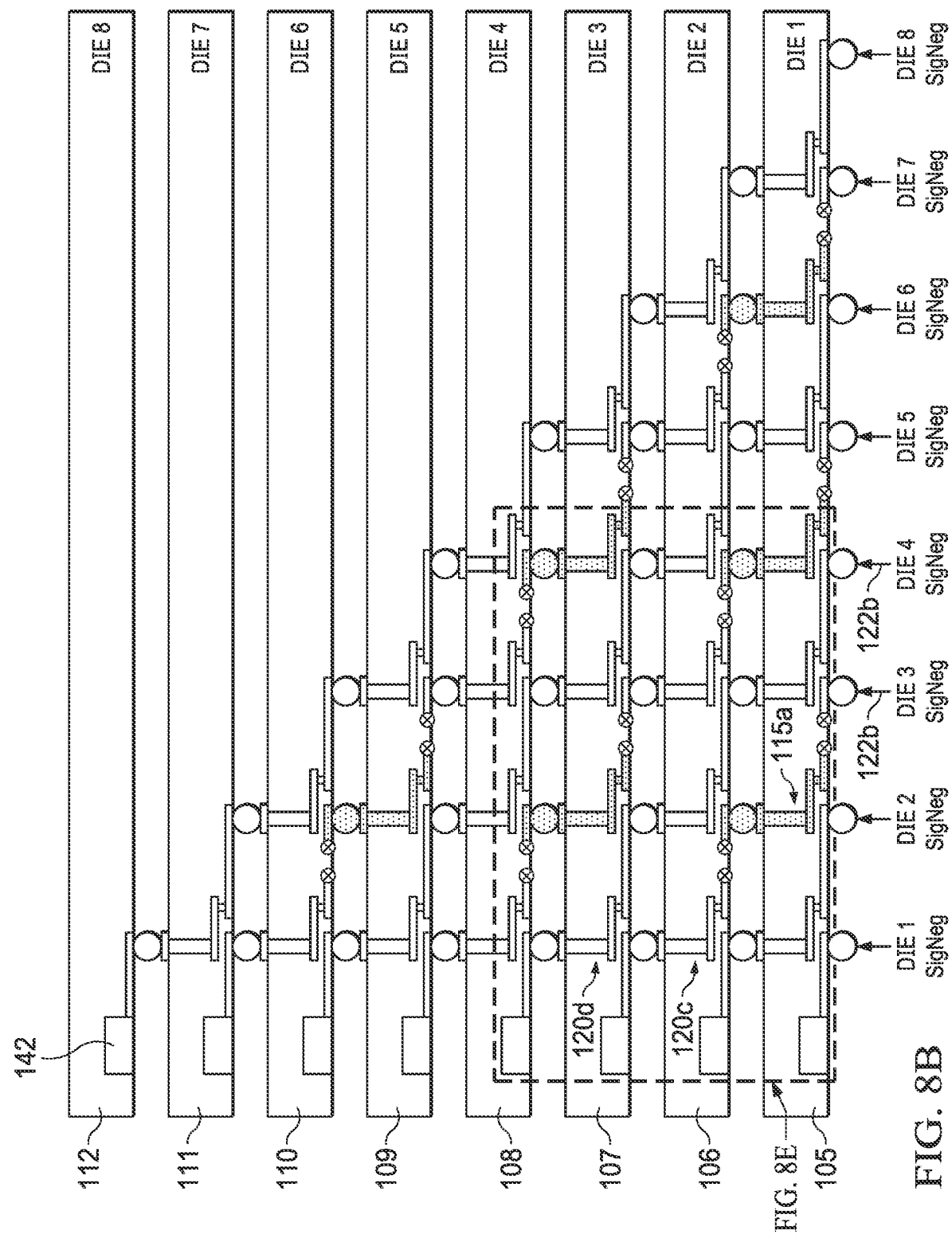
Figure 8C:
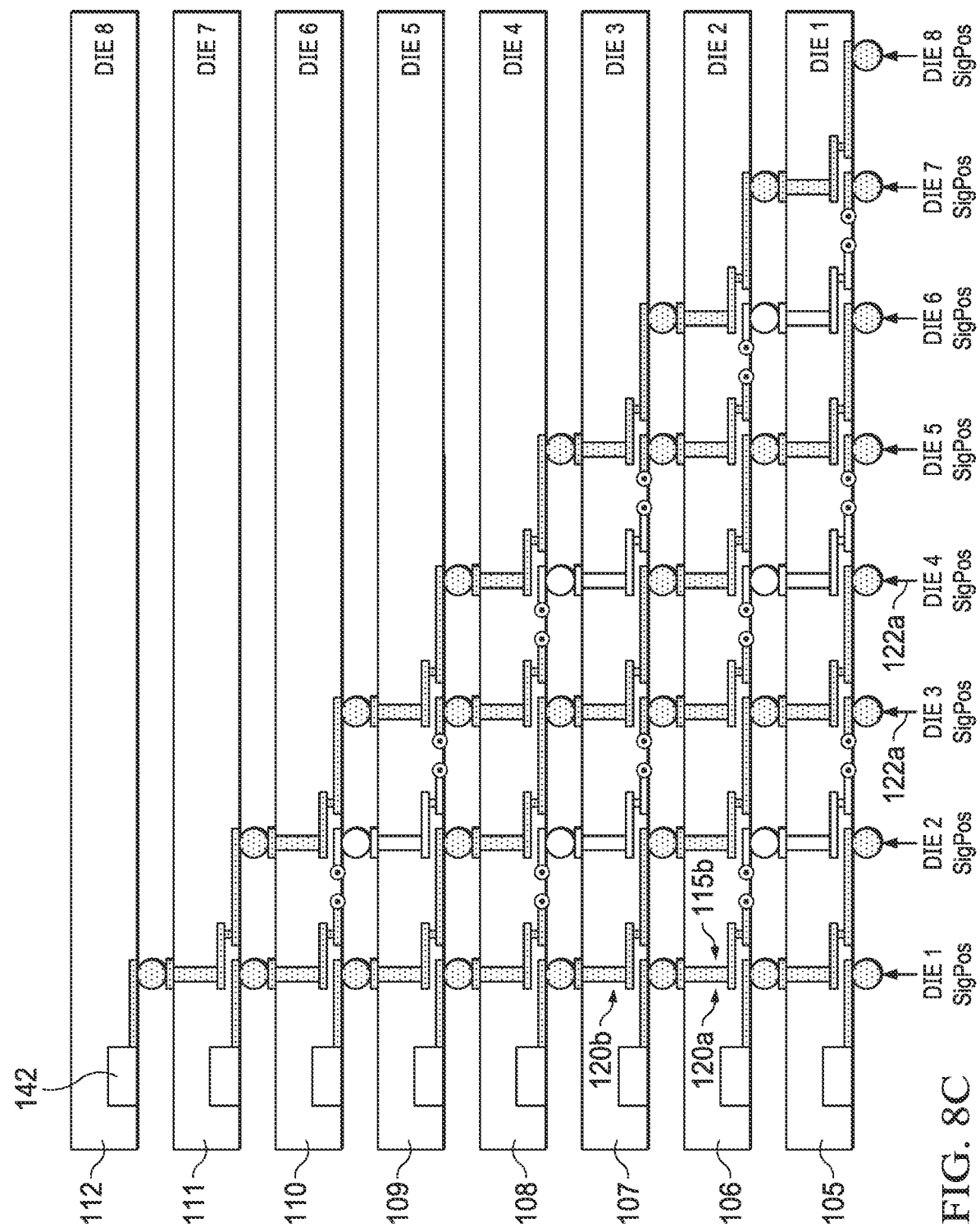
Figure 8D:
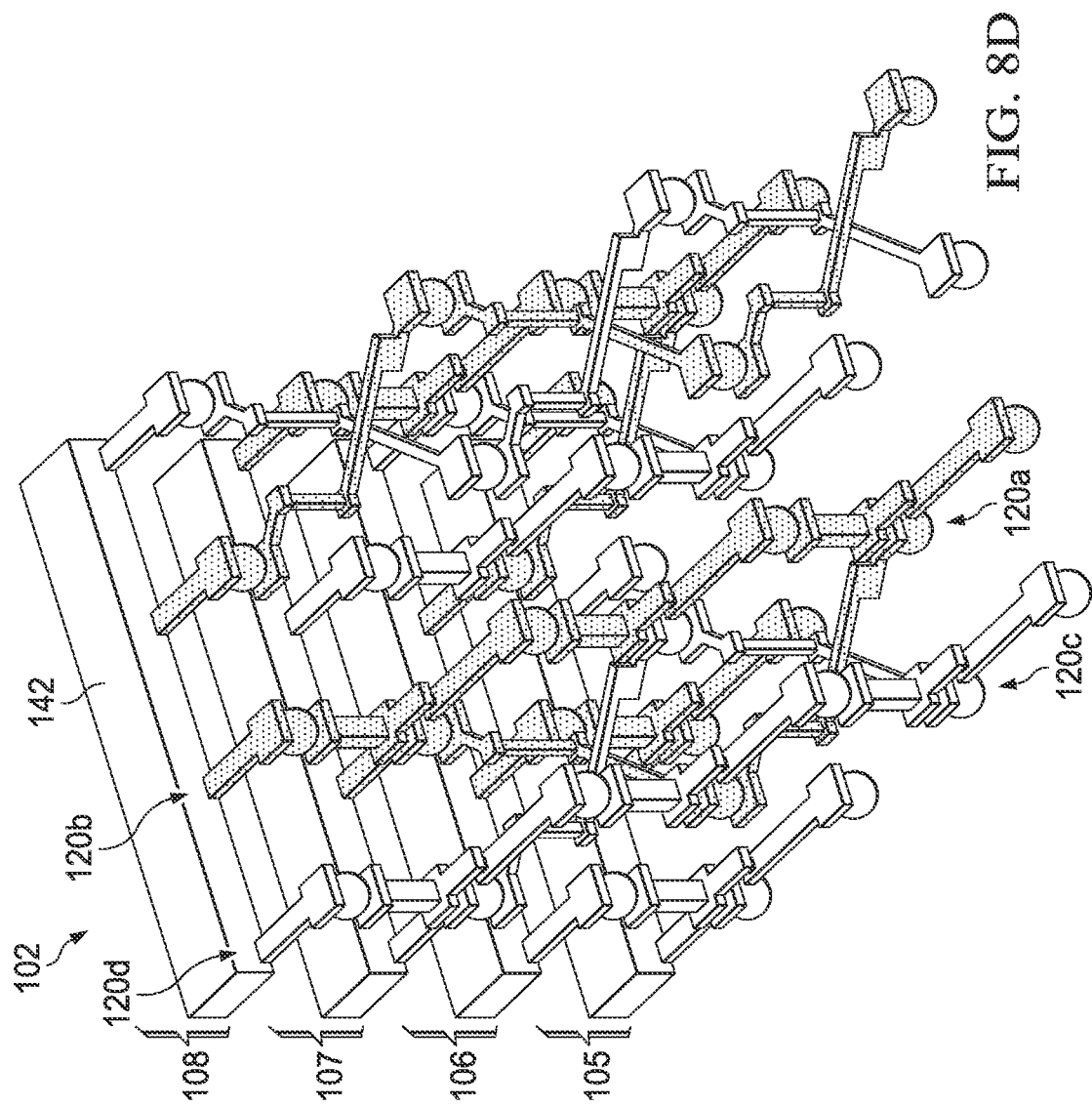
Figure 8G:
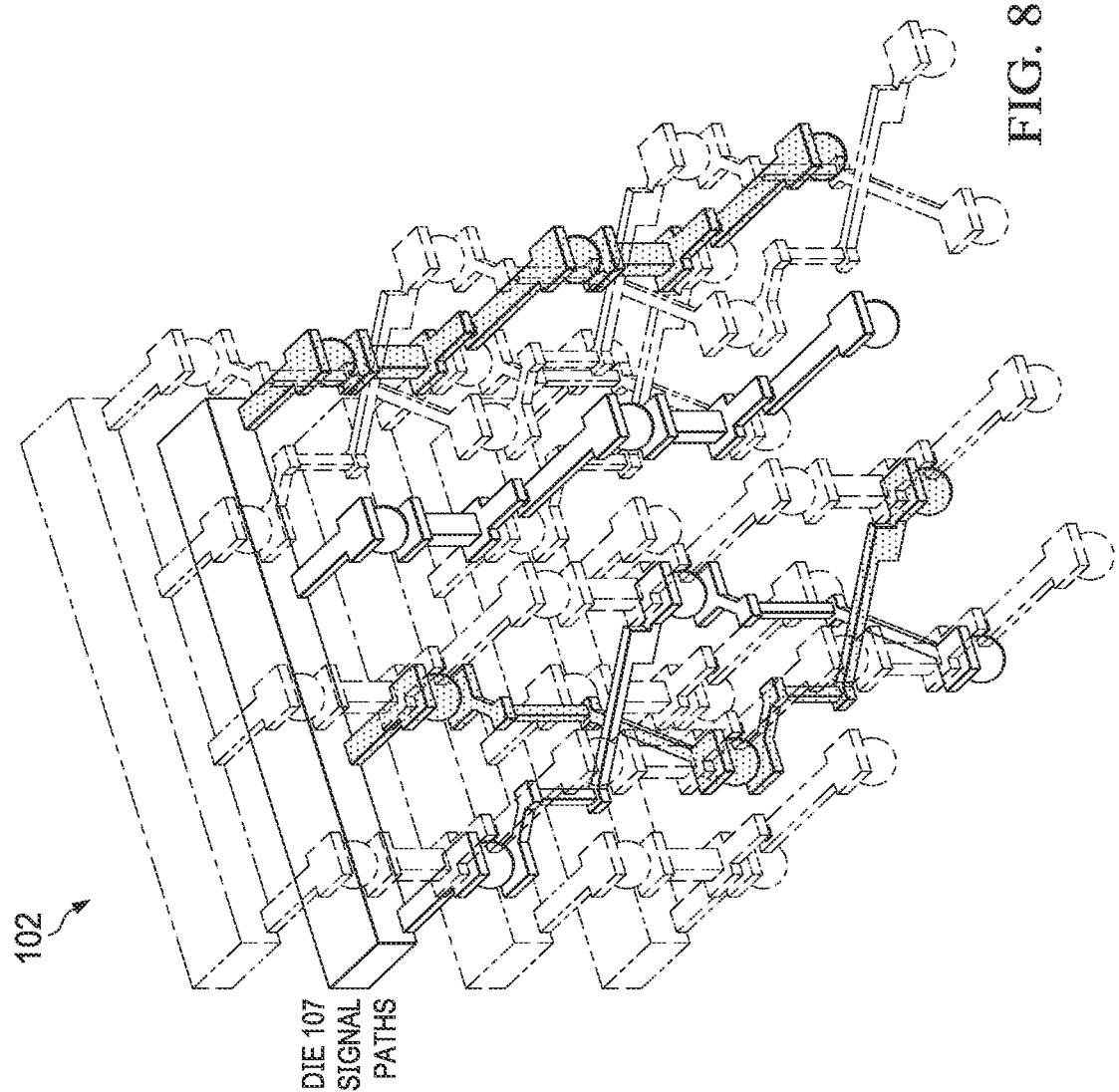
Figure 8H:
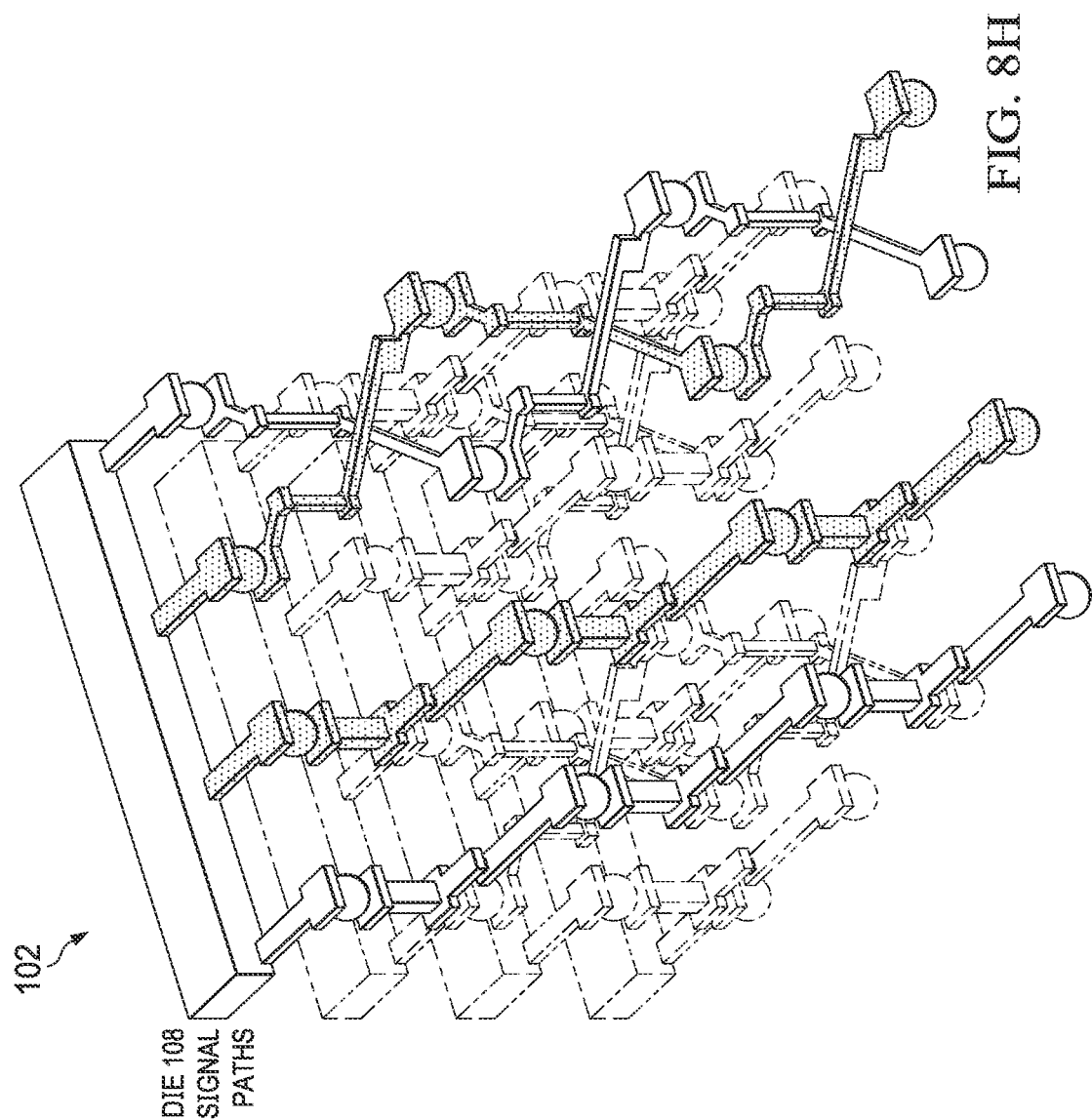
Figure 10:
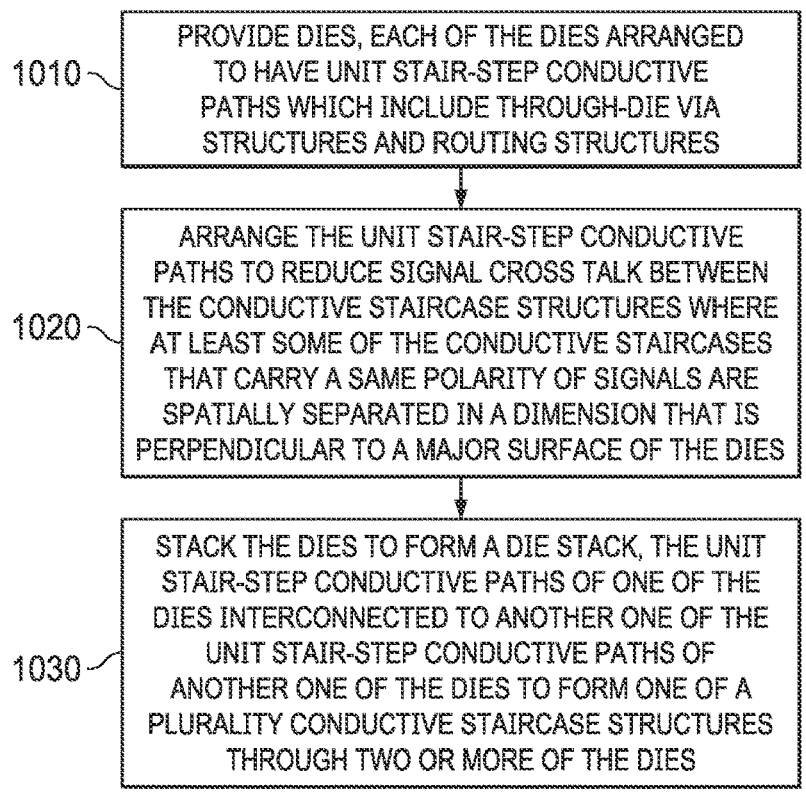
Figure 11:
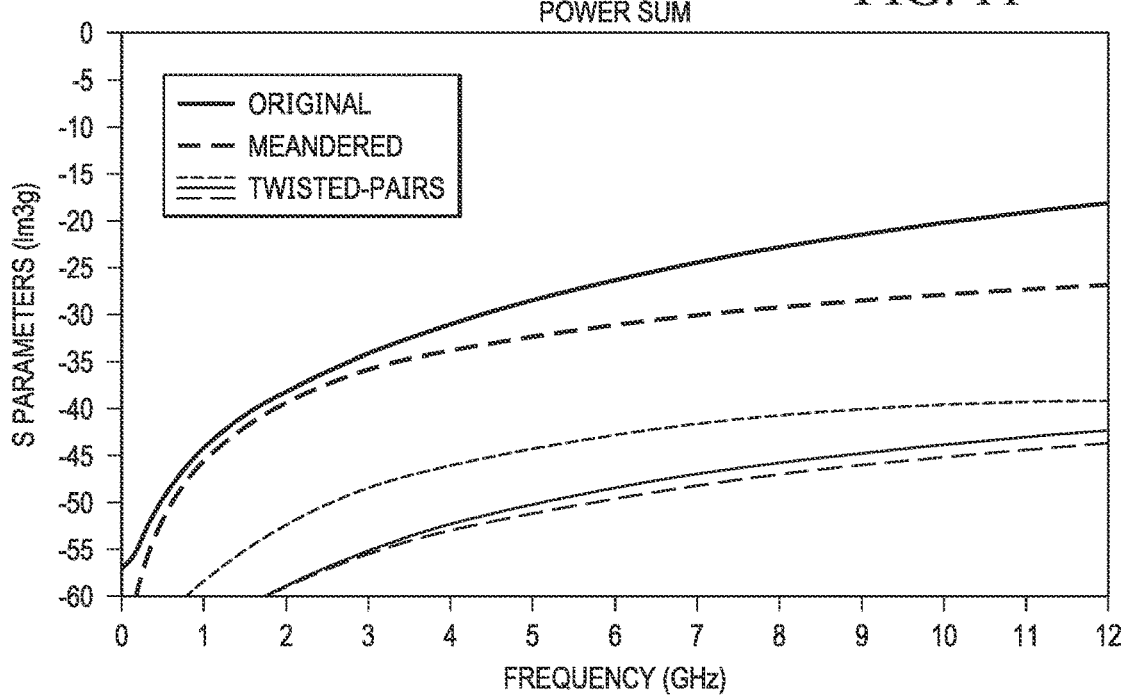

Reference is now made to the following descriptions taken in conjunction with the accompanying drawings, in which:

FIG. 1A presents a 3D perspective view of a stack of dies with a checkerboard TDV staircase connection array in the stack;

FIG. 1B presents a cross-sectional view of TDVs in the stack of dies corresponding to column view section 1B-1B shown in FIG. 1A;

FIG. 1C presents a cross-sectional view of TDVs in the stack of dies corresponding to column view section 1C-1C shown in FIG. 1A;

FIG. 1D presents a detailed cross-sectional view of two TDVs interconnecting two dies in the stack corresponding to view area D shown in FIG. 1B;

FIG. 1E presents a 3D perspective view of a portion of the TDV array in the stack corresponding to the to view area E shown in FIG. 1B;

FIGS. 1F-1I present a 3D perspective views highlighting selected signal paths corresponding to selected dies presented in FIGS. 1A-1C;

FIG. 2A presents a 3D perspective view of a stack of dies with an interleaved TDV staircase connection array in the stack;

FIG. 2B presents a cross-sectional view of TDVs in the stack of dies corresponding to column view section 2B-2B shown in FIG. 2A;

FIG. 2C presents a cross-sectional view of TDV in the stack of dies corresponding to column view section 2C-2C shown in FIG. 2A;

FIG. 2D presents a 3D perspective view of a portion of the TDV array in the stack including view area D shown in FIG. 2B;

FIGS. 2E-2H present 3D perspective views highlighting selected signal paths corresponding to selected dies presented in FIGS. 2A-2C;

FIGS. 3A and 3B present cross-sectional views of TDV arrays in portions of the stack of dies, analogous to the column views shown in FIGS. 1B and 1C, respectively, but with the TDV staircase connection array shifted and offset between adjacent columns of the TDVs;

FIG. 4A presents a 3D perspective view of a stack of dies with a combined checkerboard and interleaved TDV staircase connection array in the stack;

FIG. 4B presents a cross-sectional view of TDVs in the stack of dies corresponding to column view section 4B-4B shown in FIG. 4A;

FIG. 4C presents a cross-sectional view of TDV in the stack of dies corresponding to column view section 4C-4C shown in FIG. 4A;

FIG. 4D presents a 3D perspective view of a portion of the TDV array in the stack including view area D shown in FIG. 4B;

FIGS. 4E-4H present 3D perspective views highlighting selected signal paths corresponding to selected dies presented in FIGS. 4A-4C;

FIG. 5A presents a 3D perspective view of a stack of dies with a combined serpentine and interleaved checkerboard TDV staircase connection array in the stack;

FIG. 5B presents a cross-sectional view of TDVs in the stack of dies corresponding to column view section 5B-5B shown in FIG. 5A;

FIG. 5C presents a cross-sectional view of TDV in the stack of dies corresponding to column view section 5C-5C shown in FIG. 5A;

FIG. 5D presents a 3D perspective view of a portion of the TDV array in the stack including view area D shown in FIG. 5B;

FIGS. 5E-5H present 3D perspective views highlighting selected signal paths corresponding to selected dies presented in FIGS. 5A-5C;

FIG. 6A presents a 3D perspective view of a stack of dies with a meandered TDV staircase connection array in the stack;

FIG. 6B presents a cross-sectional view of TDVs in the stack of dies corresponding to column view section 6B-6B shown in FIG. 6A;

FIG. 6C presents a cross-sectional view of TDV in the stack of dies corresponding to column view section 6C-6C shown in FIG. 6A;

FIG. 6D presents a 3D perspective view of a portion of the TDV array in the stack including view area D shown in FIG. 6B;

FIGS. 6E-6H present 3D perspective views highlighting selected signal paths corresponding to selected dies presented in FIGS. 6A-6C;

FIG. 7A presents a 3D perspective view of a stack of dies with a twisted pair TDV staircase connection array in the stack;

FIG. 7B presents a cross-sectional view of TDVs in the stack of dies corresponding to column view section 7B-7B shown in FIG. 7A;

FIG. 7C presents a cross-sectional view of TDV in the stack of dies corresponding to column view section 7C-7C shown in FIG. 7A;

FIG. 7D presents a 3D perspective view of a portion of the TDV array in the stack including view area D shown in FIG. 7B;

FIGS. 7E-7H present 3D perspective views highlighting selected signal paths corresponding to selected dies presented in FIGS. 7A-7C;

FIG. 8A presents a 3D perspective view of a stack of dies with a combined twisted pair and straight route TDV staircase connection array in the stack;

FIG. 8B presents a cross-sectional view of TDVs in the stack of dies corresponding to column view section 8B-8B shown in FIG. 8A;

FIG. 8C presents a cross-sectional view of TDV in the stack of dies corresponding to column view section 8C-8C shown in FIG. 8A;

FIG. 8D presents a 3D perspective view of a portion of the TDV array in the stack including view area D shown in FIG. 8B;

FIGS. 8E-8H present 3D perspective views highlighting selected signal paths corresponding to selected dies presented in FIGS. 8A-8C;

FIG. 9 presents a cross-sectional view of an example IC package of the disclosure including any embodiments of the stack of dies disclosed in the context of FIGS. 1A-8H;

FIG. 10 presents a flow diagram of example embodiments of a method of manufacturing an IC package according to the principles of the disclosure, including any of the stack embodiments such as disclosed in the context of FIGS. 1A-8H; and FIG. 11 example simulation results of far-end crosstalk simulations of meandered and twisted pair TDV staircase connection array arrangements as compared to a connection array arrangement with non-interleaved and straight routing structures.

DETAILED DESCRIPTION

We have developed patterns of unit stair step structure interconnections to form TDV staircase connection arrays that reduce insertion loss and crosstalk within die stacks to thereby improve signal integrity and facilitate the use of high signal rates in integrated circuit packages such as HBM. Our TDV staircase connection array arrangements help reduce insertion loss and crosstalk by providing shielding in three spatial dimensions, and in particular, by enhancing the vertical shielding between TDV staircases formed through different dies in the stack. As further disclosed herein, some such TDV staircase arrangements reduce insertion loss and crosstalk by: centering input-output connections within the TDV staircase connection arrays, by shifting and offsetting, serpentining, meandering or twisting pairs of TDV staircase structure in the array and/or by providing cross-talk cancellation and shielding as further disclosed herein.

These embodiments are in contrast to certain previous efforts to reduce cross-talk by simply having adjacent columns of parallel and straight unit staircase structures carry signals of different polarity through the stack to provide some shielding against signal cross-talk between adjacent staircase structures within a die. However, because staircases carrying the same signal polarity are stacked directly on top of each other, significant crosstalk occurs between the signals going through adjacent dies as these signals are routed in parallel through the stack of dies. Moreover the link operation of each layer can be independent of each other. Consider, for instance, a victim line connected in the WRITE direction (e.g., Processor-to-Memory) while aggressor lines are connected in the READ direction (e.g., Memory-to-Processor). The attenuated victim signal will be subject to near-end crosstalk from full-swing signals of the adjacent die layer transmitters. The crosstalk accumulated within such conventional stack designs can be significant and ultimately limit the maximum signaling rate within HBM using such stacked memory systems.

The TDV staircase connection arrays disclosed herein showed surprising strong benefits in improving channel signal integrity, through reduced insertion loss and reduced crosstalk through shielding in three spatial dimensions, positioning portions of the signals on the other side of the I/O circuitry, and the use of meandered and twisted-pair structures. These benefits were not readily apparent until verified by our simulation experiments, as further disclosed herein. It was also not obvious that the TDV staircase connection array arrangements disclosed herein could be readily and inexpensively constructed, e.g., as compared to conventional die stacks, where each die has an identical pattern of unit stair step structures which when stacked and interconnected form a set of parallel and straight unit staircase structures as discussed above. Using such identical patterns of unit-stair step structures in conventional die stacks allows for the same die design to be used for each layer within the stack, thereby simplifying manufacturing and reducing manufacturing costs. For the TDV staircase arrangements disclosed herein non-identical patterns of unit stair step structures in neighboring dies are used to achieve reduced crosstalk. However, because there are repeating patterns of unit stair step structures for some dies, the stack can often be formed using a single or a few patterns of unit stair step structures for the dies. For instance, dies having the same pattern can be rotated (e.g., 180 degree rotations every other layer in some embodiments) as part of forming the die stack, and thereby reduce manufacturing costs by not necessarily having to provide a unique patterns of unit stair step structures for each die in the stack.

One aspect of the disclosure is a device including a stack of dies. FIGS. 1A-8H illustrate various embodiments of a device 100 including the stack 102 dies (e.g., dies 105 . . . 112) in accordance to the invention, and, FIG. 9 illustrates how any such stack embodiments could be included in a device arranged as, or including, an integrated circuit package 900.

With continuing reference to FIGS. 1A-8H, for any of the device 100 embodiments, each of the dies have unit stair-step conductive paths of connection features which include through-die via structures and routing structures (e.g., FIG. 1D, conductive paths 115a, 115b including TDV structures 117 and routing structures 118). The unit stair-step conductive paths (e.g., 115a) of one of the dies (e.g., die 105) are interconnected to another one of the unit stair-step conductive paths (e.g., 115b) of another one of the dies (e.g., die 106) to form one of a plurality conductive staircase structures (e.g., conductive staircase structures 120a . . . 120d) through two or more of the dies. The unit stair-step conductive paths 115a, 115b are connected to reduce signal cross talk between the conductive staircase structures whereby at least some of the conductive staircase structures are connected to transmit a same polarity of electrical signals (e.g., signals 122a transmitted via conductive staircase structures 120a and 120b) are spatially separated in a dimension (e.g., z dimension) that is perpendicular to a major surface of the dies (e.g., major surface 124).

The term, spatially separated, as used herein means that at least some of the connective features (e.g., TDV structures 117a, 117b . . . and/or routing structures 118a, 118b) of the unit stair-step conductive paths 115 that form the conductive staircase structures 120, carrying a same polarity of signals (e.g., one of signal 122a or signal 122b) are separated by at least one die, and in some embodiments, also separated between columns.

The term, conductive, as used herein refers to electrical conduction as part of the transmission of an electrical signal (e.g., signals 122a, 122b) connected as electrical signals (e.g., digital or analog signals) in a device (e.g., an integrated circuit device), such as high bandwidth DRAM memory devices, as familiar to those skilled in the pertinent art.

The terms, interconnected or connected, as used herein, refer to electrical connection features between the component structures of the stair-step conductive paths (e.g., paths 115a, 115b . . . ) for the transmission of the electrical signals (e.g., signals 122a, 122b . . . ).

The term signal cross-talk, as used herein, refers to the degradation of signal integrity transmitted over a conductive staircase structure due to interference from other, different, signals being simultaneously transmitted through neighboring conductive staircase structure.

Herein signal cross-talk can be determined by measuring signal power on either end of a victim path when neighboring conductive staircase structures are transmitting a signal and the victim path is quiet/disabled. For instance, cross-talk can be measured by measuring a change in signal power from one end to an opposite end of a conductive staircase structure, with the target conductive staircase structure (victim line) connected in the WRITE direction and the adjacent surrounding conductive staircase structures (aggressor lines) connected in the WRITE direction, or, with the victim line connected in the WRITE direction and the aggressor lines connected in the READ direction, or, an average of both. For instance, far-end crosstalk can occur when the victim and aggressors are connected in the same direction (i.e. WRITE/WRITE or READ/READ) while near-end crosstalk can occur when the victim and aggressors are connected in opposite directions (i.e. WRITE/READ or READ/WRITE). As disclosed herein embodiments of the device can reduce both forms of crosstalk, and in some embodiments particularly reduce near-end crosstalk which can be the more prevalent form of crosstalk in some DRAM stack arrangements.

The electrical connection features can include the TDV structures 117, which can be through-silicon-via (TSV) structures when using DRAM silicon dies or through-germanium-via (TGV) structures when using DRAM germanium or other DRAM die substrate familiar to those skilled in the pertinent art. The electrical connection features can include routing structures 118, which can include any combination of microbumps 125, connection pads, 127 or metal line routings 129 located on the front side 130 or back side 132 of the die (e.g., die 105 or die 106 FIG. 1D), which, when interconnected to the through-die via structure (e.g., structures 117a, 117b . . . ), form a unit stair-step conductive path 115.

As illustrated in FIGS. 1A-8H, The spatial separation between conductive staircase structures 120a, 120b connected to transmit a same polarity of electrical signals 122a can be achieved by forming various embodiments of TDV arrays in the stack.

FIGS. 1A-1I illustrate various aspects of embodiments of the stack 102 of dies with a checkerboard TDV staircase connection array in the stack. As illustrated, the conductive staircase structures can be spatially separated by alternating the conductive staircase structures (e.g., conductive staircase structures 120a, 120b), connected to transmit the electrical signal as a first electrical signal (e.g., signal 122a) that includes a data-carrying signal ("signal"), with the conductive staircase structures (e.g., conductive staircase structures 120c, 120d) connected to transmit the electrical signal as a second electrical signal 122b, the first and second electrical signals 122a, 122b having the opposite polarity.

In some such embodiments, the second electrical signals 122b are data-carrying signals while in other embodiments the second electrical signal 122b includes a return path signal. The term return path signal, as used herein, refers to any voltage as part of the return path, e.g., a ground connection, or a supply connection (e.g., a voltage applied to drain, VDD), which is generally represented as "GND" in the figures.

In some such embodiments, each of the stair-step conductive paths (e.g., paths 115a, 115b . . . ) are connected on one end (e.g., end 140) to an input-output circuit 142 (IO CKT) located on, and near an edge of the one of the dies (e.g., adjacent to or in close proximity to the edge 145 of die 112) and connected on an opposite end (e.g., end 147) located on a different one of the dies (e.g., the metal line routings 129 of die 105), as an input-output (JO) routing structure.

In some such embodiments, each of the stair-step conductive paths (e.g., paths 115a, 115b . . . ) connected to transmit the first electrical signal 122a can be surrounded on all three dimensions (x, y, and z dimensions) by the stair-step conductive paths (e.g., paths 115a, 115b . . . ) connected to transmit the second electrical signal 122b. For instance, in some embodiments, every unit stair-step carrying the first signal can be surrounded by unit stair-steps carrying the second signal, e.g. a return-path (e.g., VDD or GND), in all directions (above, below, left, right, in-front, and behind) surrounding the unit stair-step carrying the first signal. In some embodiments, this creates return paths that follow signals up the entire 3D path of the stack to reduce the return-path impedance while providing shielding from crosstalk due to other signals, in all 3-dimensions. This arrangement can produce a ground-signal-ground (GSG)

bump array pattern, which is maintained through the horizontal metal routes and the vertical TDV/microbump transitions.

In some embodiments, such checkerboard arrangements can be implemented using two unique DRAM die (e.g., one for even layers and one for odd layers) that are fabricated using distinct masks for either the on-die (topside) metal or backside metal layers. Alternatively, the unit stair-step structure used for both the signal and return-paths can be made identical. This allows the stack to be implemented with a single DRAM die at the expense of increasing return-path impedance from both a signal integrity and power integrity standpoint since the grounded stair-steps can no longer be connected to the on-chip power distribution network.

FIGS. 2A-2H illustrate various aspects of embodiments of the stack 102 of dies with an interleaved TDV staircase connection array in the stack. As illustrated, the conductive staircase structures (e.g., conductive staircase structures 120a, 120b) are spatially separated by positioning portions of one of more of the stair-step conductive paths (e.g., paths 115a, 115b . . . ) for one or more of the staircase structures (e.g., conductive staircase structures 20a) on one side of the dies relative to a centrally located (e.g., central location 210) IO circuit 142 and portions of a different one of more of the stair-step conductive paths (e.g., paths 115a, 115b . . . ) for one or more different ones of the staircase structures (e.g., conductive staircase structures 120b) on an opposite side of the dies relative to the IO circuit 142.

In some such embodiments, the conductive staircase structures (e.g., conductive staircase structures 120a, 120b) are spatially separated by providing two or more vertically stacked ones of the through-die via structures (e.g., through-die via structures 117a, and 117b) such that the routing structures of one of the stair-step conductive paths (e.g., the metal line routing 129a of stair-step conductive path 115a) are separated from the routing structures of another one of the stair-step conductive paths (e.g., the metal line routing 129b of adjacent stair-step conductive path 115b) by one or more dies (e.g., the die 106 separating the metal line routing 129a on the die 107 from the metal line routing 129b on the die 105).

Such interleaved arrangements can reduce the signal routing density in the Z-direction such that the horizontal routes of signals above and below a victim line are now 2 DRAM dies layers away, which increases vertical separation to reduce crosstalk. The structure also reduces the total horizontal distance a signal must traverse in on-chip metal to reduce insertion loss. Centering the I/O circuitry within the bump array also allows for symmetric clock distribution and memory access to the on-chip memory cells.

Some embodiments of this interleaved arrangement can be implemented using 2 distinct DRAM die layers stacked in an alternating fashion (e.g., an ABAB pattern). The distinct dies can be fabricated using different metal masks for either the on-die metal layers or the backside metal. In some embodiments, the routes on one side of the I/O circuitry can use vertical transitions only (e.g., TDV plus microbumps only) on a specific die layer while the other side of the I/O circuitry can further include horizontal metal routes, and this pattern can be swapped every other layer. Due to this alternating pattern, the stack can also be implemented using a single DRAM die that is rotated 180 degrees every other layer. The compatibility of this structure with die rotation allows the stack to be implemented using the same exact DRAM die for all layers and thus reduce the number of manufacturing masks.

FIGS. 3A-3B illustrate various aspects of embodiments of the stack 102 of dies with a shifted and offset TDV staircase connection array in the stack. The cross-sectional views depicted in FIGS. 3A-3B are analogous to the column views shown in FIGS. 2B and 2C, but for clarity, with only three dies 105, 106, 107 depicted. As illustrated in FIG. 3A, the conductive staircase structures (e.g., conductive staircase structures 120a, 120b, 120c) are spatially separated by providing the unit stair-step conductive path (e.g., path 115c) that forms part of a first one of the conductive staircase structures (e.g., conductive staircase structures 120a) so as to be shifted horizontally in one of the dies (e.g., die 106) relative to an adjacent one of the unit stair-step conductive paths in an adjacent one of the dies (e.g., paths 115d or 115e in dies 105 or 107, respectively) that forms part of a second adjacent one of the conductive staircase structures (e.g., conductive staircase structures 120b, or 120c, respectively), such that the through-die via structures (e.g., through-die via structure 117a) of the first conductive staircase structure 120a in the one die 106 are vertically offset due to the horizontal shifting of conductive staircase structures within the die 106 relative to adjacent dies 105, 107. For example, the TDVs 117a, 117b, 117c are not directly stacked on top of each other in adjacent dies due to the horizontal shifts in the through-die via structure locations, with resulting shifts in the adjacent conductive staircase structure (e.g., conductive staircase structures 120a, 120b, 120c in the dies 105-107).

In some such embodiments, as illustrated in FIG. 3B, for the conductive staircase structures (e.g., staircase structure 120a), the unit stair-step conductive path (e.g., path 115c) is free of the metal lines routings 129 and the through-die via structure of the unit stair-step conductive path (e.g., through-die via structure 117a of path 115c) interconnects routing structures of the unit stair-step conductive path in the second adjacent one of the dies (e.g., the metal line routing 129c of path 115f in die 107) to the routing structure of the unit stair-step conductive path in a third adjacent one of the dies (e.g., the metal line routing 129d of path 115g in die 105).

FIGS. 4A-4H illustrate various aspects of embodiments of the stack 102 of dies with combined checkerboard and interleaved TDV staircase connection array in the stack. As illustrated, the conductive staircase structures are spatially separated by: 1) positioning portions of one of more of the stair-step conductive paths (e.g., paths 115a, 115b . . . ) for one or more of the conductive staircase structures (e.g., staircase structure 120a) on one side of the dies relative to a centrally located (e.g., central location 210) circuit 142 and portions of a different one of more of the stair-step conductive paths (e.g., paths 115a, 115b . . . ) for one or more different ones of the conductive staircase structures (e.g., staircase structure 120b) on an opposite side of the dies relative to the input-output circuit 142; 2) providing two of more vertically stacked ones of the through-die via structures (e.g., through-die via structures 117a, 117b . . . ) such that the routing structures of one of the stair-step conductive paths (e.g., the metal line routing 129a of stair-step conductive path 115a) are separated from the routing structures of another one of the conductive staircase structures 120 (e.g., the metal line routing 129b of adjacent stair-step conductive path 115b) by one or more dies (e.g., dies 106 separating the routing structures 118a on die 107 from the routing structures 118b on die 105); and 3) alternating the conductive staircase structures (e.g., staircase structure 120b) connected to transmit the electrical signal as a first electrical signal 122a that is a data-carrying signal ("signal") with the conductive staircase structures (e.g., staircase structure 120c) connected to transmit the electrical signal as a second electrical signal 122b that is a ground-carrying signal ("GND"), the first and second electrical signals 122a, 122b having the opposite polarity.

Similar to the TDV staircase connection arrays depicted in FIGS. 1A-I and FIGS. 2A-H, the combined checkerboard and interleaved TDV staircase connection array can further improve signal integrity. Similar to the interleaved TDV staircase connection array, the I/O circuitry can be located in the center of the DRAM dies and signals can be routed from both sides of the I/O, where vertical transitions through the stack can traverse 2 DRAM dies layers (e.g., 2 TDVs plus 2 microbumps). In some embodiments, 3D shielding can be implemented within the stack by ensuring that second signal carrying stair-steps are routed above, below, left, right, front, and behind all first signal carrying stair-steps, e.g., by taking the interleaved pattern and swapping every other first signal carrying stair-step with the adjacent second signal carrying (e.g., return-path, VDD/GND in some embodiment) stair-step. Embodiments of this arrangement can reduce return-path impedance, increase isolation between aggressor signals in all three dimensions, and produce a checkerboard array similar to the stack embodiment disclosed in FIG. 1A-1I.

Embodiments of the combined checkerboard and interleaved arrangements are compatible with multiple fabrication methods, requiring four unique DRAM die (e.g., an ABCD pattern). These four dies can be fabricated using four distinct fab metal or backside-metal masks. Alternatively, two metal masks can be used if the unit stair-step structure for both the signal and return paths is the same, at the expense of increased return-path impedance. In such embodiments, die rotation can be used in conjunction with using 2 unique DRAM dies (A, B, AR, BR) to reduce the number of manufacturing masks and cost.

FIGS. 5A-5H illustrate various aspects of embodiments of the stack 102 of dies with a combined serpentine and interleaved TDV staircase connection array in the stack. As illustrated, the conductive staircase structures are spatially separated by providing portions of at least one of the conductive staircase structures (e.g., staircase structure 120a connecting 'Die 4 signal' to 'Die 4 IO') between at least two different cross-sections (e.g., cross-sections through dimension y) through the stack 102 (e.g., staircase structures 120a, 120b in cross-section 5B-5B and 5C-5C and FIG. 5D), where a first one of the one unit stair-step conductive paths 115a in a first cross-section of an odd-numbered one of the dies (e.g., die 105) includes the routing structures that connect to a second one of the unit stair-step conductive path 115b in a second cross-section of an adjacent even numbered one of the dies (e.g., die 106), such that the unit stair-step conductive paths sequentially alternate back and forth between the first and second cross-sections to form the conductive staircase structure 120a.

In some such embodiments, the stair-step conductive paths 115a, 115b are connected to transmit the electrical signal as a first electrical signal 122a, are surrounded on all three dimensions (x, y, and z dimensions) by the conductive staircase structures (e.g., staircase structures 120c, 120d) connected to transmit the electrical signal as a second electrical signal 122b, the first and second electrical signals 122a, 122b having the opposite polarity.

In some such embodiments, the first electrical signal 122a can include a first data-carrying signal of a first polarity and the second electrical signal 122b can include a second data-carrying signal of a second opposite polarity In some such embodiments, there is a branching electrical connection between at least two of the second unit stair-step conductive paths 115b (e.g., FIG. 5D branching electrical connection 510 between conductive staircase structures 120c, 120d) such that the second unit stair-step conductive paths 115b carry the two different second signals which include two different second data-carrying signals.

In other embodiments, the second signal can be a return path signal. In some such embodiment where the second signal is a return path signal connected as a ground signal, there can be a series of branching connections that interconnect two or more or all of the second unit stair-step conductive paths 115b (e.g., a series of branching connections electrically interconnecting two or more, or all, of the conductive staircase structures 120c, 120d connected to carry the second data-carrying signal as a common ground signal, e.g., to provide an interconnected grounding structure, e.g., a grounded mesh, within the stack.

Likewise, for any embodiments of the stack 102 such as depicted in FIGS. 1A-8H when the second electrical signal is a return path signal connected as a ground signal, any number of branching connections could interconnect two or more, or all, of the second unit conductive staircase structures 120c, 120d in the stack, to provide an interconnected grounding structure within the stack 102.

In such arrangements, the conductive staircase structures serpentine the first and second signals on top of each other throughout the entire stack, which provides shielding for both the horizontal metal routes and the vertical TDV/microbump transitions. In some such embodiment, the insertion loss may be larger compared to the combined checkerboard interleaved arrangement (FIGS. 4A-4H) due to the serpentining conductive staircase structure paths of long metal routes, which in turn may increase path inductance.

Some embodiments of the combined serpentine and interleaved TDV staircase connection array can be implemented using two unique DRAM layers (using two chip-metal or backside-metal masks) or implemented using a single DRAM die, using die rotation on every other layer in the stack.

Some embodiments of the combined serpentine and interleaved TDV staircase connection array can be implemented using two unique DRAM layers (using two chip-metal or backside-metal masks) and implemented using with a single DRAM die, using die rotation on every other layer in the stack.

FIGS. 6A-6H illustrate various aspects of embodiments of the stack 102 of dies with a meandered TDV staircase connection array with a differential signal scheme in the stack. As illustrated, the conductive staircase structures 120 are spatially separated by providing portions of at least one of the conductive staircase structures (e.g., staircase structure 120a connecting 'Die 3 SignalPos' and to 'Die 3 IO', staircase structure 120b connecting 'Die 4 IO' to 'Die 4 SignalPos', staircase structure 120c connecting 'Die 3 SignalNeg' and to 'Die 3 IO', staircase structure 120d connecting 'Die 4 IO' to 'Die 4 SignalNeg') between at least first, second and third cross-sections (e.g., cross-sections through dimension y) through the stack (e.g., at least staircase structures 120a, 120b alternating in cross-sections 6B-6B, 6C-6C and a third adjacent cross-section not shown). The interconnection of the electrical signal as a first electrical signal 122a includes the routing structures that alternate from the unit stair-step conductive paths 115a of an odd-numbered one of the dies (e.g., dies 105, 107, etc. . . . ) in the first cross-section, to a diagonally adjacent one the unit stair-step conductive path 115b in the second cross-section of an adjacent even-numbered one of dies (e.g., dies 106, 108, etc. . . . ), to form a first one of the conductive staircase structures 120*a*. The interconnection of the electrical signal as a second electrical signal 122*b* includes the routing structures that alternate from the unit stair-step conductive paths 115*b* of the even numbered one of the dies (e.g., dies 106, 108, etc. . . . ) in the third cross-section, to a diagonally adjacent one of the unit stair-step conductive path 115*b* in the second cross-section of the odd numbered one of dies (e.g., dies 105, 107, etc. . . . ), to form a second one of the conductive staircase structures 120*b*.

In some such embodiments, at least some of the stair-step conductive paths (e.g., stair-step conductive path 115*b*) connected to transmit the first electrical signal 122*a* are surrounded on all three dimensions (x, y, and z dimensions) by the stair-step conductive paths (e.g., stair-step conductive paths 115*c*, 115*d*) connected to transmit the second electrical signal 122*b*, the first and second electrical signals 122*a*, 122*b* having the opposite polarity.

For the differential signaling scheme, each of the first and second signals can be alternately meandered left-and-right through the staircase structures every die layer as shown in FIGS. 6A-6H. This results in first and second signal pairs above and below a victim first and second signal pair to be meandered in the opposite direction (left or right) on any given die layer. This meandering reduces the coupling-region of the signal-pairs above and below each other, thereby reducing crosstalk.

Some embodiments of meandered TDV staircase connection array can be implemented using two different dies for even and odd layers, which can be fabricated using multiple fab-metal or backside-metal masks. Such arrangements are also compatible with single-ended signaling, but may accumulate more crosstalk, e.g., compared to the checkerboard TDV staircase connection array arrangements (FIG. 1A-1I).

FIGS. 7A-7H illustrate various aspects of embodiments of the stack 102 of dies with a twisted pair TDV staircase connection array with a differential signal scheme in the stack. As illustrated, the conductive staircase structures 120 are spatially separated by providing portions of at least one of the conductive staircase structures (e.g., staircase structure 120*a* connecting 'Die 3 SignalPos' and to 'Die 3 IO', staircase structure 120*b* connecting 'Die 4 IO' to 'Die 4 SignalPos', staircase structure 120*c* connecting 'Die 3 SignalNeg' and to 'Die 3 IO', staircase structure 120*d* connecting 'Die 4 IO' to 'Die 4 SignalNeg') between at least first and second cross-sections (e.g., cross-sections through dimension y) through the stack (e.g., staircase structure 120*a*, 120*b* alternating in cross-section 7B-7B and 7C-7C. The interconnection of the electrical signal as a first electrical signal 122*a* includes the routing structures that alternate from a first set of the unit stair-step conductive paths including the unit stair-step conductive paths 115*a* of an odd-numbered one of the dies (e.g., dies 105, 107, etc. . . . ) in the first cross-section connected to a diagonally adjacent one the unit stair-step conductive path 115*b* in the second cross-section of an adjacent even-numbered one of dies (e.g., dies 106, 108, etc. . . . ), to form a first one of the conductive staircase structures (e.g., conductive staircase structures 120*a*, 120*b*). The interconnection of the electrical signal as a second electrical signal 122*b* includes the routing structures that alternate from a second set of the unit stair-step conductive paths 115*a* of the odd numbered one of the dies (e.g., dies 105, 108, etc. . . . ) in the e.g., 7B-7B cross-section, connected to a diagonally adjacent one of the unit stair-step conductive path 115*b* in the e.g., 7C-7C cross-section of the even numbered one of dies (e.g., dies 106, 108, etc. . . . ), to form a second one of the conductive staircase structures (e.g., conductive staircase structures 120*c*, 120*d*). At least some of the routing structures of the first set of the unit stair-step conductive paths 115*a*, 115*b* forming the first one of the conductive staircase structures (e.g., conductive staircase structures 120*a*, 120*b*) criss-cross with at least some adjacent ones of the routing structures of the second set of the unit stair-step conductive paths 115*a*, 115*b* forming the second one of the conductive staircase structures (e.g., conductive staircase structures 120*c*, 120*d*).

In some such embodiments, at least some of the stair-step conductive paths (e.g., stair-step conductive path 120*b*) connected to transmit the first electrical signal 122*a* are surrounded on all three dimensions (x, y, and z dimensions) by the stair-step conductive paths (e.g., stair-step conductive paths 120*c*, 120*d*) connected to transmit the second electrical signal 122*b*, the first and second electrical signals 122*a*, 122*b* having the opposite polarity.

In some such embodiments, at least some of the routing structures of the first set of the unit stair-step conductive paths 115*a*, 115*b* forming the first one of the conductive staircase structures do not criss-cross with at least some of the routing structures of the second set of the unit stair-step conductive paths 115*a*, 115*b* forming the second one of the conductive staircase structures. However, in some embodiments, at least some of the conductive staircase structures can criss-cross. FIGS. 8A-8H illustrate various aspects of such embodiments of the stack 102 of dies with a combined twisted pair and straight route TDV staircase connection array with a differential signal scheme in the stack. As illustrated, in some such embodiments, for even-number ones of the dies, the routing structures of the first set of the unit stair-step conductive paths 115*a*, 115*b* do not criss-cross (e.g. are straight routes as shown in FIG. 8A-8H) with the at least some of the routing structures, and, for the second set of the odd-numbers ones of the dies, the routing structures the unit stair-step conductive paths 115*c*, 115*d*, the routing structure criss-cross.

Similar to the meandered TDV staircase connection array (FIG. 6A-6H), the twisted pair (FIG. 7A-7H) or the combined twisted pair and straight route TDV staircase connection arrays (FIG. 8A-8H) can be used for differential signaling. The use of twisted-pair structured increases the crosstalk immunity as the induced currents within both traces becomes common-mode. This can be implemented using a variety of combinations of straight and twisted signal-pair routes anologous to that shown in FIG. 8A-8H, where, e.g., the signals going to odd layers are kept as straight routes throughout the entire stack. Additionally, adjacent signal-pairs going to the same layer (i.e. to the left and right of each signal-pair shown) can be implemented using routes of opposing type (straight or twisted) to further reduce crosstalk. This combination of twisted-pairs and straight-routes further improves crosstalk immunity due to the polarity swapping of the next-nearest aggressor signal. Such arrangements can be implemented using multiple metal masks for either the fab-metal or backside-metal layers.

FIG. 9 presents a cross-sectional view of an example IC package device 100 of the disclosure including any embodiments of the stack of dies 102 disclosed in the context of FIGS. 1A-8H. As illustrated, in some embodiments, the stack of dies 102 is arranged as a dynamic random-access memory (DRAM) stack, where each of the dies is arranged as a DRAM die having a plurality of DRAM cells that are connected to the input-output circuit (e.g., FIGS. 1A-8H, circuit 142) of the die. In some embodiments, the device is arranged as an integrated circuit package device, the integrated circuit package device including a package substrate 910 (e.g., a printed wiring board), the stack 102 located on the substrate 910. Some such embodiments include a processor 920 (e.g., graphical processing unit GPU chip) located on the package substrate 910. Some such embodiments include an interposer substrate 930, the interposer substrate 930 having a set of conductive lines 940 connected to interconnect the processor 910 and DRAM cells of the stack 102.

FIG. 10 presents a flow diagram of example embodiments of a method 1000 of manufacturing an IC package according to the principles of the disclosure, including any of the package embodiments, such as disclosed in the context of FIGS. 1A-9.

With continuing reference to FIGS. 1A-8H, as illustrated in FIG. 10, the method 1000 includes providing dies, (e.g., dies 105 . . . 112), each of the dies arranged to have unit stair-step conductive paths (paths 115a, 115b) which include through-die via structures (e.g., structures 117a, 117b . . . ) and routing structures 118a . . . , 129a . . . (e.g., step 1010). The method 1000 includes arranging the unit stair-step conductive paths (e.g., paths 115a, 115b . . . ) to reduce signal cross talk between the conductive staircase structures 120 (e.g., step 1020). At least some of the conductive staircases 120 that carry a same polarity of signals (e.g., signals 122a) are spatially separated in a dimension (z dimension) that is perpendicular to a major surface 124 of the dies. As part of arranging the unit stair-step conductive paths in step 1030, any of the TDV array structures described in the context of FIGS. 1A-8H can be formed. The method 1000 includes stacking the dies to form a die stack 102 (e.g., step 1030). As part of forming the dies stack in step 1030, the unit stair-step conductive paths (e.g., path 115a) of one of the dies (e.g., die 105) are interconnected to another one of the unit stair-step conductive paths (e.g., path 115b) of another one of the dies (e.g., die 106) to form one of a plurality conductive staircase structures 120 through two or more of the dies (e.g., dies 105, 106).

In some such embodiments, as disclosed elsewhere herein, as part of the arranging the unit stair-step conductive paths in step 1020 each of the dies can have a same arrangement of the unit stair-step conductive paths (e.g., paths 115a, 115b) and the stacking of the dies can further includes rotating even numbered ones of the dies by 180 degrees relative to odd numbered ones before interconnecting the unit stair-step conductive paths of the dies (e.g., 105, 106) to form the conductive staircase structures (e.g., generally conductive staircase structures 120).

EXPERIMENTS

Various embodiments of some of the TDV staircase connection array arrangements disclosed herein were simulated using 3D electromagnetic field simulators (e.g., HFSS, and Q3D, Ansys, Canonsburg, Pa. USA) to model and compare the signal integrity of the arrangements. The simulated embodiments included non-interleaved checkerboard (FIG. 1A-1I), interleaved straight (FIG. 2A-2H) combined serpentine and interleaved checkerboard (FIG. 5A-5H) and combined checkerboard and interleaved (FIG. 4A-4H) TDV staircase connection arrays and a conventional ("original") non-interleaved and straight TDV staircase connection array.

For the single-ended structures, a 24-signal model corresponding to 3 columns of 8 die layers were simulated. Every structure was implemented using each of the compatible fabrication methods: multiple backside-metal masks (BSM), multiple lower-metal masks (FAB), a combination of multiple backside-metal and lower-metal masks (FAB/BSM), and die rotation (DIE). The number of metal masks used for each structure was either two or four. However in other embodiments, such as when die rotation is used, only one metal mask may be required. Table 1 shows simulated signal-parameter values at a 4 GHz Nyquist frequency, including insertion loss (IL), power-sum far-end crosstalk (PSFEXT: victim and aggressors connected in the WRITE direction), and power-sum near-end crosstalk (PSNEXT: victim connected in WRITE direction, aggressors in the READ direction). Also denoted is the difference between IL and accumulated crosstalk (FEXT and NEXT) as well as the improvement to the IL-NEXT (ANEXT) with respect to a conventional TDV structure (non-interleaved, straight routing style). These simulated arrangements were estimated to suppress worst-case crosstalk across a range of 2.4 dB to 17.3 dB.

TABLE 1

Signal integrity comparisons for simulated TDV staircase connection array arrangements with differential signal schemes

| Arrangement | Routing Style | FAB | IL (dB) | PSFEXT (dB) | PSNEXT (dB) | IL-FEXT (dB) | IL-NEXT (dB) | ΔNEXT (dB) |
|---|---|---|---|---|---|---|---|---|
| Non-Interleaved | Straight | 2 BSM | −1.2 | −30.9 | −20.1 | 29.7 | 18.9 | — |
| Non-Interleaved | Checkerboard | 2 BSM | −1.1 | −34.7 | −28.0 | 33.6 | 26.9 | 8.0 |
| | | 2 FAB | −1.2 | −34.1 | −27.8 | 32.9 | 26.6 | 7.7 |
| | | 2 FAB | −1.5 | −35.7 | −34.5 | 34.2 | 33.0 | 14.1 |
| | | FAB/BSM | −1.2 | −34.4 | −30.8 | 33.2 | 29.6 | 10.7 |
| | | FAB/BSM | −1.5 | −35.1 | −35.0 | 33.6 | 33.5 | 14.6 |
| Interleaved | Straight | 2 BSM | −1.1 | −36.9 | −26.5 | 35.8 | 25.4 | 6.5 |
| | | 2 FAB | −0.9 | −32.4 | −22.1 | 31.5 | 21.3 | 2.4 |
| | | DIE | −0.8 | −37.4 | −27.0 | 36.6 | 26.2 | 7.3 |
| Interleaved | Serpentined | 2 BSM | −1.2 | −40.4 | −30.6 | 39.1 | 29.4 | 10.5 |
| | | 2 FAB | −1.2 | −38.3 | −36.8 | 37.1 | 35.6 | 16.7 |
| | | DIE | −1.2 | −37.7 | −37.4 | 36.5 | 36.2 | 17.3 |
| Interleaved | Checkerboard | 4 FAB | −0.8 | −36.2 | −34.1 | 35.3 | 33.3 | 14.4 |
| | | 4 FAB | −0.9 | −37.3 | −36.8 | 36.4 | 35.9 | 17.0 |
| | | 4 BSM | −1.1 | −38.2 | −33.8 | 37.1 | 32.7 | 13.8 |

The three simulated columns of the worst-case signal routes were further modeled for the differential signal scheme in the stack arrangements. Simulation results of the accumulated cross-talk (PSFEXT) within the stack are shown for various arrangements over a range of frequencies in FIG. 11. The simulations show a reduction in the accumulated crosstalk for meandered and twisted-pair TDV staircase connection array arrangements as compared to the original TDV staircase connection array arrangement.

Those skilled in the art to which this application relates will appreciate that other and further additions, deletions, substitutions and modifications may be made to the described embodiments.

What is claimed is:

1. A device, comprising:
a stack of dies, each of the dies having unit stair-step conductive paths of connection features which include through-die via structures and routing structures, wherein:
the unit stair-step conductive paths of one of the dies are interconnected to another one of the unit stair-step conductive paths of another one of the dies to form one of a plurality of conductive stair-case structures through two or more of the dies, and
the unit stair-step conductive paths are connected to reduce signal cross talk between the conductive stair-case structures whereby at least some of the conductive stair-case structures are connected to transmit a same polarity of electrical signals are spatially separated in a dimension that is perpendicular to a major surface of the dies.

2. The device of claim 1, wherein the conductive stair-case structures are spatially separated by alternating the conductive stair-case structures, connected to transmit the electrical signal as a first electrical signal that includes a data-carrying signal, with the conductive stair-case structures connected to transmit the electrical signal as a second electrical signal, the first and second electrical signals having the opposite polarity.

3. The device of claim 2, wherein each of the stair-step conductive paths connected to transmit the first electrical signal are surrounded on all three dimensions by the stair-step conductive paths connected to transmit the second electrical signal.

4. The device of claim 2, wherein each of the stair-step conductive paths are connected on one end to an input-output circuit located on, and near an edge of the one of the dies and connected on an opposite end located on a different one of the dies, connected as an input-output routing structure.

5. The device of claim 1, wherein the conductive stair-case structures are spatially separated by positioning portions of one of more of the stair-step conductive paths for one or more of the stair case structures on one side of the dies relative to a centrally located input-output circuit and portions of a different one of more of the stair-step conductive paths for one or more different ones of the stair case structures on an opposite side of the dies relative to the input-output circuit.

6. The device of claim 5, wherein the conductive stair-case structures are spatially separated by providing two or more vertically stacked ones of the through-die via structures such that the routing structures of one of the stair-step conductive paths are separated from the routing structures of another one of the stair-step conductive paths by one or more of the dies.

7. The device of claim 1, wherein the conductive stair-case structures are spatially separated by providing the unit stair-step conductive path that forms part of a first one of the conductive stair-case structures so as to be horizontally shifted in one of the dies relative to an adjacent one of the unit stair-step conductive paths in an adjacent one of the dies that forms part of a second adjacent one of the conductive stair-case structures, such that the through-die via structures of the first conductive stair-case structure in the one die are vertically offset from the through-die via structure in an adjacent die of the second adjacent conductive stair-case structure.

8. The device of claim 7, wherein for the conductive stair-case structures, the unit stair-step conductive path is free of the metal lines and the through-die via structure of the unit stair-step conductive path interconnects routing structure of the unit stair-step conductive path in the second adjacent one of the dies to the routing structure of the unit stair-step conductive path in a third adjacent one of the dies.

9. The device of claim 1, wherein the conductive stair-case structures are spatially separated by:
positioning portions of one of more of the stair-step conductive paths for one or more of the stair case structures on one side of the dies relative to a centrally located input-output circuit and portions of a different one of more of the stair-step conductive paths for one or more different ones of the stair case structures on an opposite side of the dies relative to the input-output circuit,
providing two of more vertically stacked ones of the through-die via structures such that the routing structures of one of the stair-step conductive paths are separated from the routing structures of another one of the stair-step conductive paths by one or more dies, and
alternating the conductive stair-case structures connected to transmit the electrical signal as a first electrical signal that is a data-carrying signal with the conductive stair-case structures connected to transmit the electrical signal as a second electrical signal that is a ground-carrying signal, the first and second electrical signals having the opposite polarity.

10. The device of claim 1, wherein the conductive stair-case structures are spatially separated by providing portions of at least one of the conductive stair-case structures between at least two different cross-sections through the stack, where a first one of the one unit stair-step conductive paths in a first cross-section of an odd-numbered one of the dies includes the routing structures that connect to a second one of the unit stair-step conductive path in a second cross-section of an adjacent even numbered one of the dies, such that the unit stair-step conductive paths sequentially alternate back and forth between the first and second cross-sections to form the conductive stair-case structure.

11. The device of claim 10, wherein the stair-step conductive paths are connected to transmit the electrical signal as a first electrical signal are surrounded on all three dimensions by the stair-step conductive paths connected to transmit the electrical signal as a second electrical signal, the first and second electrical signals having the opposite polarity.

12. The device of claim 1, wherein the conductive stair-case structures are spatially separated by providing portions of at least one of the conductive stair-case structures between at least first, second and third cross-sections through the stack, wherein:
the interconnection of the electrical signal as a first electrical signal includes the routing structures that alternate from the unit stair-step conductive paths of an odd-numbered one of the dies in the first cross-section, to a diagonally adjacent one the unit stair-step conductive path in the second cross-section of an adjacent even-numbered one of dies, to form a first one of the conductive stair-case structures, the interconnection of the electrical signal as a second electrical signal includes the routing structures that alternate from the unit stair-step conductive paths of the even numbered one of the dies in the third cross-section, to a diagonally adjacent one of the unit stair-step conductive path in the second cross-section of the odd numbered one of dies, to form a second one of the conductive stair-case structures.

13. The device of claim 1, wherein the conductive stair-case structures are spatially separated by providing portions of at least one of the conductive stair-case structures between at least first and second cross-sections through the stack, wherein:

the interconnection of the electrical signal as a first electrical signal includes the routing structures that alternate from a first set of the unit stair-step conductive paths including the unit stair-step conductive paths of an odd-numbered one of the dies in the first cross-section connected to a diagonally adjacent one the unit stair-step conductive path in the second cross-section of an adjacent even-numbered one of dies, to form a first one of the conductive stair-case structures, the interconnection of the electrical signal as a second electrical signal includes the routing structures that alternate from a second set of the unit stair-step conductive paths of the odd numbered one of the dies in the first cross-section, connected to a diagonally adjacent one of the unit stair-step conductive path in the second cross-section of the even numbered one of dies, to form a second one of the conductive stair-case structures, at least some of the routing structures of the first set of the unit stair-step conductive paths forming the first one of the conductive staircase structures crisscross with at least some adjacent ones of the routing structures of the second set of the unit stair-step conductive paths forming the second one of the conductive staircase structures.

14. The device of claim 13, wherein at least some of the routing structures of the first set of the unit stair-step conductive paths forming the first one of the conductive staircase structures do not crisscross with at least some of the routing structures of the second set of the unit stair-step conductive paths forming the second one of the conductive staircase structures.

15. The device of claim 1, wherein the stack of dies, is arranged as a dynamic random-access memory (DRAM) stack, wherein each of the dies is arranged as a DRAM die having a plurality of DRAM cells that are connected to the input-output circuit of the die.

16. The device of claim 1, wherein the device is arranged as an integrated circuit package device, the integrated circuit package device including a package substrate, the stack located on the substrate.

17. The device of claim 16, further including a processor located on the package substrate.

18. The device of claim 17, further including an interposer substrate, the interposer substrate having a set of conductive lines connected to interconnect the processor and DRAM cells of the stack.

19. A method of manufacturing a device, comprising:
providing dies, each of the dies arranged to have unit stair-step conductive paths which include through-die via structures and routing structures;
arranging the unit stair-step conductive paths to reduce signal cross talk between the conductive stair-case structures whereby at least some of the conductive stair-cases that carry a same polarity of signals are spatially separated in a dimension that is perpendicular to a major surface of the dies; and
stacking the dies to form a die stack, wherein the unit stair-step conductive paths of one of the dies are interconnected to another one of the unit stair-step conductive paths of another one of the dies to form one of a plurality conductive stair-case structures through two or more of the dies.

20. The method of claim 19, wherein each of the dies have a same arrangement of the unit stair-step conductive paths and the stacking of the dies further includes rotating even numbered ones of the dies by 180 degrees relative to odd numbered ones before interconnecting the unit stair-step conductive paths of the dies to form the conductive stair-case structures.

* * * * *

UNITED STATES PATENT AND TRADEMARK OFFICE
CERTIFICATE OF CORRECTION

PATENT NO. : 11,600,554 B2
APPLICATION NO. : 17/391290
DATED : March 7, 2023
INVENTOR(S) : Walker J. Turner, Yaping Zhou and John M. Wilson Page 1 of 1

It is certified that error appears in the above-identified patent and that said Letters Patent is hereby corrected as shown below:

In the Specification

In Column 6, Line 50, after --input-output-- delete "(JO)" and insert --(IO)--

Signed and Sealed this
Eighth Day of August, 2023

Katherine Kelly Vidal
*Director of the United States Patent and Trademark Office*